United States Patent
Wang et al.

(10) Patent No.: US 12,205,530 B2
(45) Date of Patent: Jan. 21, 2025

(54) SCAN CIRCUIT AND DISPLAY APPARATUS

(71) Applicants: BEIJING BOE OPTOELECTRONICS TECHNOLOGY CO., LTD., Beijing (CN); BOE Technology Group Co., Ltd., Beijing (CN)

(72) Inventors: Jian Wang, Beijing (CN); Honggui Jin, Beijing (CN); Hanqing Liu, Beijing (CN); Yong Zhang, Beijing (CN); Xin Li, Beijing (CN); Yong Song, Beijing (CN); Ruomei Bian, Beijing (CN); Zhilong Duan, Beijing (CN); Peipei Wang, Beijing (CN); Yang Liu, Beijing (CN); Yue Yang, Beijing (CN)

(73) Assignees: BEIJING BOE OPTOELECTRONICS TECHNOLOGY CO., LTD., Beijing (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/255,102

(22) PCT Filed: Sep. 26, 2022

(86) PCT No.: PCT/CN2022/121248
§ 371 (c)(1),
(2) Date: May 31, 2023

(87) PCT Pub. No.: WO2024/065077
PCT Pub. Date: Apr. 4, 2024

(65) Prior Publication Data
US 2024/0355267 A1 Oct. 24, 2024

(51) Int. Cl.
*G09G 3/32* (2016.01)
*G11C 19/28* (2006.01)

(52) U.S. Cl.
CPC ....... *G09G 3/32* (2013.01); *G09G 2310/0267* (2013.01); *G09G 2310/0286* (2013.01);
(Continued)

(58) Field of Classification Search
CPC ............ G09G 3/32; G09G 2310/0267; G09G 2310/0286; G09G 2310/08; G09G 2320/045; G09G 2330/021; G11C 19/287
See application file for complete search history.

(56) References Cited

U.S. PATENT DOCUMENTS

| 10,991,783 B2 | 4/2021 | Cha et al. |
| 2008/0218502 A1* | 9/2008 | Lee ...................... G11C 19/182 345/87 |

(Continued)

FOREIGN PATENT DOCUMENTS

| CN | 107068032 A | 8/2017 |
| CN | 207409262 U | 5/2018 |

(Continued)

OTHER PUBLICATIONS

International Search Report & Written Opinion mailed May 19, 2023, regarding PCT/CN2022/121248.

*Primary Examiner* — Ryan A Lubit
(74) *Attorney, Agent, or Firm* — Intellectual Valley Law, P.C.

(57) ABSTRACT

A scan circuit is provided. The scan circuit includes a plurality of stages. A respective stage of the scan circuit includes a respective scan unit configured to provide a control signal to one or more rows of subpixels. A respective scan unit includes a first subcircuit, a second subcircuit, a third subcircuit, a fourth subcircuit. A pull-up node is coupled to the second subcircuit, the third subcircuit, and the fourth subcircuit. A pull-down node is coupled to the second subcircuit, the third subcircuit. The denoising subcircuit is coupled to a pull-up node and the input terminal, or coupled between a third power supply voltage terminal and the pull-down control node.

20 Claims, 41 Drawing Sheets

(52) U.S. Cl.
CPC ... *G09G 2310/08* (2013.01); *G09G 2320/045* (2013.01); *G09G 2330/021* (2013.01); *G11C 19/287* (2013.01)

(56) References Cited

U.S. PATENT DOCUMENTS

| | | | |
|---|---|---|---|
| 2012/0269315 A1 | 10/2012 | Jang et al. | |
| 2013/0010916 A1* | 1/2013 | Jang | G09G 3/3677 377/64 |
| 2017/0108989 A1* | 4/2017 | Gu | G06F 3/0412 |
| 2020/0020410 A1* | 1/2020 | Du | G11C 19/28 |
| 2021/0065610 A1* | 3/2021 | Xu | G11C 19/28 |
| 2021/0193000 A1* | 6/2021 | Ma | G06F 3/04166 |
| 2021/0209994 A1* | 7/2021 | Liang | G09G 3/2092 |
| 2021/0327377 A1* | 10/2021 | Du | G09G 3/3266 |
| 2023/0043196 A1* | 2/2023 | Xie | G11C 19/28 |

FOREIGN PATENT DOCUMENTS

| | | |
|---|---|---|
| CN | 110246447 A | 9/2019 |
| CN | 110459185 A | 11/2019 |
| EP | 0651395 A2 | 5/1995 |
| KR | 20130005097 A | 1/2013 |
| WO | 2020107435 A1 | 6/2020 |
| WO | 2022089070 A1 | 5/2022 |

* cited by examiner

SCAN CIRCUIT AND DISPLAY APPARATUS

CROSS-REFERENCE TO RELATED APPLICATION

This application is a national stage application under 35 U.S.C. § 371 of International Application No. PCT/CN2022/121248, filed Sep. 26, 2022, the contents of which are incorporated by reference in the entirety.

TECHNICAL FIELD

The present invention relates to display technology, more particularly, to a scan circuit and a display apparatus.

BACKGROUND

Image display apparatuses include a driver for controlling image display in each of a plurality of pixels. The driver is a transistor-based circuit including a gate driving circuit and a data driving circuit. The gate driving circuit is formed by cascading multiple units of shift register units. Each shift register unit outputs a gate driving signal to one of a plurality of gate lines. The gate driving signals from the gate driving circuit scan through gate lines row by row, controlling each row of transistors to be in on/off states. The gate drive circuit can be integrated into a gate-on-array (GOA) circuit, which can be formed directly in the array substrate of the display panel.

SUMMARY

In one aspect, the present disclosure provides a scan circuit, comprising a plurality of stages, wherein a respective stage of the scan circuit comprises a respective scan unit configured to provide a control signal to one or more rows of subpixels; wherein the respective scan unit comprises a first subcircuit, a second subcircuit, a third subcircuit, a fourth subcircuit, and a denoising subcircuit; wherein a pull-up node is coupled to the second subcircuit, the third subcircuit, and the fourth subcircuit; a pull-down node is coupled to the second subcircuit, the third subcircuit; the first subcircuit is configured to receive an input signal and a first power supply voltage signal and configured to control a potential level at the pull-up node based on the input signal received from an input terminal; the second subcircuit is configured to receive a first voltage signal and a third power supply voltage signal, and configured to control potential levels at a pull-down node based on the first voltage signal and the potential level at the pull-up node; the third subcircuit is configured to receive the third power supply voltage signal, and configured to pull down potential levels at an output terminal and the pull-up node based on the potential level at the pull-down node; the fourth subcircuit is configured to receive a first clock signal and output a control signal, and configured to output the control signal based on the first clock signal and the potential level at the pull-up node; and the denoising subcircuit is coupled to a pull-up node and the input terminal.

Optionally, the first subcircuit and the denoising subcircuit together are configured to pull up a potential level at the pull-up node based on the input signal received from the input terminal.

Optionally, the first subcircuit and the denoising subcircuit together are configured to reset a potential level at the pull-up node based on a reset signal received from a reset terminal.

Optionally, the denoising subcircuit comprises a first denoising transistor and a third denoising transistor; the first denoising transistor is coupled between the input terminal and the third denoising transistor; and the third denoising transistor is coupled between the pull-up node and second electrodes of an input transistor controlled by the input signal and a reset transistor controlled by a reset signal.

Optionally, a gate electrode and a first electrode of the first denoising transistor are coupled to the input terminal; a second electrode of the first denoising transistor is coupled to a gate electrode of the third denoising transistor; a gate electrode of the third denoising transistor is coupled to a second electrode of the first denoising transistor; a first electrode of the third denoising transistor is coupled to second electrodes of the input transistor and the reset transistor; and a second electrode of the third denoising transistor is coupled to the pull-up node.

Optionally, the denoising subcircuit further comprises a second denoising transistor; and the second denoising transistor is coupled between a reset terminal and the third denoising transistor.

Optionally, a gate electrode and a first electrode of the second denoising transistor are coupled to the reset terminal; and a second electrode of the second denoising transistor is coupled to a second electrode of the first denoising transistor and a gate electrode of the third denoising transistor.

Optionally, the denoising subcircuit comprises a fourth denoising transistor; and the fourth denoising transistor is coupled between the pull-up node and an input transistor controlled by the input signal.

Optionally, a gate electrode of the fourth denoising transistor is coupled to the input terminal; a first electrode of the fourth denoising transistor is coupled to a second electrode of the input transistor; and a second electrode of the fourth denoising transistor is coupled to the pull-up node.

Optionally, the denoising subcircuit further comprises a fifth denoising transistor; a gate electrode of the fifth denoising transistor is coupled to a reset terminal; a first electrode of the fifth denoising transistor is coupled to a second electrode of a reset transistor controlled by a reset signal; and a second electrode of the fifth denoising transistor is coupled to the pull-up node.

In another aspect, the present disclosure provides a scan circuit, comprising a plurality of stages, wherein a respective stage of the scan circuit comprises a respective scan unit configured to provide a control signal to one or more rows of subpixels; wherein the respective scan unit comprises a first subcircuit, a second subcircuit, a third subcircuit, a fourth subcircuit, and a denoising subcircuit; wherein a pull-up node is coupled to the second subcircuit, the third subcircuit, and the fourth subcircuit; a pull-down node is coupled to the second subcircuit, the third subcircuit; the first subcircuit is configured to receive an input signal and a first power supply voltage signal and configured to control a potential level at the pull-up node based on the input signal received from an input terminal; the second subcircuit is configured to receive a first voltage signal and a third power supply voltage signal, and configured to control potential levels at a pull-down node based on the first voltage signal and the potential level at the pull-up node; the third subcircuit is configured to receive the third power supply voltage signal, and configured to pull down potential levels at an output terminal and the pull-up node based on the potential level at the pull-down node; the fourth subcircuit is configured to receive a first clock signal and output a control signal, and configured to output the control signal based on the first clock signal and the potential level at the pull-up node; and the denoising subcircuit is coupled between a third power supply voltage terminal and a pull-down control node configured to control the potential level at the pull-down node.

Optionally, the third power supply voltage terminal is configured to provide a third power supply voltage signal at a second level; and the denoising subcircuit is controlled by a potential level at a pull-down control node to pull down the potential level at the output terminal or the pull-up node based on the potential level at the pull-down control node.

Optionally, the denoising subcircuit comprises a sixth denoising transistor; a gate electrode of the sixth denoising transistor is coupled to the pull-down control node; a first electrode of the sixth denoising transistor is coupled to the third power supply voltage terminal; and a second electrode of the sixth denoising transistor is coupled to the pull-up node.

Optionally, the denoising subcircuit comprises a seventh denoising transistor; a gate electrode of the seventh denoising transistor is coupled to the pull-down control node; a first electrode of the seventh denoising transistor is coupled to the third power supply voltage terminal; and a second electrode of the seventh denoising transistor is coupled to the output terminal.

Optionally, the denoising subcircuit comprises a sixth denoising transistor and a seventh denoising transistor; a gate electrode of the sixth denoising transistor is coupled to the pull-down control node; a first electrode of the sixth denoising transistor is coupled to the third power supply voltage terminal; a second electrode of the sixth denoising transistor is coupled to the pull-up node; a gate electrode of the seventh denoising transistor is coupled to the pull-down control node; a first electrode of the seventh denoising transistor is coupled to the third power supply voltage terminal; and a second electrode of the seventh denoising transistor is coupled to the output terminal.

Optionally, the first subcircuit comprises a first transistor and a second transistor; the first transistor is coupled between a first power supply voltage terminal and the pull-up node; a gate electrode of the first transistor is coupled to the input terminal; a first electrode of the first transistor is coupled to the first power supply voltage terminal; and a second electrode of the first transistor is coupled to the pull-up node; the second transistor is coupled between a second power supply voltage terminal and the pull-up node; a gate electrode of the second transistor is coupled to a reset terminal; a first electrode of the second transistor is coupled to the second power supply voltage terminal; and a second electrode of the second transistor is coupled to the pull-up node.

Optionally, the second subcircuit comprises a fifth transistor, a sixth transistor, an eighth transistor, and a ninth transistor; the ninth transistor is coupled between a first voltage signal terminal and a pull-down control node; a gate electrode and a first electrode of the ninth transistor are coupled to the first voltage signal terminal; a second electrode of the ninth transistor is coupled to the pull-down control node; the fifth transistor is coupled between the first voltage signal terminal and a pull-down node; a gate electrode of the fifth transistor is coupled to the pull-down control node; a first electrode of the fifth transistor is coupled to the first voltage signal terminal; a second electrode of the fifth transistor is coupled to the pull-down node; the sixth transistor is coupled between the pull-down node and a third power supply voltage terminal; a gate electrode of the sixth transistor is coupled to the pull-up node; a first electrode of the sixth transistor is coupled to the third power supply voltage terminal; a second electrode of the sixth transistor is coupled to the pull-down node; the eighth transistor is coupled between the pull-down control node and the third power supply voltage terminal; a gate electrode of the eighth transistor is coupled to the pull-up node; a first electrode of the eighth transistor is coupled to the third power supply voltage terminal; and a second electrode of the eighth transistor is coupled to the pull-down control node.

Optionally, the third subcircuit comprises a tenth transistor and an eleventh transistor; the tenth transistor is coupled between the pull-up node and a third power supply voltage terminal; a gate electrode of the tenth transistor is coupled to the pull-down node; a first electrode of the tenth transistor is coupled to the third power supply voltage terminal; a second electrode of the tenth transistor is coupled to the pull-up node; the eleventh transistor is coupled between the output terminal and the third power supply voltage terminal; a gate electrode of the eleventh transistor is coupled to the pull-down node; a first electrode of the eleventh transistor is coupled to the third power supply voltage terminal; and a second electrode of the eleventh transistor is coupled to the output terminal.

Optionally, the fourth subcircuit comprises a third transistor, a fourth transistor, a seventh transistor, and a capacitor; the third transistor is coupled between the output terminal and a first clock signal terminal; a gate electrode of the third transistor is coupled to the pull-up node; a first electrode of the third transistor is coupled to the first clock signal terminal; a second electrode of the third transistor is coupled to the output terminal; the fourth transistor is coupled between the pull-up node and a third power supply voltage terminal; a gate electrode of the fourth transistor is coupled to a start signal terminal; a first electrode of the fourth transistor is coupled to the third power supply voltage terminal; a second electrode of the fourth transistor is coupled to the pull-up node; the seventh transistor is coupled between the output terminal and the third power supply voltage terminal; a gate electrode of the seventh transistor is coupled to a second voltage signal terminal; a first electrode of the seventh transistor is coupled to the third power supply voltage terminal; a second electrode of the seventh transistor is coupled to the output terminal; the capacitor is coupled between the output terminal and the pull-up node; a first electrode of the capacitor is coupled to the pull-up node; and a second electrode of the capacitor is coupled to the output terminal; wherein, during a blanking period, a second voltage signal input from a second voltage signal terminal is at a first level, turning on the seventh transistor; and a third power supply voltage signal provided to a third power supply voltage terminal at a second level passed through the seventh transistor to the output terminal, resetting the scan circuit.

In another aspect, the present disclosure provides a display apparatus, comprising the scan circuit described herein or fabricated by a method described herein, and a display panel comprising a plurality of light emitting elements.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a scan circuit and a display apparatus that substantially obviate one or more of the problems due to limitations and disadvantages of the related art. In one aspect, the present disclosure provides a scan circuit. In some embodiments, the scan circuit includes a plurality of stages. Optionally, a respective stage of the scan circuit includes a respective scan unit configured to provide a control signal to one or more rows of subpixels. Optionally, the respective scan unit includes a pull-up node; a first subcircuit configured to receive an input signal and a first power supply voltage signal and configured to control a potential level at the pull-up node based on the input signal received from an input terminal; a second subcircuit configured to receive a first voltage signal and a third power supply voltage signal, and configured to control potential levels at a pull-down node and a pull-down control node based on the first voltage signal and the potential level at the pull-up node; a third subcircuit configured to receive the third power supply voltage signal, and configured to pull down potential levels at an output terminal and the pull-up node based on the potential level at the pull-down node; a fourth subcircuit configured to receive a first clock signal and output a control signal through an output terminal, and configured to output the output signal from the output terminal based on the first clock signal and the potential level at the pull-up node; and a denoising subcircuit configured to reduce noise in the output signal. Optionally, the pull-up node is coupled to the second subcircuit, the third subcircuit, and the fourth subcircuit. Optionally, the denoising subcircuit is coupled to a pull-up node or an output terminal of the respective scan unit.

Figure 1A:
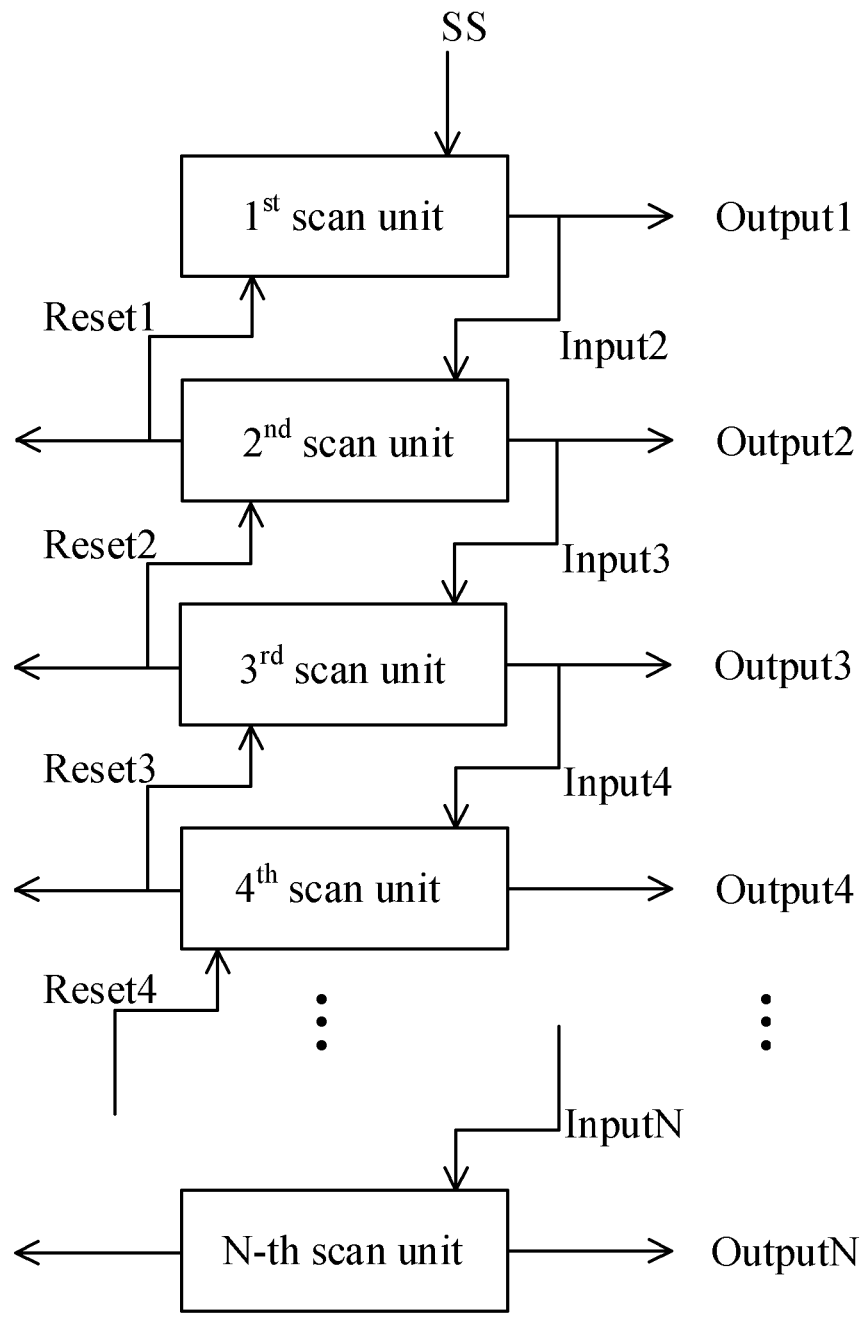
FIG. 1A is a schematic diagram illustrating the structure of a scan circuit in some embodiments according to the present disclosure.

FIG. 1A is a schematic diagram illustrating the structure of a scan circuit in some embodiments according to the present disclosure. Referring to FIG. 1A, the scan circuit in some embodiments includes N number of stages. A respective stage of the N number of stages includes a respective scan unit. As depicted in FIG. 1A, the scan circuit includes a 1$^{st}$ scan unit, a 2$^{nd}$ scan unit, a 3$^{rd}$ scan unit, a 4$^{th}$ scan unit, ..., an N-th scan unit. The N number of scan units are configured to provide N number of control signals (e.g., gate signals, reset control signals, or light emission control signals) to N number of rows of subpixels. The N number of control signals are denoted as Output1, Output2, Output3, Output4, ..., OutputN in FIG. 1A. An n-th scan unit is configured to receive a start signal SS or an output signal from an output terminal of a previous scan unit (e.g., a (n−1)-th scan unit, a (n−2)-th scan unit, or a (n−3)-th scan unit). As used herein, the term "previous scan unit" is not limited to immediately previous scan unit (e.g., the (n−1)-th scan unit), but includes any appropriate previous scan unit (e.g., the (n−2)-th scan unit, or the (n−3)-th scan unit). In FIG. 1A, the $1^{st}$ scan unit is configured to receive the start signal SS as the input signal, the $2^{nd}$ scan unit is configured to receive an output signal from the $1^{st}$ scan unit as an input signal Input2, the $3^{rd}$ scan unit is configured to receive an output signal from the $2^{nd}$ scan unit as an input signal Input3, the $4^{th}$ scan unit is configured to receive an output signal from the $3^{rd}$ scan unit as an input signal Input4, the N-th scan unit is configured to receive an output signal from the (N−1)-th scan unit as an input signal InputN.

Referring to FIG. 1A, an n-th scan unit is configured to receive an output signal from a subsequent scan unit (e.g., a (n+1)-th scan unit, a (n+2)-th scan unit, or a (n+3)-th scan unit) as a reset signal. As used herein, the term "subsequent scan unit" is not limited to immediately subsequent scan unit (e.g., the (n+1)-th scan unit), but includes any appropriate subsequent scan unit (e.g., the (n+2)-th scan unit, or the (n+3)-th scan unit). In FIG. 1A, the $1^{st}$ scan unit is configured to receive an output signal from the $2^{nd}$ scan unit as a reset signal Reset1, the $2^{nd}$ scan unit is configured to receive an output signal from the $3^{rd}$ scan unit as a reset signal Reset2, the $3^{rd}$ scan unit is configured to receive an output signal from the $4^{th}$ scan unit as a reset signal Reset3, and the $4^{th}$ scan unit is configured to receive an output signal from the $5^{th}$ scan unit as a reset signal Reset4.

Figure 1B:
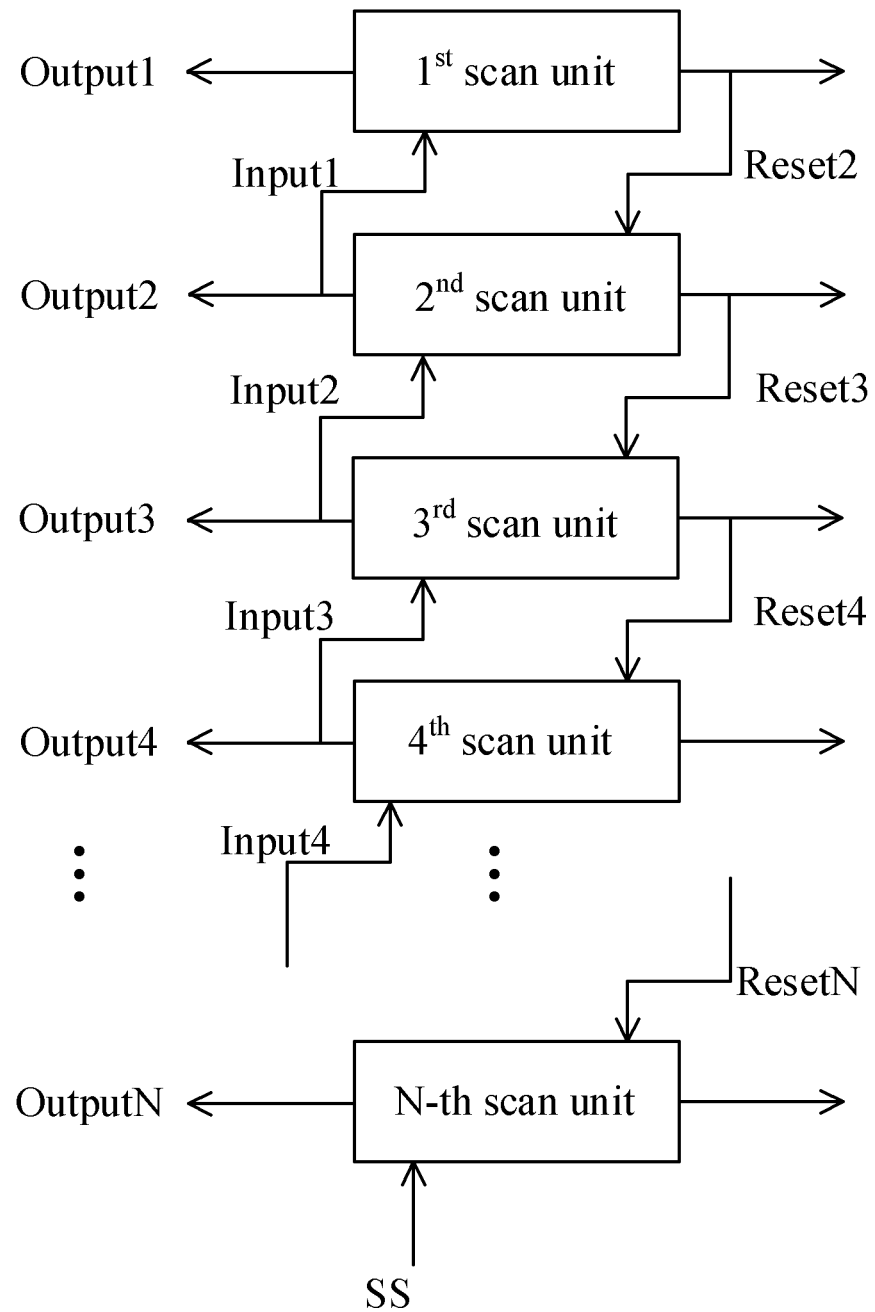
FIG. 1B is a schematic diagram illustrating the structure of a scan circuit in some embodiments according to the present disclosure.

In some embodiments, the scan circuit may be operated in a forward scanning mode and a reverse scanning mode. FIG. 1A illustrates the forward scanning mode of the scan circuit. FIG. 1B is a schematic diagram illustrating the structure of a scan circuit in some embodiments according to the present disclosure. FIG. 1B illustrates the reverse scanning mode of the scan circuit. Referring to FIG. 1B, an n-th scan unit is configured to receive a start signal SS or an output signal from an output terminal of a subsequent scan unit (e.g., a (n+1)-th scan unit, a (n+2)-th scan unit, or a (n+3)-th scan unit). In FIG. 1B, the N-th scan unit is configured to receive the start signal SS as the input signal, the $4^{th}$ scan unit is configured to receive an output signal from a $5^{th}$ scan unit as an input signal Input4, the $3^{rd}$ scan unit is configured to receive an output signal from the $4^{th}$ scan unit as an input signal Input3, the $2^{nd}$ scan unit is configured to receive an output signal from the $3^{rd}$ scan unit as an input signal Input2; and the $1^{st}$ scan unit is configured to receive an output signal from the $2^{nd}$ scan unit as an input signal Input1.

Referring to FIG. 1B, in the reverse scanning mode, an n-th scan unit is configured to receive an output signal from a previous scan unit (e.g., a (n−1)-th scan unit, a (n−2)-th scan unit, or a (n−3)-th scan unit) as a reset signal. In FIG. 1A, the $1^{st}$ scan unit is configured to receive an output signal from the $2^{nd}$ scan unit as a reset signal Reset1, the $2^{nd}$ scan unit is configured to receive an output signal from the $3^{rd}$ scan unit as a reset signal Reset2, the $3^{rd}$ scan unit is configured to receive an output signal from the $4^{th}$ scan unit as a reset signal Reset3, and the $4^{th}$ scan unit is configured to receive an output signal from the $5^{th}$ scan unit as a reset signal Reset4.

Figure 2:
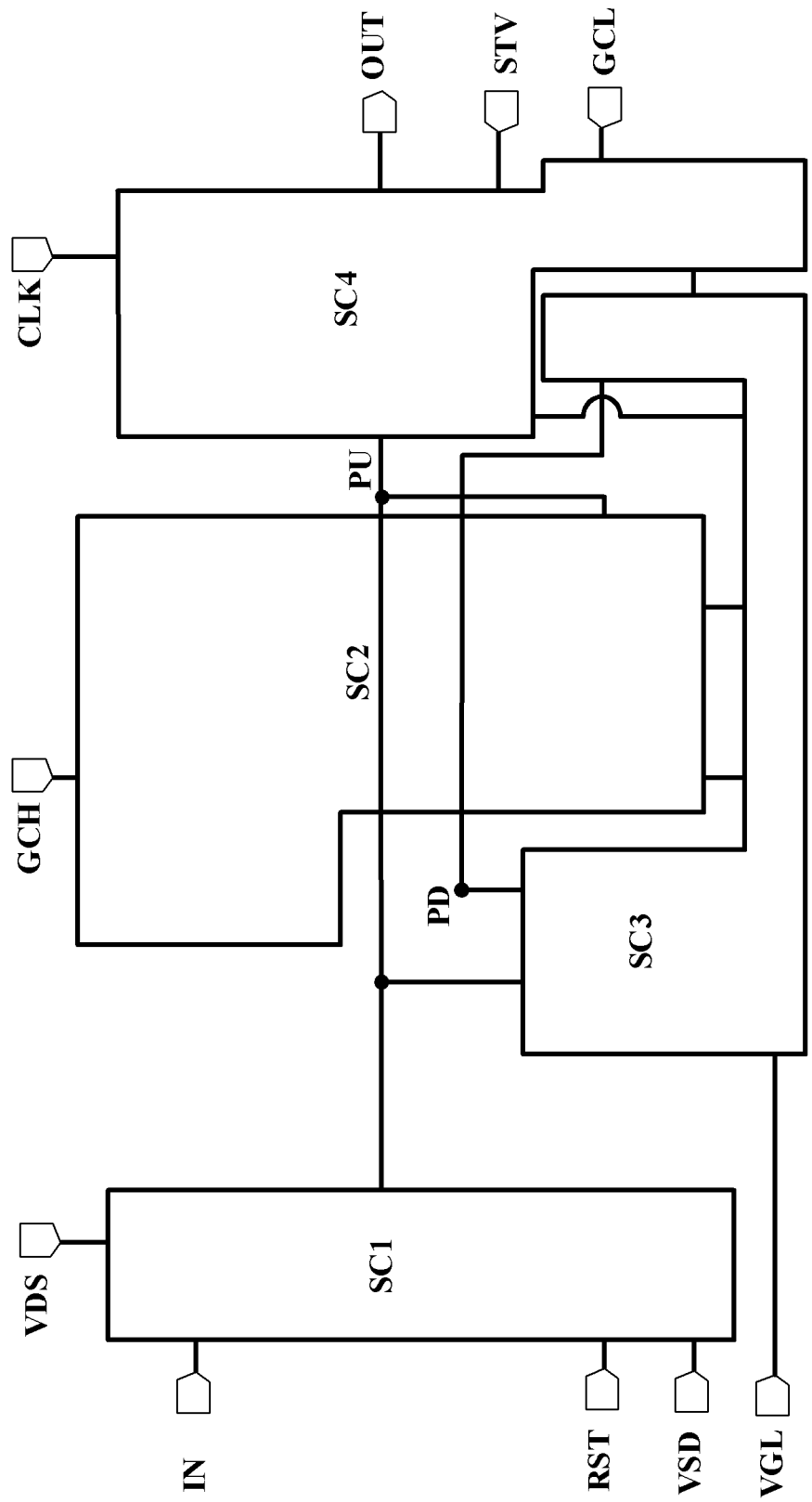
FIG. 2 is a schematic diagram of a respective scan unit in some embodiments according to the present disclosure.

Various appropriate scan units may be used in the present scan circuit. FIG. 2 is a schematic diagram of a respective scan unit in some embodiments according to the present disclosure. Referring to FIG. 2, the respective scan unit in some embodiments includes a first subcircuit SC1, a second subcircuit SC2, a third subcircuit SC3, and a fourth subcircuit SC4.

In some embodiments, the first subcircuit SC1 is configured to receive a first power supply voltage signal input by a first power supply voltage terminal VDS; and is configured to receive a second power supply voltage signal input by a second power supply voltage terminal VSD.

In some embodiments, transistors in the scan circuit may be of a n-type transistor. In some embodiments, the gate-on voltage of a transistor may be set to a high level, and the gate-off voltage thereof may be set to a low level. In a forward scanning mode, the first power supply voltage signal is at a high voltage level, and the second power supply voltage signal is at a low voltage level. In a reverse scanning mode, the first power supply voltage signal is at a low voltage level, and the second power supply voltage signal is at a high voltage level. The present disclosure provides several examples of scan circuit having n-type transistors. However, the present disclosure may be implemented using p-type transistors.

In some embodiments, transistors in the scan circuit may be of a p-type transistor. In some embodiments, the gate-on voltage of a transistor may be set to a low level, and the gate-off voltage thereof may be set to a high level. In a forward scanning mode, the first power supply voltage signal is at a low voltage level, and the second power supply voltage signal is at a high voltage level. In a reverse scanning mode, the first power supply voltage signal is at a high voltage level, and the second power supply voltage signal is at a low voltage level.

In some embodiments, the first subcircuit SC1 is further configured to receive an input signal input by an input terminal IN, and a reset signal input by a reset terminal RST. In the forward scanning mode, the input terminal IN is configured to receive a start signal or an output signal from an output terminal of a previous scan unit (e.g., a (n−1)-th scan unit, a (n−2)-th scan unit, or a (n−3)-th scan unit) as an input signal. In the forward scanning mode, the reset terminal RST is configured to receive an output signal from a subsequent scan unit (e.g., a (n+1)-th scan unit, a (n+2)-th scan unit, or a (n+3)-th scan unit) as a reset signal. In the reverse scanning mode, the reset terminal RST is configured to receive a start signal or an output signal from an output terminal of a subsequent scan unit (e.g., a (n+1)-th scan unit, a (n+2)-th scan unit, or a (n+3)-th scan unit) as an input signal. In the reverse scanning mode, the input terminal IN is configured to receive an output signal from a previous scan unit (e.g., a (n−1)-th scan unit, a (n−2)-th scan unit, or a (n−3)-th scan unit) as a reset signal.

In some embodiments, the second subcircuit SC2 is configured to receive a first voltage signal input from a first voltage signal terminal GCH. In a light emission phase of a frame of image displayed by an array substrate controlled by the scan circuit, the first voltage signal is at a first level (e.g., a high voltage level), and the second voltage signal is at a second level (e.g., a low voltage level). In a blanking phase of a frame of image displayed by an array substrate controlled by the scan circuit, the first voltage signal is at a second level (e.g., a low voltage level), and the second voltage signal is at a first level (e.g., a high voltage level).

In some embodiments, the second subcircuit SC2 and the third subcircuit SC3 are each configured to receive a third power supply voltage signal input by a third power supply voltage terminal VGL. Optionally, the third power supply voltage signal is at a second level (e.g., a low voltage level).

In some embodiments, the fourth subcircuit SC4 is configured to output a first clock signal input by a first clock signal terminal CLK through an output terminal OUT under the control of a potential at a pull-up node PU. In some embodiments, the fourth subcircuit SC4 is configured to receive a second voltage signal input from a second voltage signal terminal GCL. Optionally, the fourth subcircuit SC4 is configured to receive the first clock signal input by the first clock signal terminal CLK. Optionally, the fourth subcircuit SC4 is further configured to receive a start signal input by a start signal terminal STV.

In one example, the fourth subcircuit SC4 is configured to output a first clock signal to gate lines of a display panel. In one example, the display panel includes a plurality of gate lines and a plurality of data lines. The plurality of gate lines and the plurality of data lines cross over each other thereby defining a plurality of subpixels. The gate lines are configured to control on or off of transistors in the display panel, thereby controlling input of data signals from data lines to the subpixels.

The scan unit in some embodiments includes a pull-up node PU and a pull-down node PD. The pull-up node PU is coupled to the first subcircuit SC1, the second subcircuit SC2 and the fourth subcircuit SC4. The pull-down node PD is coupled to the third subcircuit SC3.

Figure 3:
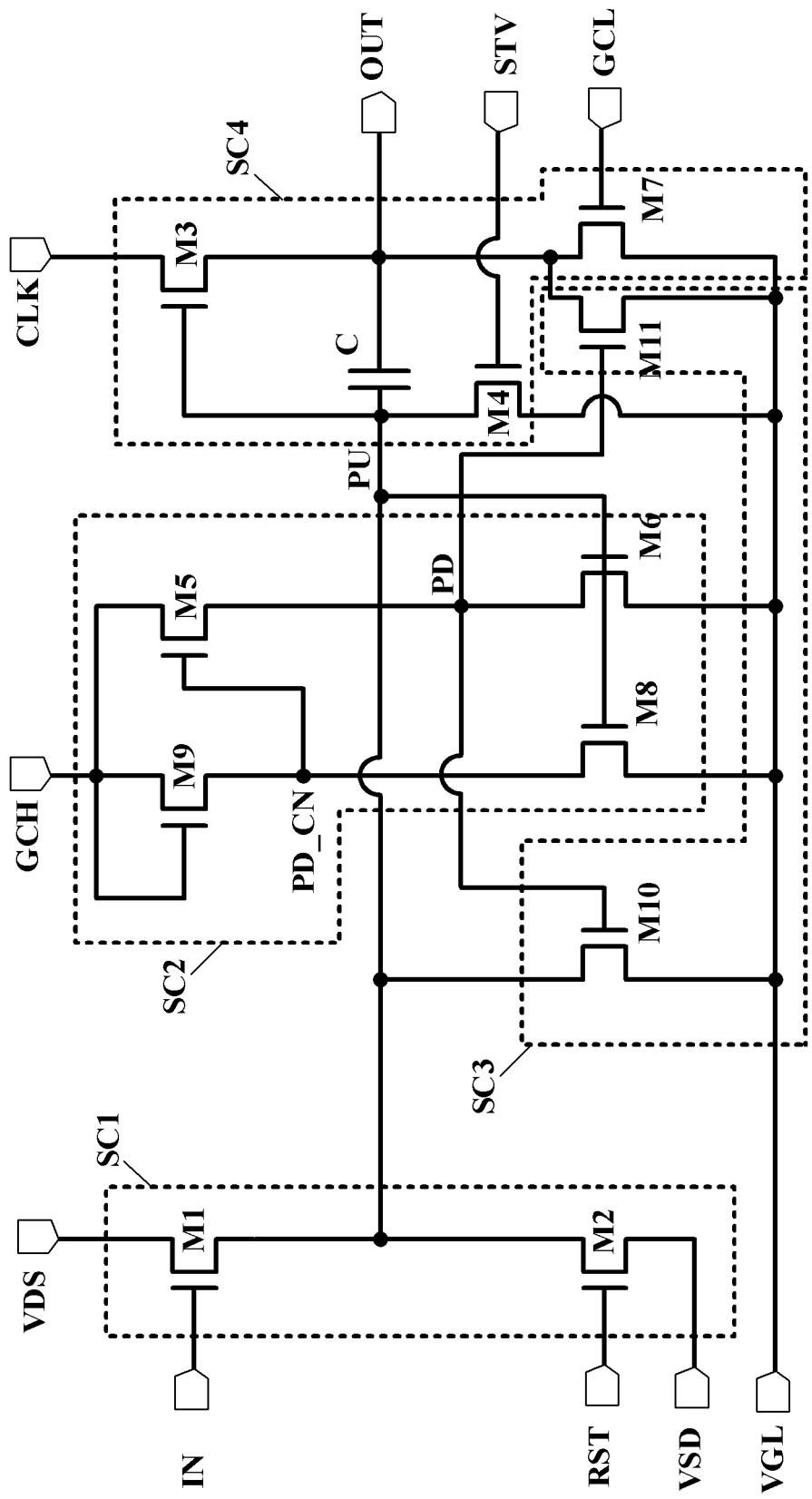
FIG. 3 is a circuit diagram of a respective scan unit in some embodiments according to the present disclosure.

FIG. 3 is a circuit diagram of a respective scan unit in some embodiments according to the present disclosure. Referring to FIG. 3, the first subcircuit SC1 in some embodiments includes a first transistor M1 and a second transistor M2.

The first transistor M1 is coupled between the first power supply voltage terminal VDS and the pull-up node PU. A gate electrode of the first transistor M1 is coupled to the input terminal IN. A first electrode of the first transistor M1 is coupled to the first power supply voltage terminal VDS. A second electrode of the first transistor M1 is coupled to the pull-up node PU.

The second transistor M2 is coupled between the second power supply voltage terminal VSD and the pull-up node PU. A gate electrode of the second transistor M2 is coupled to the reset terminal RST. A first electrode of the second transistor M2 is coupled to the second power supply voltage terminal VSD. A second electrode of the second transistor M2 is coupled to the pull-up node PU.

Referring to FIG. 3, the second subcircuit SC2 in some embodiments includes a fifth transistor M5, a sixth transistor M6, an eighth transistor M8, and a ninth transistor M9.

The ninth transistor M9 is coupled between the first voltage signal terminal GCH and a pull-down control node PD_CN. A gate electrode and a first electrode of the ninth transistor M9 are coupled to the first voltage signal terminal GCH. A second electrode of the ninth transistor M9 is coupled to the pull-down control node PD_CN.

The fifth transistor M5 is coupled between the first voltage signal terminal GCH and a pull-down node PD. A gate electrode of the fifth transistor M5 is coupled to the pull-down control node PD_CN. A first electrode of the fifth transistor M5 is coupled to the first voltage signal terminal GCH. A second electrode of the fifth transistor M5 is coupled to the pull-down node PD.

The sixth transistor M6 is coupled between the pull-down node PD and the third power supply voltage terminal VGL. A gate electrode of the sixth transistor M6 is coupled to the pull-up node PU. A first electrode of the sixth transistor M6 is coupled to the third power supply voltage terminal VGL. A second electrode of the sixth transistor M6 is coupled to the pull-down node PD.

The eighth transistor M8 is coupled between the pull-down control node PD_CN and the third power supply voltage terminal VGL. A gate electrode of the eighth transistor M8 is coupled to the pull-up node PU. A first electrode of the eighth transistor M8 is coupled to the third power supply voltage terminal VGL. A second electrode of the eighth transistor M8 is coupled to the pull-down control node PD_CN.

Referring to FIG. 3, the third subcircuit SC3 in some embodiments includes a tenth transistor M10 and an eleventh transistor M11.

The tenth transistor M10 is coupled between the pull-up node PU and the third power supply voltage terminal VGL. A gate electrode of the tenth transistor M10 is coupled to the pull-down node PD. A first electrode of the tenth transistor M10 is coupled to the third power supply voltage terminal VGL. A second electrode of the tenth transistor M10 is coupled to the pull-up node PU.

The eleventh transistor M11 is coupled between the output terminal OUT and the third power supply voltage terminal VGL. A gate electrode of the eleventh transistor M11 is coupled to the pull-down node PD. A first electrode of the eleventh transistor M11 is coupled to the third power supply voltage terminal VGL. A second electrode of the eleventh transistor M11 is coupled to the output terminal OUT.

Referring to FIG. 3, the fourth subcircuit SC4 in some embodiments includes a third transistor M3, a fourth transistor M4, a seventh transistor M7, and a capacitor C.

The third transistor M3 is coupled between the output terminal OUT and the first clock signal terminal CLK. A gate electrode of the third transistor M3 is coupled to the pull-up node PU. A first electrode of the third transistor M3 is coupled to the first clock signal terminal CLK. A second electrode of the third transistor M3 is coupled to the output terminal OUT.

The fourth transistor M4 is coupled between the pull-up node PU and the third power supply voltage terminal VGL. A gate electrode of the fourth transistor M4 is coupled to the start signal terminal STV. A first electrode of the fourth transistor M4 is coupled to the third power supply voltage terminal VGL. A second electrode of the fourth transistor M4 is coupled to the pull-up node PU.

The seventh transistor M7 is coupled between the output terminal OUT and the third power supply voltage terminal VGL. A gate electrode of the seventh transistor M7 is coupled to the second voltage signal terminal GCL. A first electrode of the seventh transistor M7 is coupled to the third power supply voltage terminal VGL. A second electrode of the seventh transistor M7 is coupled to the output terminal OUT.

The capacitor C is coupled between the output terminal OUT and the pull-up node PU. A first electrode of the capacitor C is coupled to the pull-up node PU. A second electrode of the capacitor C is coupled to the output terminal OUT.

Figure 4:
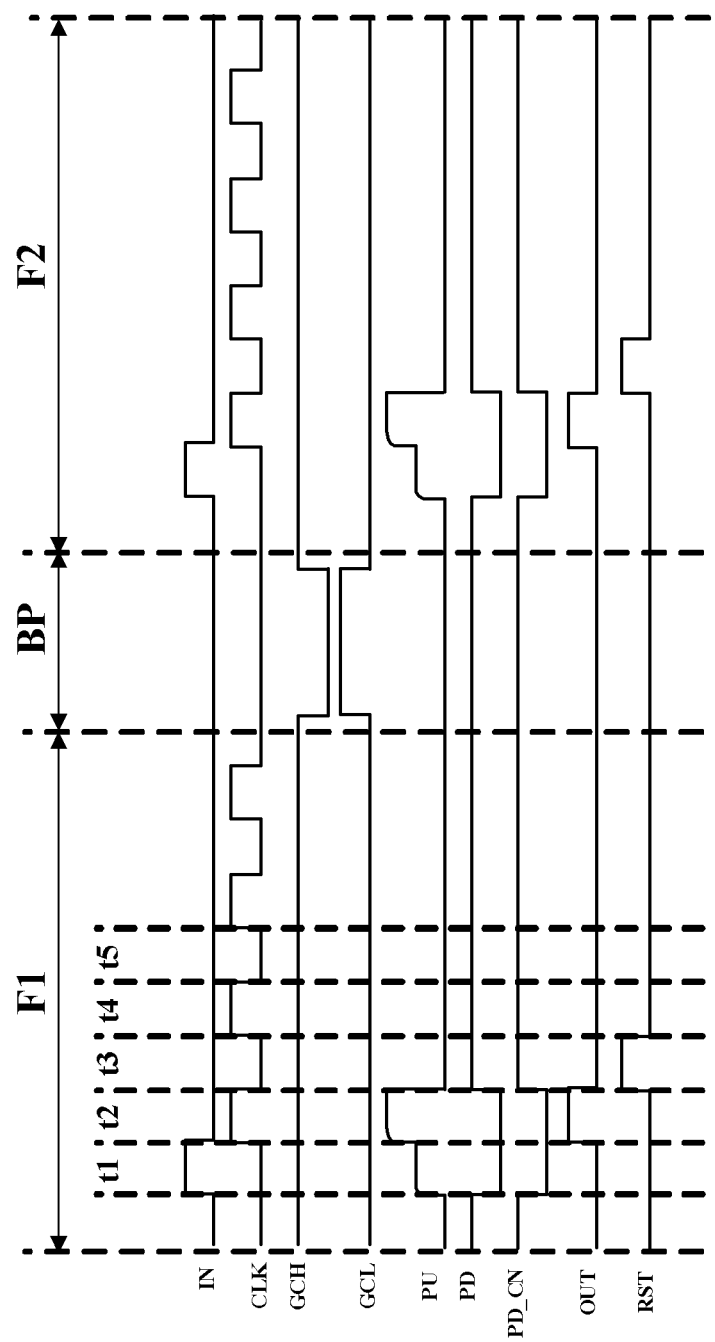
FIG. 4 is a timing diagram illustrating an operation of a respective scan unit in some embodiments according to the present disclosure.

FIG. 4 is a timing diagram illustrating an operation of a respective scan unit in some embodiments according to the present disclosure. In FIG. 4, a period corresponding to a frame of image is denoted as "F1", a period corresponding to a next adjacent frame of image is denoted as "F2", and a blanking period between the frame of image F1 and the next adjacent frame of image F2 is denoted as "BP". FIG. 4 shows several periods in a frame of image F1 displayed by an array substrate controlled by the scan circuit. Optionally, FIG. 4 shows an operation of a respective scan unit a forward scanning mode. Referring to FIG. 4, the frame of image displayed by an array substrate controlled by the scan circuit includes a first period t1, a second period t2, a third period t3, a fourth period t4, and a fifth period t5.

In some embodiments, during a first period t1, a start signal or an output signal from the output terminal of a previous scan unit provided to the input terminal IN has a first level (e.g., a high level), thereby turning on the first transistor M1. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), thereby charging the pull-up node PU to a first level (e.g., a high level). The first level (e.g., the high voltage level) at the pull-up node PU turns on the third transistor M3. A first clock signal provided to the first clock signal terminal CLK is at a second level (e.g., a low level), the output terminal OUT outputs an output signal at a second level (e.g., a low voltage level or an ineffective control signal).

During the first period t1, the first level (e.g., the high voltage level) at the pull-up node PU turns on the eighth transistor M8, a third power supply voltage signal provided to the third power supply voltage terminal VGL is at a second level (e.g., a low level). During the first period t1, a first voltage signal provided to the first voltage signal terminal GCH is at a first level (e.g., a high level), turning on the ninth transistor M9. However, a size of the eighth transistor M8 is larger than a size of the ninth transistor M9. The eighth transistor M8 controls the voltage level at the pull-down control node PD_CN. Accordingly, the pull-down control node PD_CN is at a second level (e.g., a low voltage level). The fifth transistor M5 is turned off.

During the first period t1, the first level (e.g., the high voltage level) at the pull-up node PU turns on the sixth transistor M6, the third power supply voltage signal provided to the third power supply voltage terminal VGL is at a second level (e.g., a low level). During the first period t1, the second level (e.g., the low voltage level) at the pull-down control node PD_CN turns off the fifth transistor M5. Accordingly, the pull-down node PD is at a second level (e.g., a low voltage level). The tenth transistor M10 and the eleventh transistor M11 are turned off.

In some embodiments, during a second period t2, the input terminal IN is provided with a low voltage signal, turning off the first transistor M1. During the second period t2, the capacitor C pushes the potential level of the pull-up node PU higher to maintain at high potential due to a bootstrapping effect. The third transistor M3 remains turned on.

During the second period t2, the first clock signal provided to the first clock signal terminal CLK is at a first level (e.g., a high level). The third transistor M3 is turned on in the second period t2 so that the output terminal OUT outputs the first clock signal, which is now at a high potential, as an output signal at the first level (e.g., the high voltage level or an effective control signal).

During the second period t2, the eighth transistor M8 remains turned on due to the higher voltage level at the pull-up node PU, the third power supply voltage signal at a second level (e.g., a low level) passes through the eighth transistor M8. The pull-down control node PD_CN remains at a second level (e.g., a low voltage level). The fifth transistor M5 is turned off.

During the second period t2, the sixth transistor M6 remains turned on due to the higher voltage level at the pull-up node PU, the third power supply voltage signal at a second level (e.g., a low level) passes through the sixth transistor M6. The pull-down node PD remains at a second level (e.g., a low voltage level). The tenth transistor M10 and the eleventh transistor M11 remain turned off.

The pull-up node PU is at a first level (e.g., a high level) in the first period t1 and the second period t2. The pull-up node PU is at a second level (e.g., a low level) in a third period t3, a fourth period t4, and a fifth period t5.

In some embodiments, during a third period t3, the input terminal IN is provided with a low voltage signal, turning off the first transistor M1. The reset terminal RST is provided with an output signal from the output terminal of a subsequent scan unit provided to the reset terminal RST at a first level (e.g., a high level), thereby turning on the second transistor M2. A second power supply voltage signal provided to the second power supply voltage signal terminal VSD has a second level (e.g., a low level), thereby pull down the potential at the pull-up node PU to a second level (e.g., a low level). The second level (e.g., the low voltage level) at the pull-up node PU turns off the third transistor M3.

During the third period t3, a first voltage signal provided to the first voltage signal terminal GCH is at a first level (e.g., a high level), turning on the ninth transistor M9. The first voltage signal passes through the ninth transistor M9. The pull-down control node PD_CN is at a first level (e.g., a high level). The first level (e.g., the high voltage level) at the pull-down control node PD_CN turns on the fifth transistor M5. The first voltage signal passes through the fifth transistor M5. The pull-down node PD is at a first level (e.g., a high level).

During the third period t3, the sixth transistor M6 and the eighth transistor M8 are turned off by the second level (e.g., the low voltage level) at the pull-up node PU.

During the third period t3, the eleventh transistor M11 is turned on by the first level (e.g., the high voltage level) at the pull-down node PD. The third power supply voltage signal provided to the third power supply voltage terminal VGL at a second level (e.g., a low level) passed through the eleventh transistor M11 to the output terminal OUT. The output terminal OUT outputs an output signal at a second level (e.g., a low voltage level or an ineffective control signal).

In some embodiments, during a fourth period t4, the input terminal IN is provided with a low voltage signal, turning off the first transistor M1. The reset terminal RST is provided with a low voltage signal, turning off the second transistor M2. The pull-up node PU remains at a second level (e.g., a low voltage level). The second level (e.g., the low voltage level) at the pull-up node PU turns off the third transistor M3.

During the fourth period t4, a first voltage signal provided to the first voltage signal terminal GCH is at a first level (e.g., a high level), turning on the ninth transistor M9. The pull-down control node PD_CN remains at a first level (e.g., a high level). The fifth transistor M5 remains turned on due to the first voltage level at the pull-down control node PD_CN. The first voltage signal passes through the fifth transistor M5. The pull-down node PD is at a first level (e.g., a high level). The tenth transistor M10 and the eleventh transistor M11 are turned on by the first voltage level at the pull-down node PD. The third power supply voltage signal provided to the third power supply voltage terminal VGL at a second level (e.g., a low level) passed through the eleventh transistor M11 to the output terminal OUT. The output terminal OUT outputs an output signal at a second level (e.g., a low voltage level or an ineffective control signal).

During the fourth period t4, the sixth transistor M6 and the eighth transistor M8 are turned off by the second level (e.g., the low voltage level) at the pull-up node PU.

During the fourth period t4, a second voltage signal provided at a second voltage signal terminal GCL is at a second level (e.g., a low level), turning off the seventh transistor M7.

In some embodiments, during a fifth period t5, the input terminal IN is provided with a low voltage signal, turning off the first transistor M1. The reset terminal RST is provided with a low voltage signal, turning off the second transistor M2. The pull-up node PU remains at a second level (e.g., a low voltage level). The second level (e.g., the low voltage level) at the pull-up node PU turns off the third transistor M3.

During the fifth period t5, a first voltage signal provided to the first voltage signal terminal GCH is at a first level (e.g., a high level), turning on the ninth transistor M9. The first voltage signal passes through the ninth transistor M9. The pull-down control node PD_CN is at a first level (e.g., a high level). The first level (e.g., the high voltage level) at the pull-down control node PD_CN turns on the fifth transistor M5. The first voltage signal passes through the fifth transistor M5. The pull-down node PD is at a first level (e.g., a high level).

During the fifth period t5, the sixth transistor M6 and the eighth transistor M8 are turned off by the second level (e.g., the low voltage level) at the pull-up node PU.

During the fifth period t5, the eleventh transistor M11 is turned on by the first level (e.g., the high voltage level) at the pull-down node PD. The third power supply voltage signal provided to the third power supply voltage terminal VGL at a second level (e.g., a low level) passed through the eleventh transistor M11 to the output terminal OUT. The output terminal OUT outputs an output signal at a second level (e.g., a low voltage level or an ineffective control signal).

During the blanking period BP, the second voltage signal input from a second voltage signal terminal GCL is at a first level (e.g., a high voltage level), turning on the seventh transistor M7 in the fourth subcircuit SC4. The third power supply voltage signal provided to the third power supply voltage terminal VGL at a second level (e.g., a low level) passed through the seventh transistor M7 to the output terminal OUT, resetting the entire scan circuit.

Figure 5:
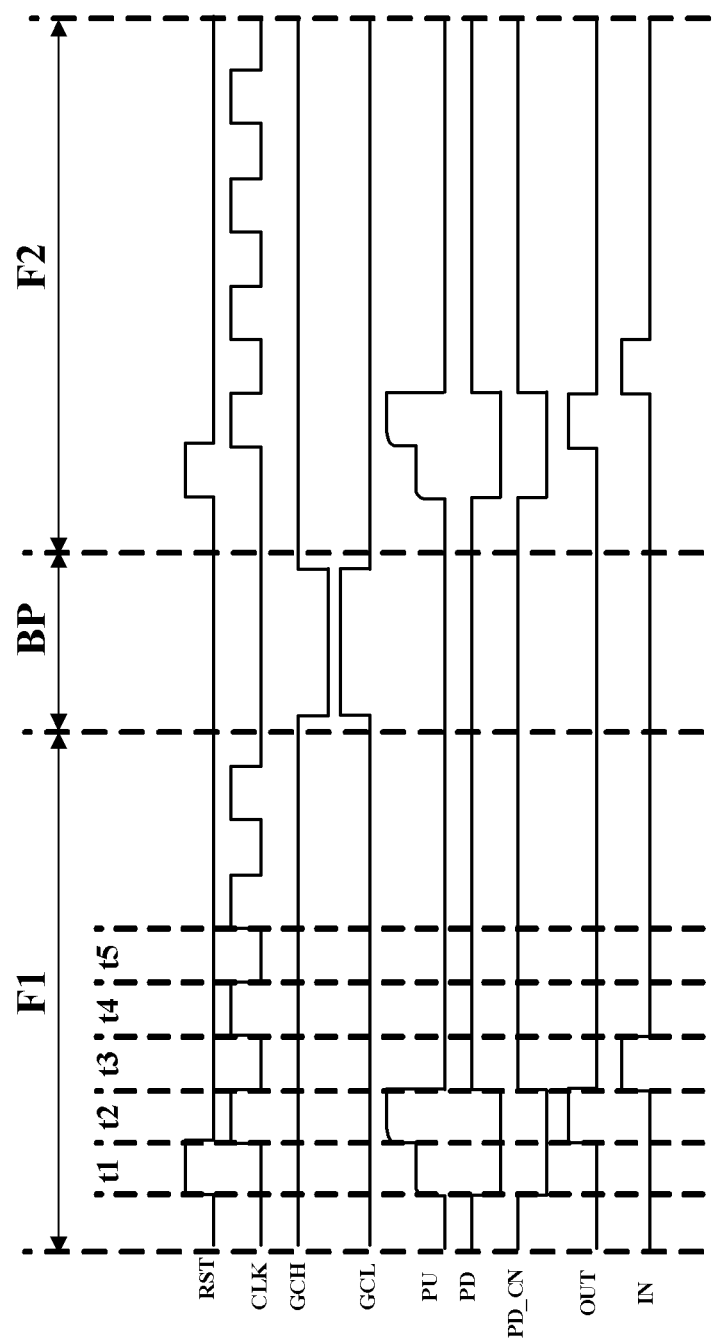
FIG. 5 is a timing diagram illustrating an operation of a respective scan unit in some embodiments according to the present disclosure.

FIG. 5 is a timing diagram illustrating an operation of a respective scan unit in some embodiments according to the present disclosure. FIG. 5 shows several periods in a frame of image displayed by an array substrate controlled by the scan circuit. Optionally, FIG. 5 shows an operation of a respective scan unit a reverse scanning mode. The operation of the respective scan unit depicted in FIG. 5 is largely similar to the operation of the respective scan unit depicted in FIG. 4, except that, in the reverse scanning mode depicted in FIG. 5, the reset terminal RST is configured to receive a start signal or an output signal from an output terminal of a subsequent scan unit (e.g., a (n+1)-th scan unit, a (n+2)-th scan unit, or a (n+3)-th scan unit) as an input signal; and the input terminal IN is configured to receive an output signal from a previous scan unit (e.g., a (n−1)-th scan unit, a (n−2)-th scan unit, or a (n−3)-th scan unit) as a reset signal. Whereas in the forward scanning mode depicted in FIG. 4, the input terminal IN is configured to receive a start signal or an output signal from an output terminal of a previous scan unit (e.g., a (n−1)-th scan unit, a (n−2)-th scan unit, or a (n−3)-th scan unit) as an input signal; and the reset terminal RST is configured to receive an output signal from a subsequent scan unit (e.g., a (n+1)-th scan unit, a (n+2)-th scan unit, or a (n+3)-th scan unit) as a reset signal. Moreover, in the forward scanning mode, the first power supply voltage signal is at a first level (e.g., a high voltage level), and the second power supply voltage signal is at a second level (e.g., a low voltage level). In a reverse scanning mode, the first power supply voltage signal is at a second level (e.g., a low voltage level), and the second power supply voltage signal is at a first level (e.g., a high voltage level).

The inventors of the present disclosure discover that when the scan circuit is operated at a relatively high temperature (e.g., higher than room temperature, higher than 30 Celsius degrees, higher than 35 Celsius degrees, higher than 40 Celsius degrees, higher than 45 Celsius degrees, higher than 50 Celsius degrees, higher than 55 Celsius degrees, higher than 60 Celsius degrees, higher than 65 Celsius degrees, higher than 70 Celsius degrees, higher than 75 Celsius degrees, higher than 80 Celsius degrees, higher than 85 Celsius degrees, higher than 90 Celsius degrees, or higher than 95 Celsius degrees), the scan circuit is prone to output errors due to drifting of the transistor characteristics at the relatively high temperature, resulting in jitter cross-line defects in an array substrate driven by the scan circuit.

The inventors of the present disclosure discover that one of the fundamental reasons for the defects can be attributed to the negative drift of the threshold voltage of the first transistor M1 at the relatively high temperature. The negative drift of the threshold voltage of the first transistor M1 leads to an increase in an off current of the first transistor M1, resulting in a leakage of the first power supply voltage (provided to the first power supply voltage terminal VDS) to the pull-up node PU through the first transistor M1. The leakage results in an increased noise in the output signal output from the output terminal OUT.

The inventors of the present disclosure further discover that another reason for the defects can be attributed to the positive drifts of the threshold voltages of the fifth transistor M5 and the tenth transistor M10 at the relatively high temperature. The positive drifts of the threshold voltages of the fifth transistor M5 and the tenth transistor M10 lead to a decreased on current of the tenth transistor M10, reducing the denoising ability of the tenth transistor M10. The reduced denoising ability of the tenth transistor M10 results in erroneous multiple outputs of the scan circuit, which in turn leads to jitter cross-line defects in an array substrate driven by the scan circuit.

The inventors of the present disclosure further discover that a scan circuit that can be operated in a forward scanning mode and a reverse scanning mode is particularly prone to the defects described above. For example, in the reverse scanning mode, the negative drift of the threshold voltage of the first transistor M1 at the relatively high temperature is particularly severe. In the reverse scanning mode, the first transistor M1 functions as a reset transistor for resetting the potential at the pull-up node PU. The negative drift of the threshold voltage of the first transistor M1 leads to a relatively large leakage, resulting in a failure in increasing the potential level of the pull-up node PU to a higher level by the bootstrapping effect during the second period t2, and a failure of an effective control signal being output from the output terminal OUT.

A noise at the pull-up node PU and in the output signal of a present stage can lead to an increased noise level at the pull-up node PU and in the output signal of a next stage. Thus, the noise accumulates stage-by-stage, gradually escalating in later stages of the scan circuit.

Figure 6A:
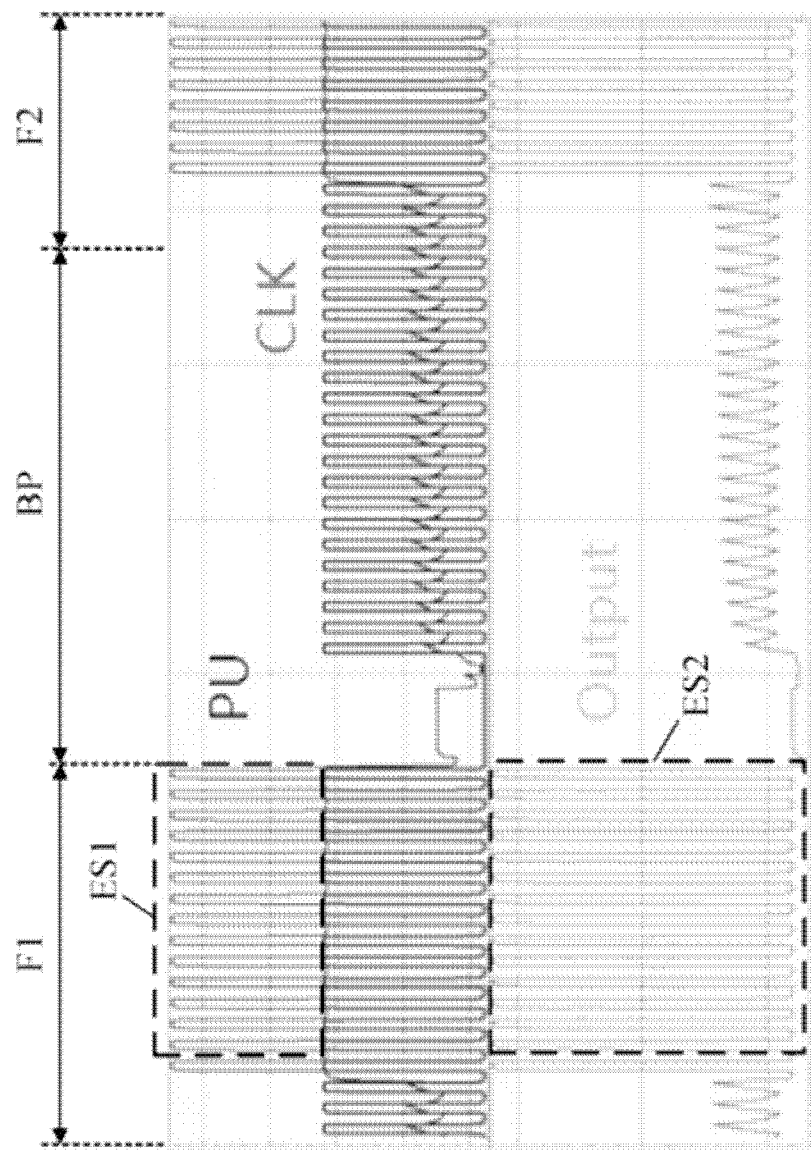
FIG. 6A shows errors of signals in a scan circuit due to drifting of the transistor characteristics at the relatively high temperature.

FIG. 6A shows errors of signals in a scan circuit due to drifting of the transistor characteristics at the relatively high temperature. FIG. 6A shows waveforms of various signals in a last stage of the scan circuit, including a first clock signal provided to a first clock signal terminal CLK, a voltage level at the pull-up node PU, and an output signal OUTPUT output from the output terminal. As shown in FIG. 6A, a period corresponding to a frame of image is denoted as "F1", a period corresponding to a next adjacent frame of image is denoted as "F2", and a blanking period between the frame of image F1 and the next adjacent frame of image F2 is denoted as "BP". In a period (e.g., any one or more of periods t3, t4, and t5 in FIG. 4 or FIG. 5) in which the pull-up node PU is supposed to have a second level (e.g., a low voltage level), the leakage of the first power supply voltage to the pull-up node PU through the first transistor M1 results in noise at the pull-up node PU with multiple peaks (denoted as "ES1" in FIG. 6A). Due to the multiple peaks at the pull-up node PU, the output signal OUTPUT from the output terminal OUT also contains noise signals synchronized with the first clock signal (denoted as "ES2" in FIG. 6A). The erroneous output continues until the end of the frame of image when the output terminal OUT is completely reset.

Figure 6B:
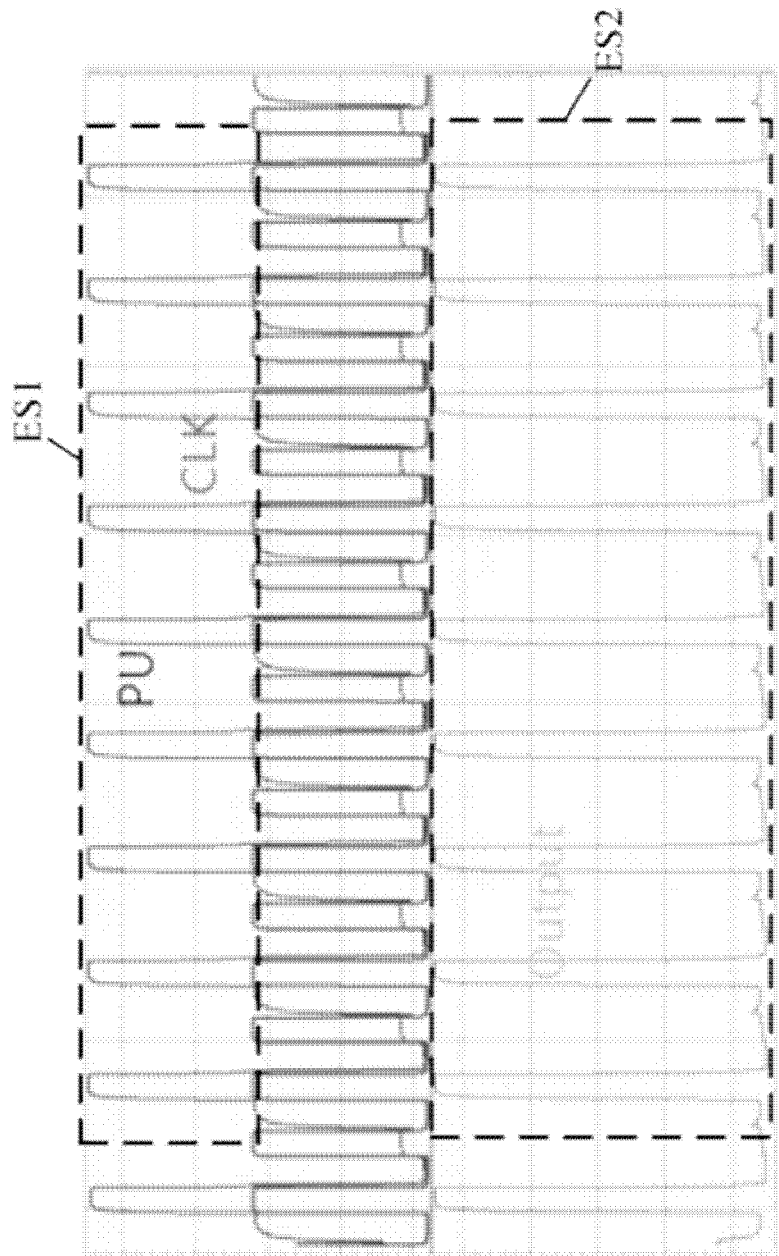
FIG. 6B shows errors of signals in a scan circuit due to drifting of the transistor characteristics at the relatively high temperature.

FIG. 6B shows errors of signals in a scan circuit due to drifting of the transistor characteristics at the relatively high temperature. FIG. 6B shows waveforms of various signals in an intermediate stage of the scan circuit, including a first clock signal provided to a first clock signal terminal CLK, a voltage level at the pull-up node PU, and an output signal OUTPUT from the output terminal. As shown in FIG. 6B, in a period (e.g., any one or more of periods t3, t4, and t5 in FIG. 4 or FIG. 5) in which the pull-up node PU is supposed to have a second level (e.g., a low voltage level), the leakage of the first power supply voltage to the pull-up node PU through the first transistor M1 results in noise at the pull-up node PU with multiple peaks (denoted as "ES1" in FIG. 6B). Due to the multiple peaks at the pull-up node PU, the output signal OUTPUT from the output terminal OUT also contains noise signals (denoted as "ES2" in FIG. 6B). However, the output signal OUTPUT is not synchronized with the first clock signal. This is because, for the intermediate stage of the scan circuit, the scan unit includes a second transistor for resetting the voltage level at the pull-up node PU. After the resetting and when the scan unit receives a subsequent first level (e.g., a high voltage level) of the first clock signal, the pull-up node PU is still at a second level (e.g., a low level), and the output signal OUTPUT is also a low voltage signal. A cycle time of the output signal OUTPUT is twice of a cycle time of the first clock signal.

Figure 6C:
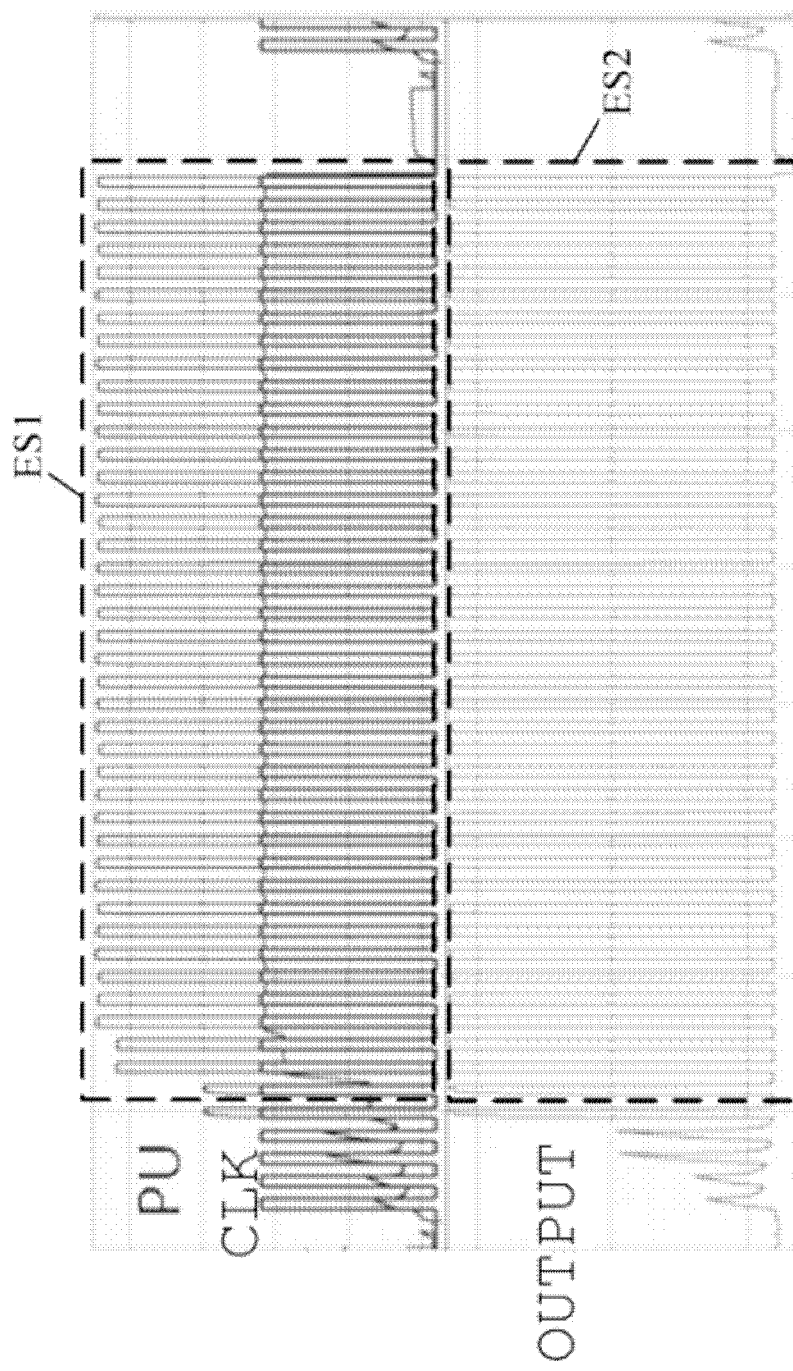
FIG. 6C shows errors of signals in a scan circuit due to drifting of the transistor characteristics at the relatively high temperature.

FIG. 6C shows errors of signals in a scan circuit due to drifting of the transistor characteristics at the relatively high temperature. Referring to FIG. 6C, the noise at the pull-up node PU with multiple peaks (denoted as "ES1" in FIG. 6C) and the erroneous output signal with multiple peaks (denoted as "ES2" in FIG. 6C) are observed when the negative drift of the threshold voltage of the first transistor M1 is at −0.6 V.

Figure 6D:
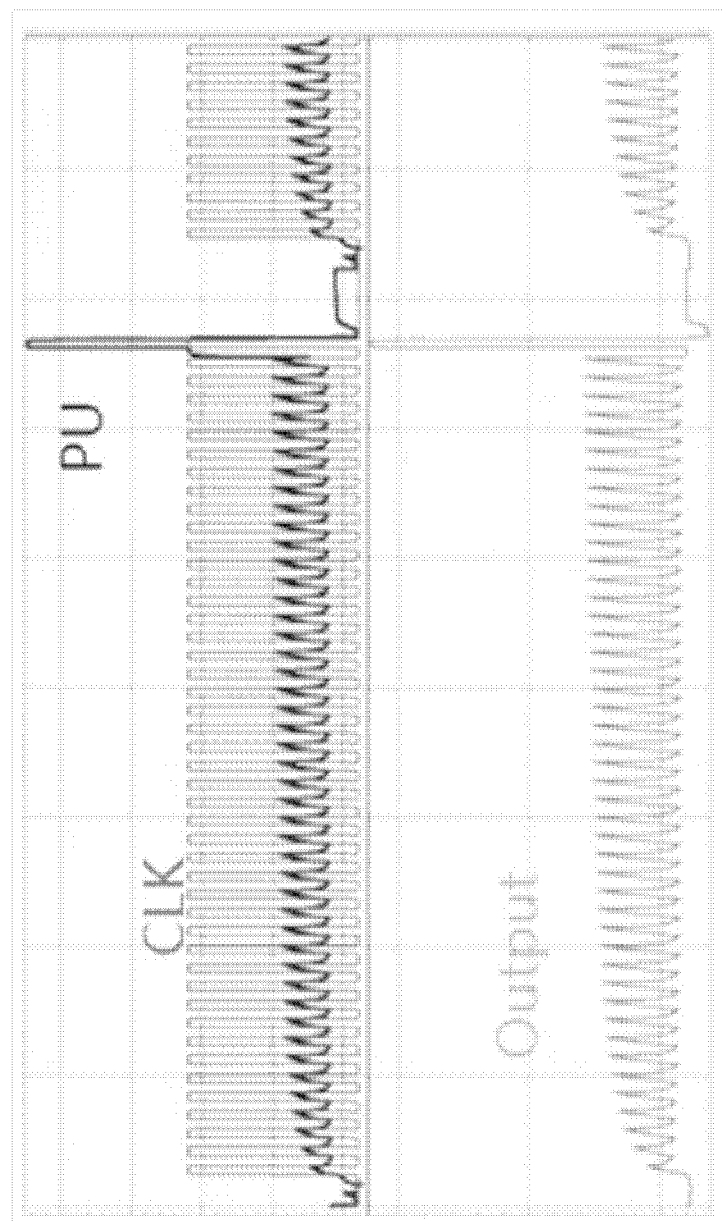
FIG. 6D shows errors of signals in a scan circuit due to drifting of the transistor characteristics at the relatively high temperature.

FIG. 6D shows errors of signals in a scan circuit due to drifting of the transistor characteristics at the relatively high temperature. Referring to FIG. 6D, the noise at the pull-up node PU with multiple peaks and the erroneous output signal with multiple peaks are not observed when the negative drift of the threshold voltage of the first transistor M1 is at −0.5 V. Referring to FIG. 6C and FIG. 6D, the threshold voltage of the first transistor M1 in FIG. 6C is relatively more negative drifted as compared to the threshold voltage of the first transistor M1 in FIG. 6D. For example, the threshold voltage of the first transistor M1 in FIG. 6C is more negative than the threshold voltage of the first transistor M1 in FIG. 6D, and an on current of the first transistor M1 in FIG. 6C is smaller than an on current of the first transistor M1 in FIG. 6D. The first transistor M1 in FIG. 6C is more prone to the leakage of the first power supply voltage to the pull-up node PU, resulting in the noise at the pull-up node PU with multiple peaks, and erroneous output signal with multiple peaks from the output terminal OUT. The inventors of the present disclosure discover that the fundamental reason for the defects is the negative drift of the threshold voltage of the first transistor. The scan circuit according to the present disclosure obviates the issue of leakage at the first transistor M1 due to the negative drift of the threshold voltage of the first transistor M1, reducing or eliminating erroneous output. Moreover, the scan circuit includes a plurality of stages of cascaded scan units. The negative drift of the threshold voltage of the first transistor M1 becomes increasingly severe in higher stages of the scan circuit as compared to that in lower stages. The scan circuit according to the present disclosure effectively obviates these issues, achieving high reliability even at a relatively high temperature.

The inventors of the present disclosure discover that, surprisingly and unexpectedly, by including a denoising subcircuit in a respective scan unit of the scan circuit, the leakage at the pull-up node PU and/or the noise in the output signal can be significantly reduced or eliminated. In some embodiments, the denoising subcircuit is coupled to a pull-up node or an output terminal of the respective scan unit. Optionally, the denoising subcircuit is coupled to the pull-up node of the respective scan unit. Optionally, the denoising subcircuit is coupled to the output terminal of the respective scan unit.

Figure 7:
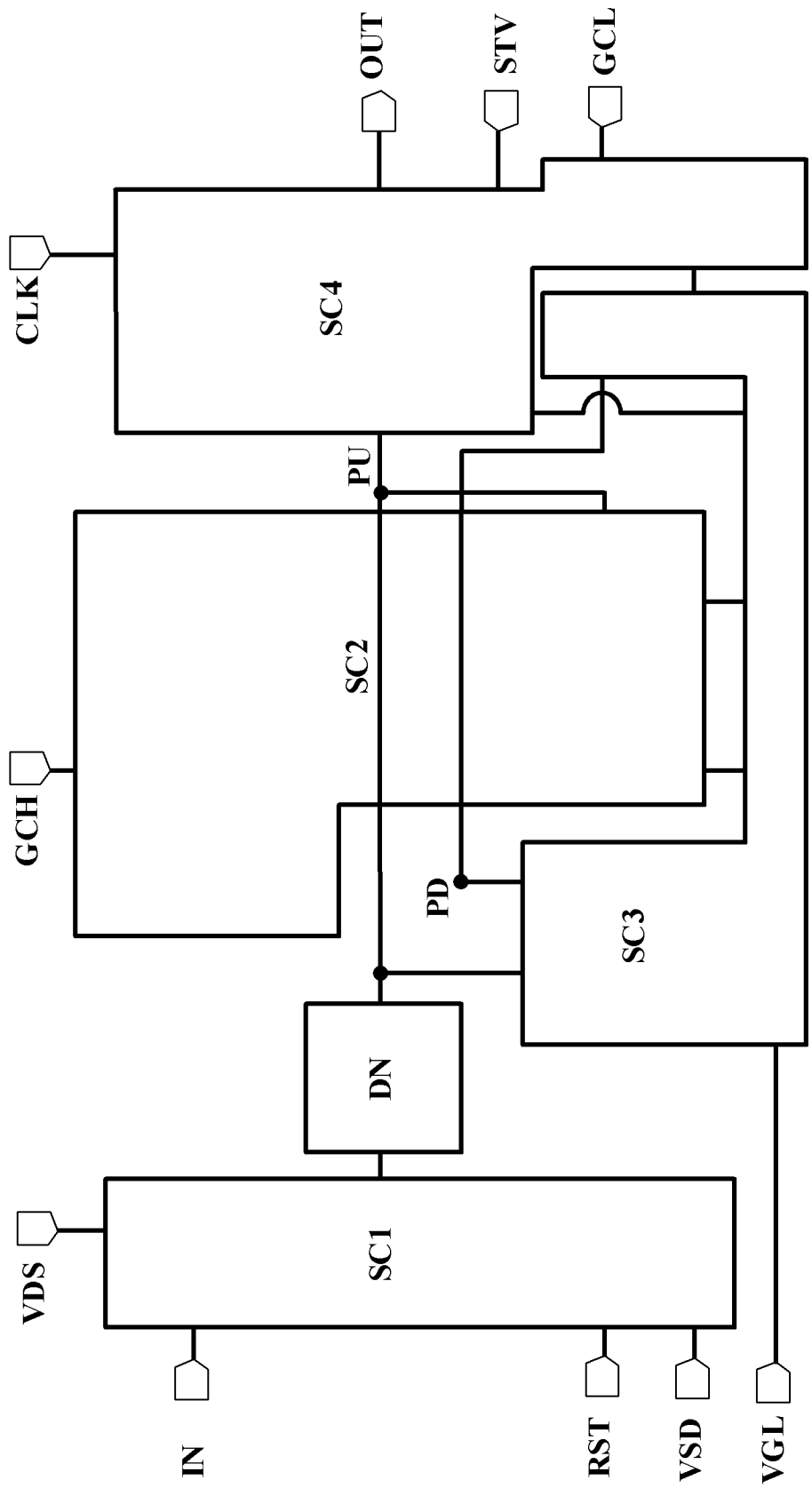
FIG. 7 is a schematic diagram of a respective scan unit in some embodiments according to the present disclosure.
Figure 8A:
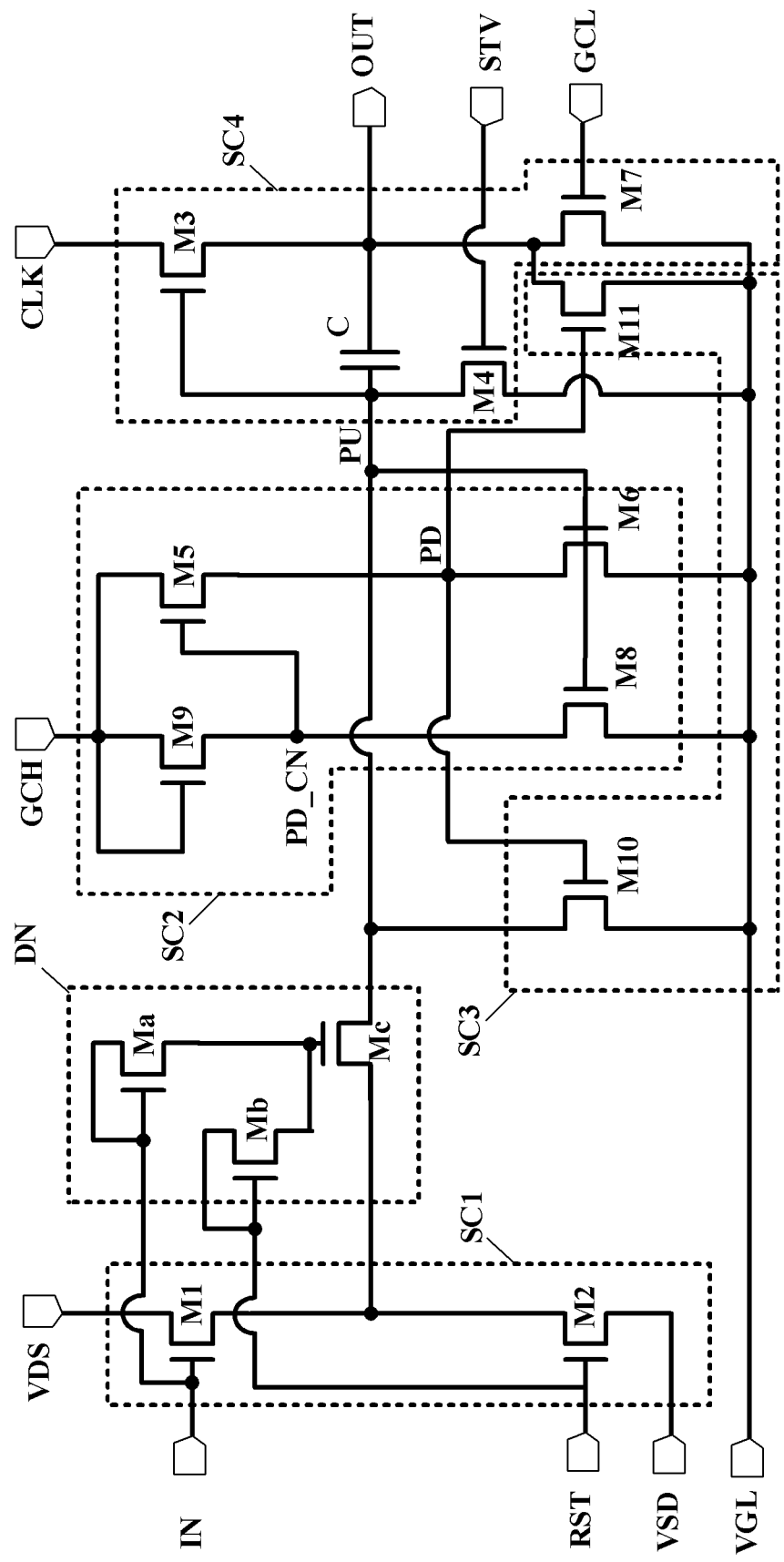
FIG. 8A is a circuit diagram of a respective scan unit in some embodiments according to the present disclosure.
Figure 8B:
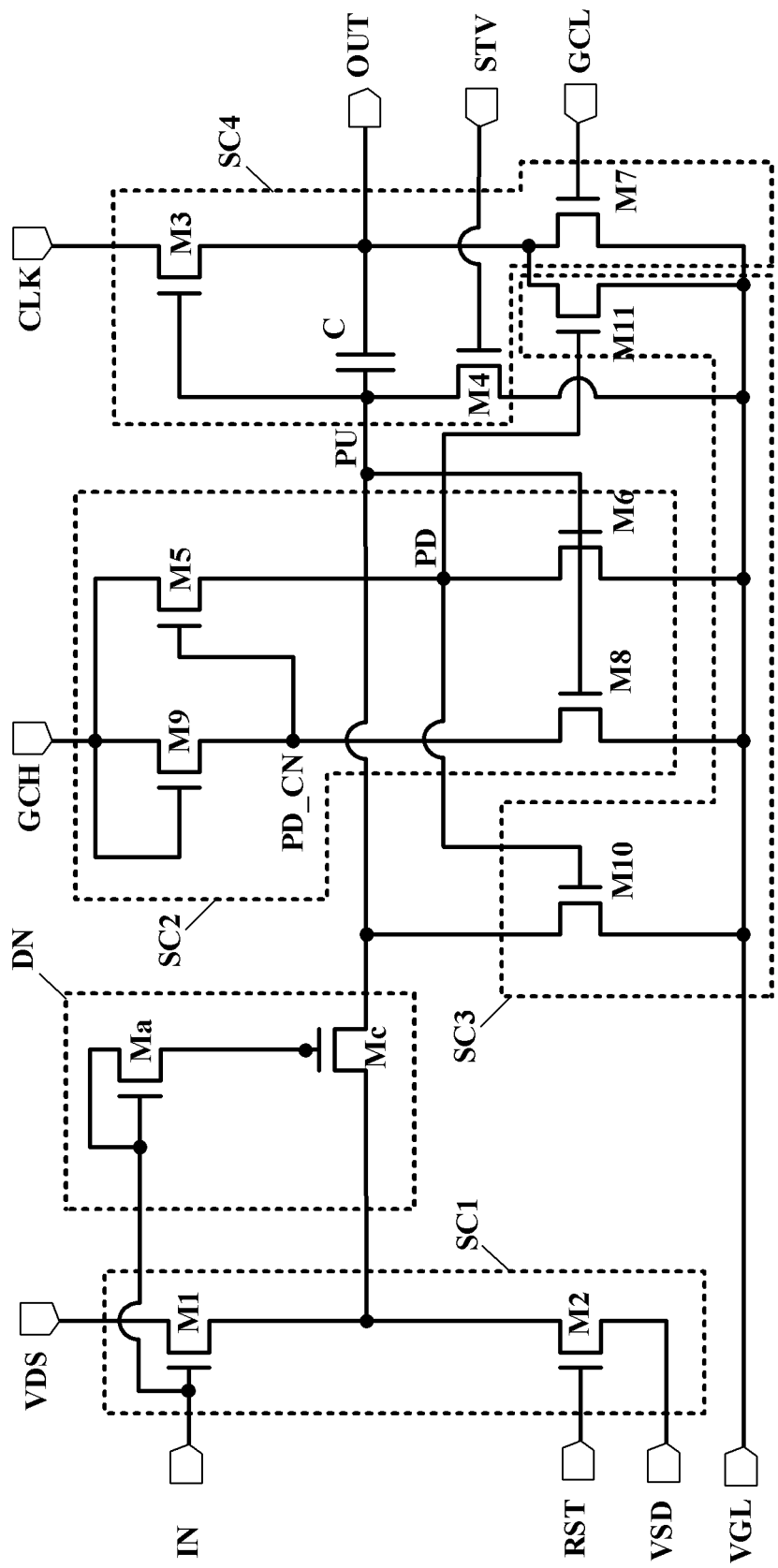
FIG. 8B is a circuit diagram of a respective scan unit in some embodiments according to the present disclosure.
Figure 9A:
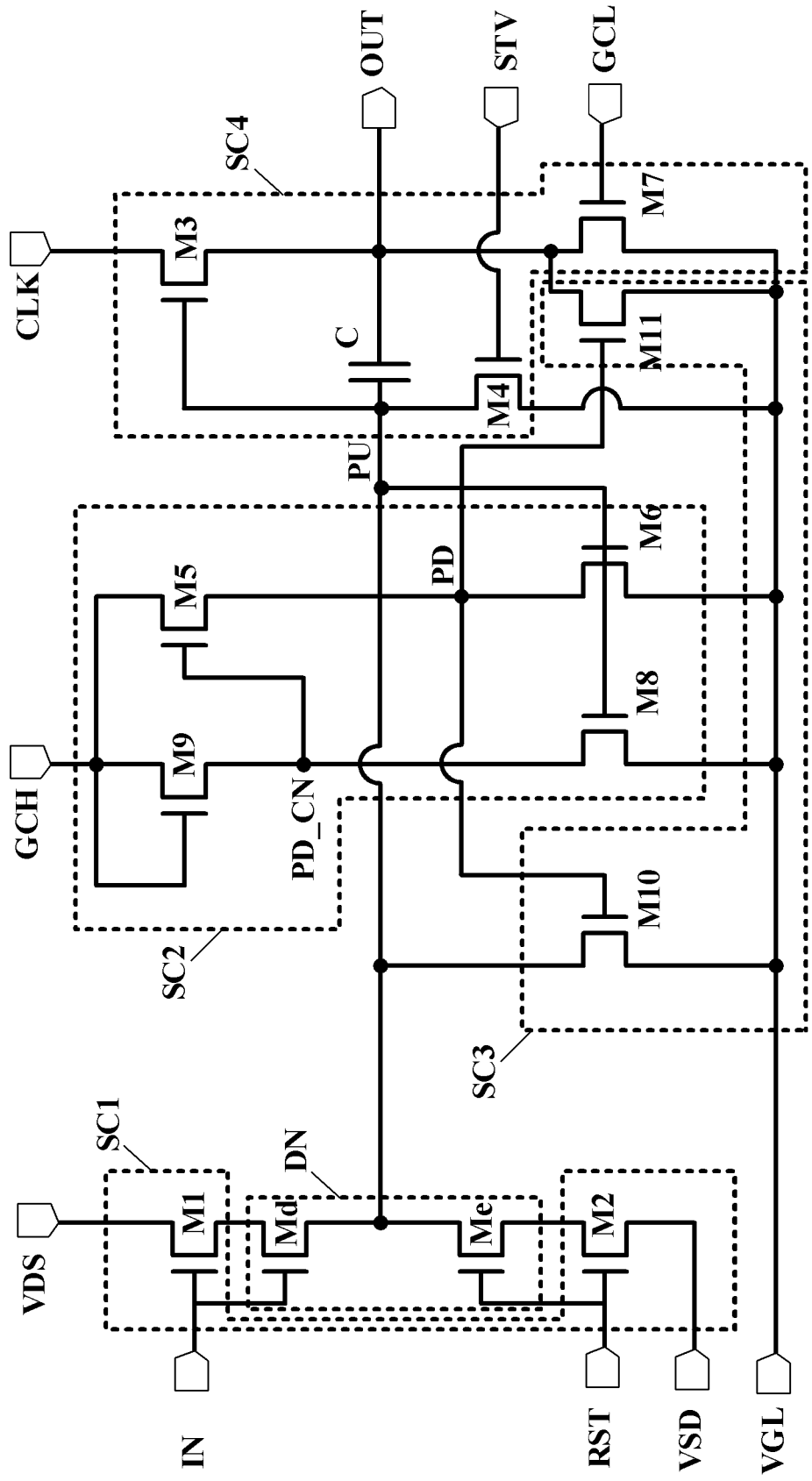
FIG. 9A is a circuit diagram of a respective scan unit in some embodiments according to the present disclosure.
Figure 9B:
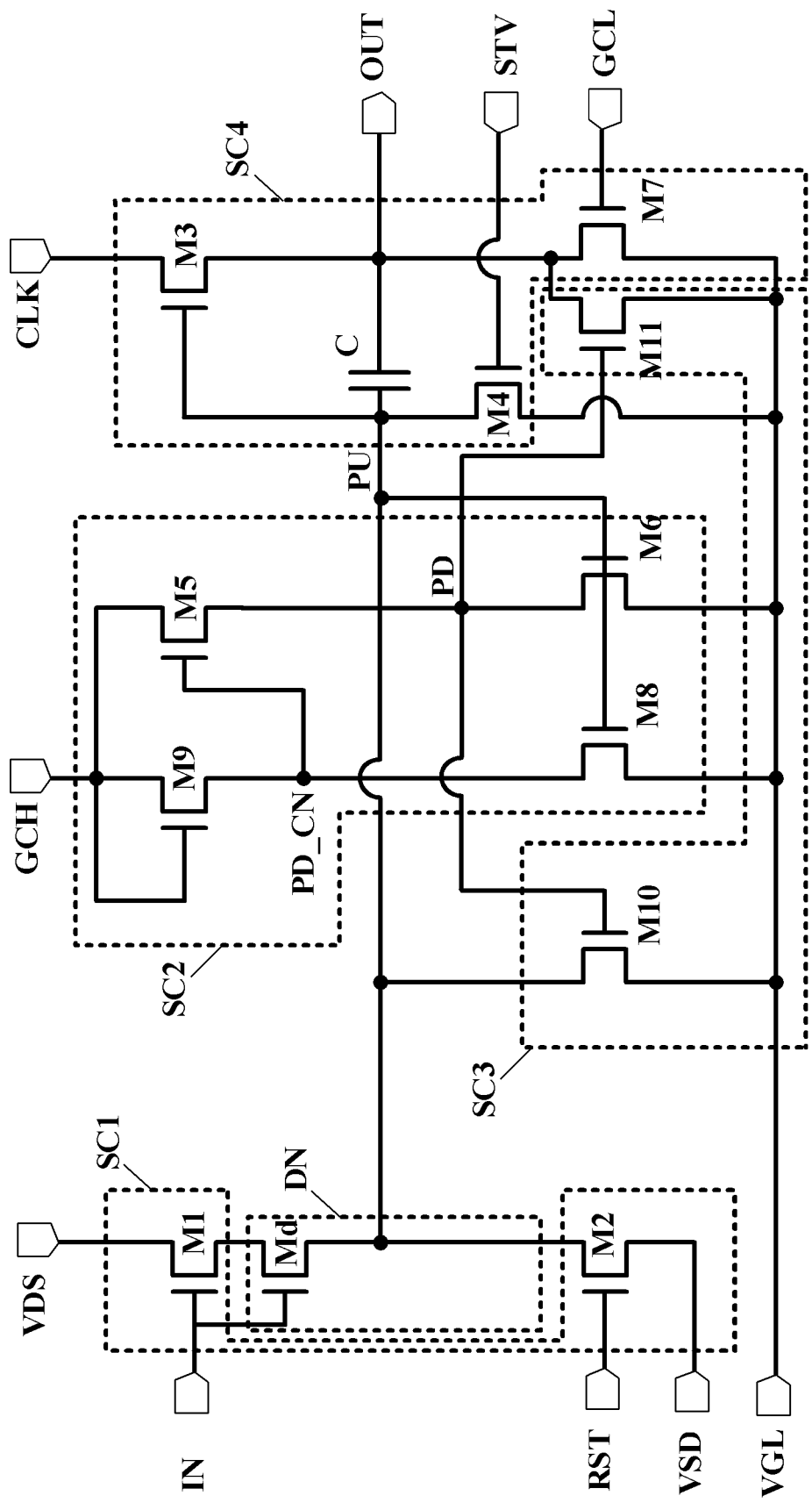
FIG. 9B is a circuit diagram of a respective scan unit in some embodiments according to the present disclosure.
Figure 9C:
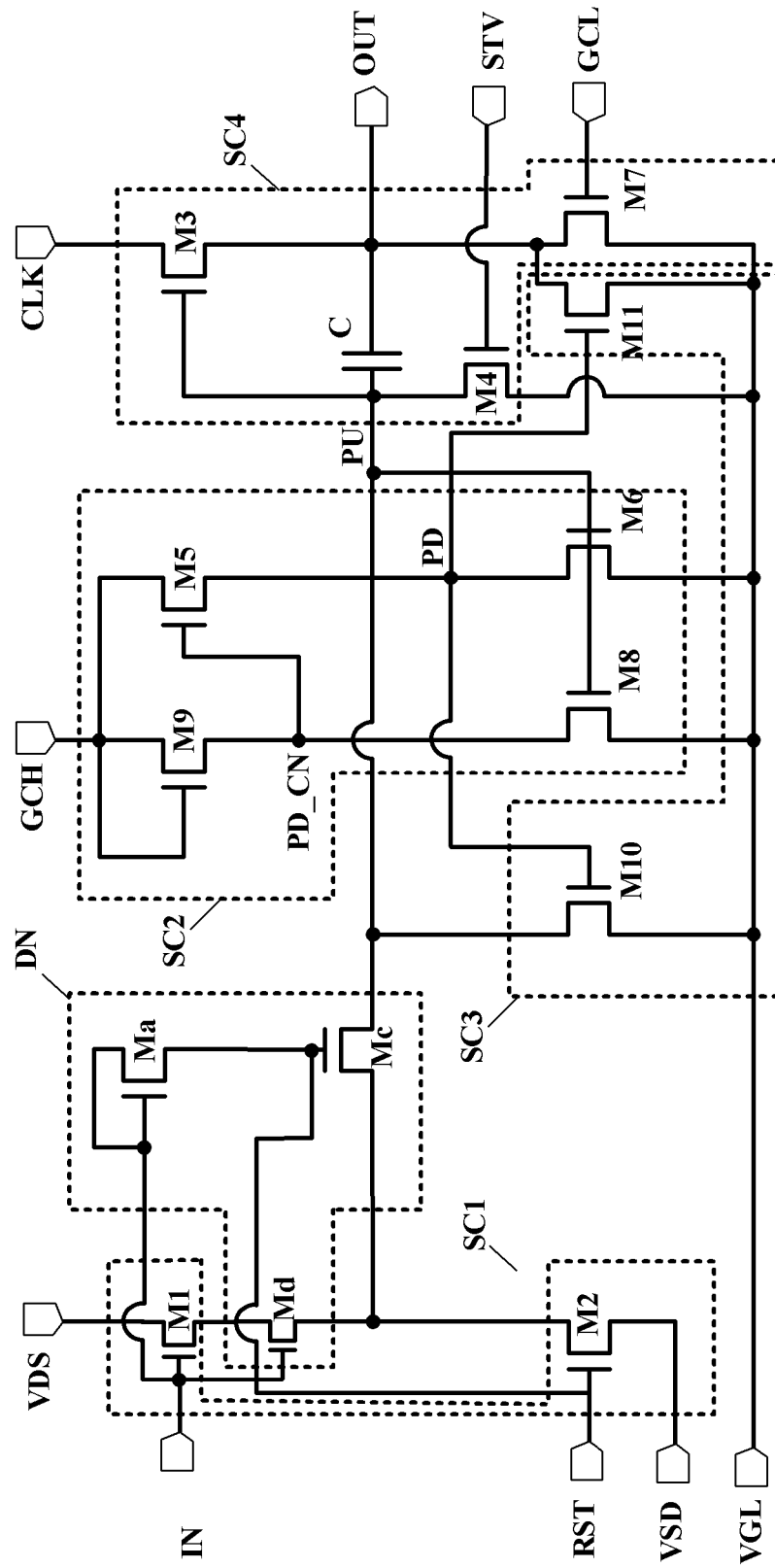
FIG. 9C is a circuit diagram of a respective scan unit in some embodiments according to the present disclosure.
Figure 9D:
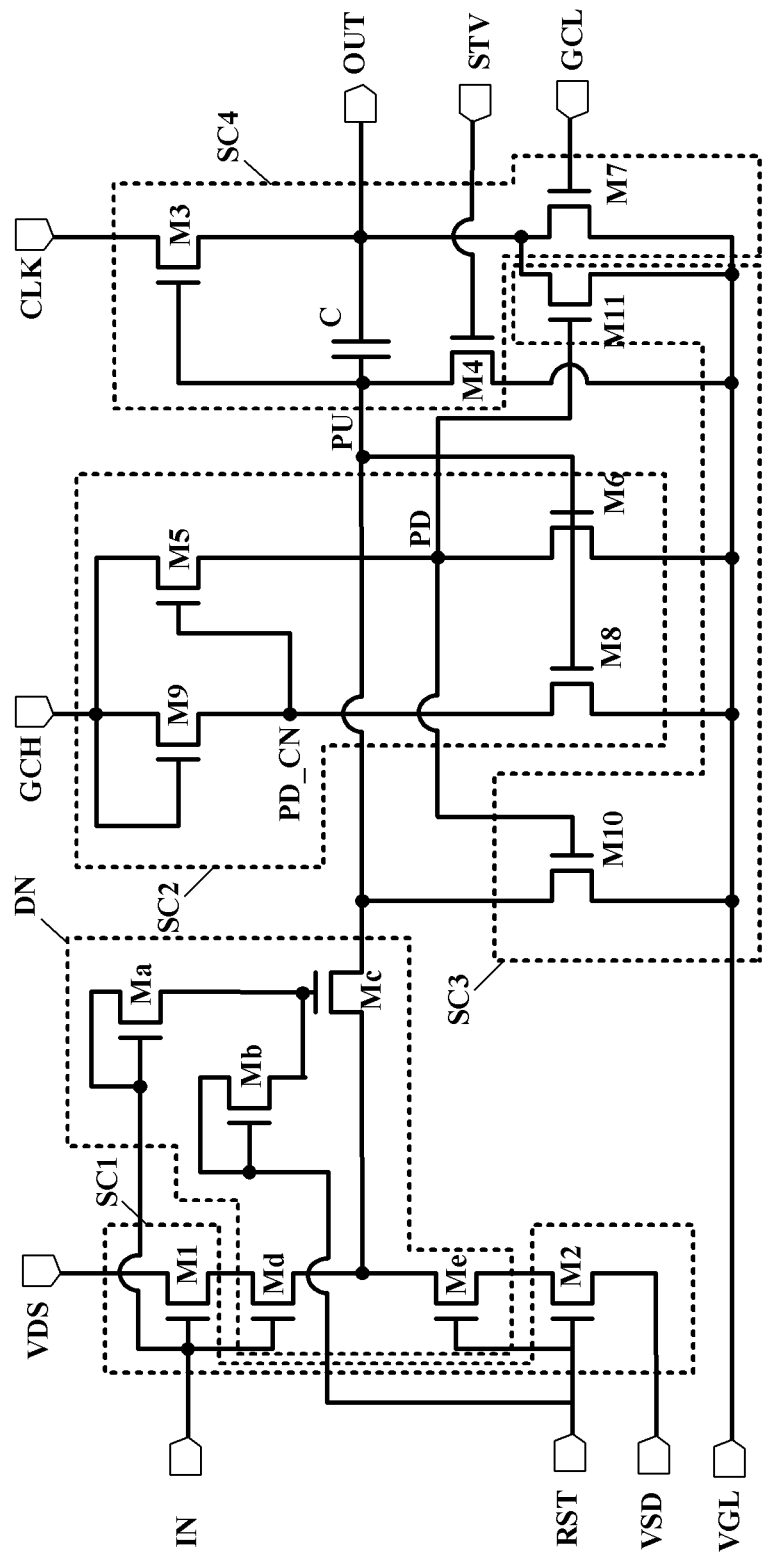
FIG. 9D is a circuit diagram of a respective scan unit in some embodiments according to the present disclosure.
Figure 10:
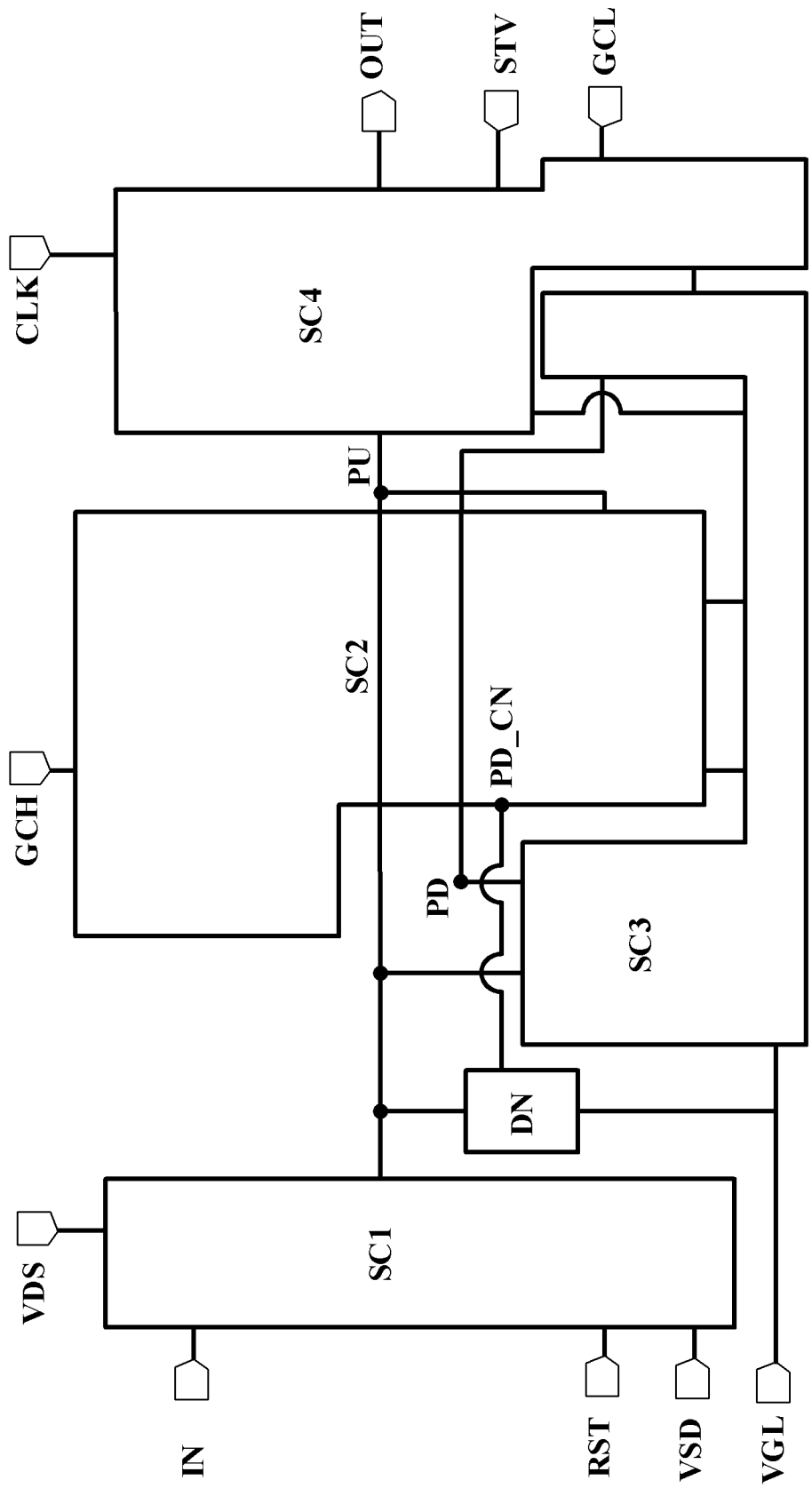
FIG. 10 is a schematic diagram of a respective scan unit in some embodiments according to the present disclosure.
Figure 11:
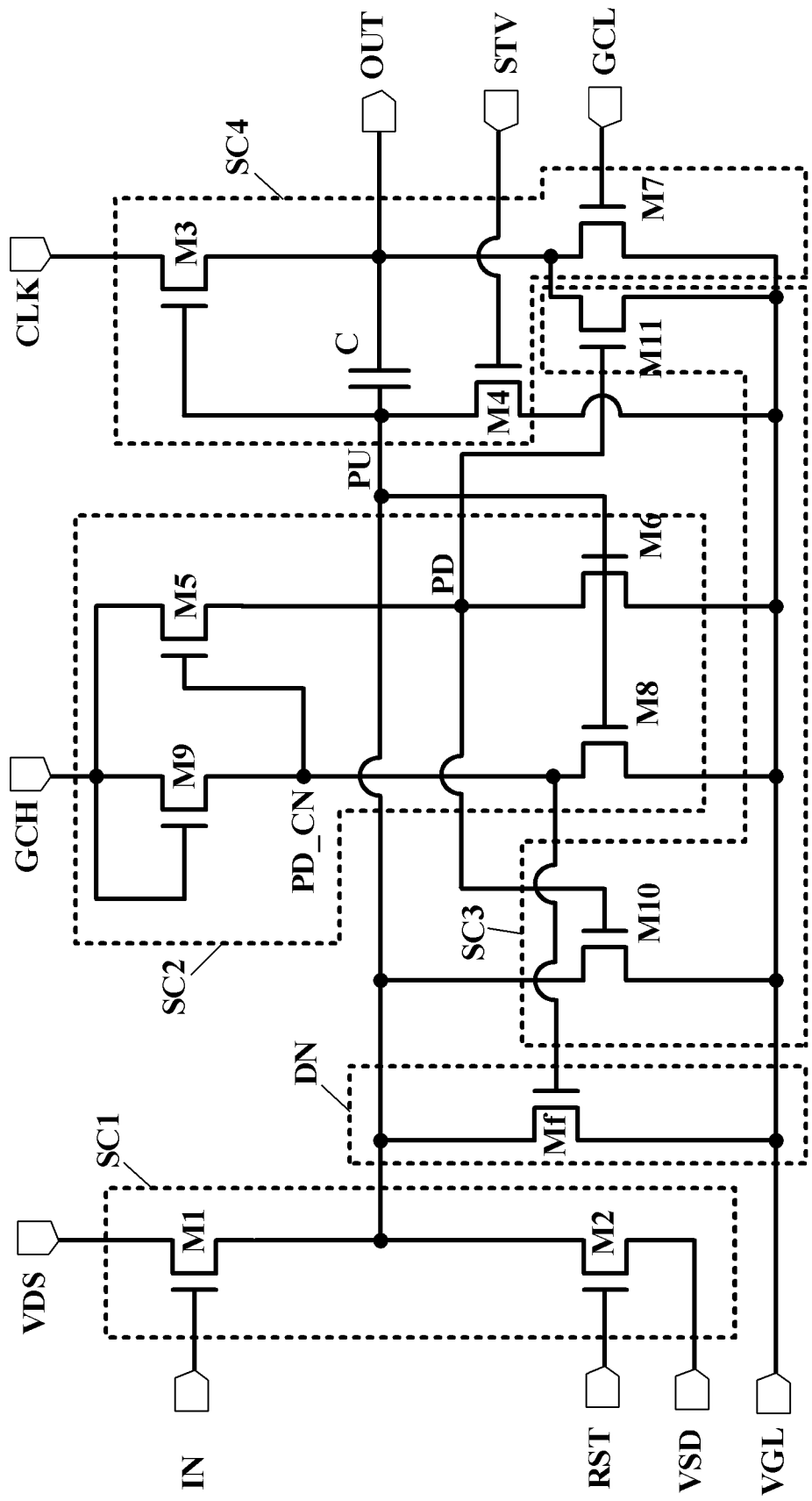
FIG. 11 is a circuit diagram of a respective scan unit in some embodiments according to the present disclosure.
Figure 12:
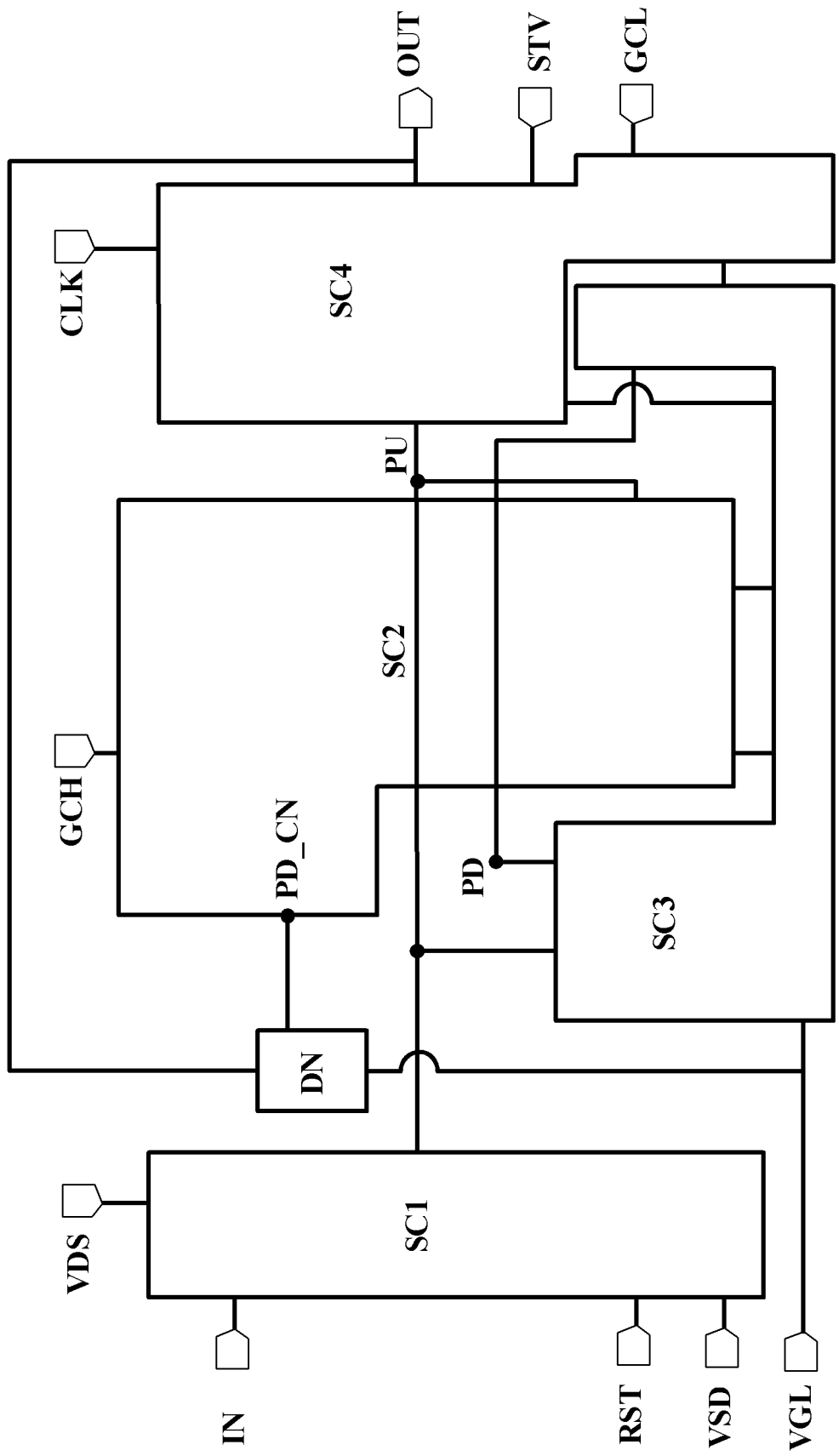
FIG. 12 is a schematic diagram of a respective scan unit in some embodiments according to the present disclosure.
Figure 13:
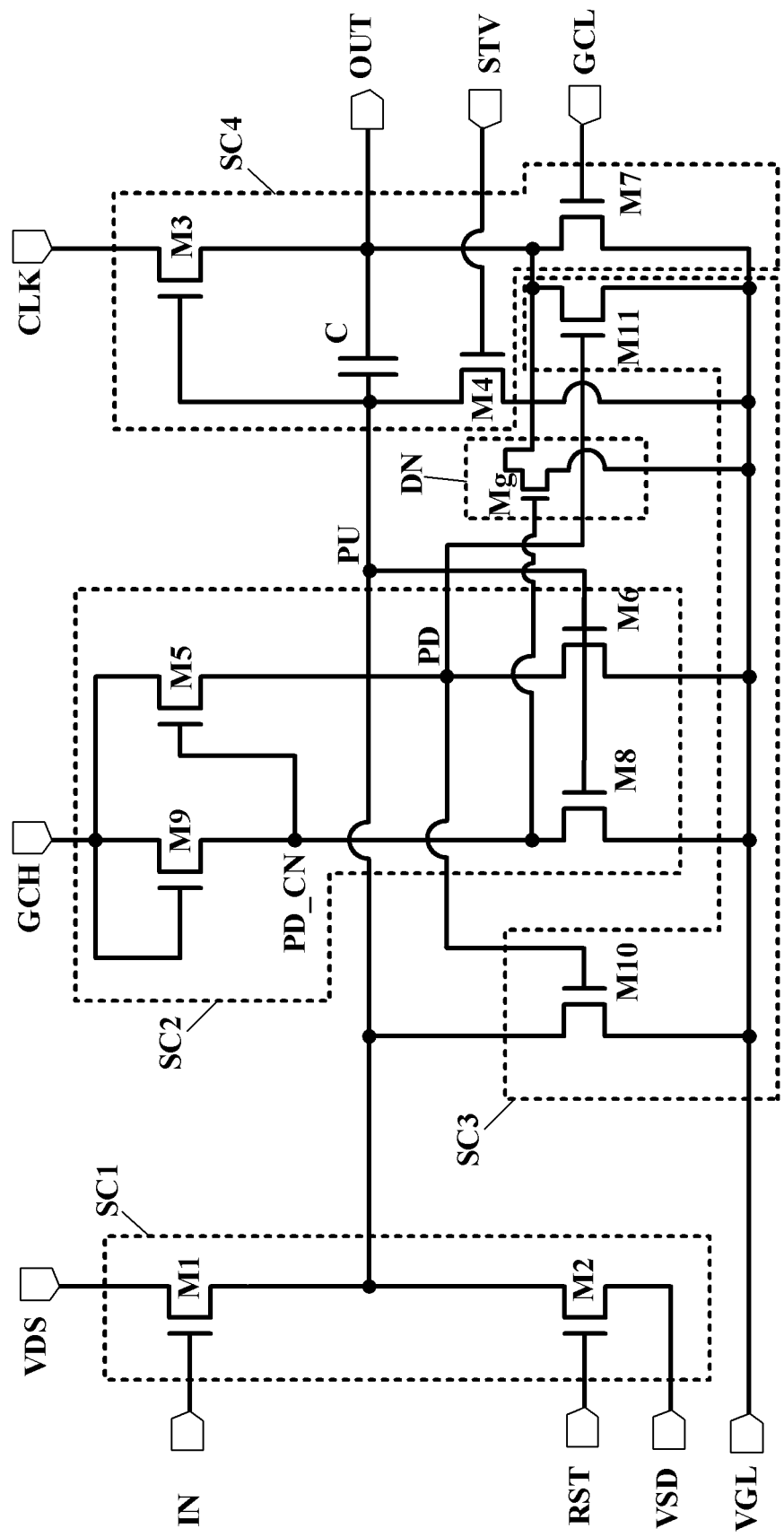
FIG. 13 is a circuit diagram of a respective scan unit in some embodiments according to the present disclosure.
Figure 14:
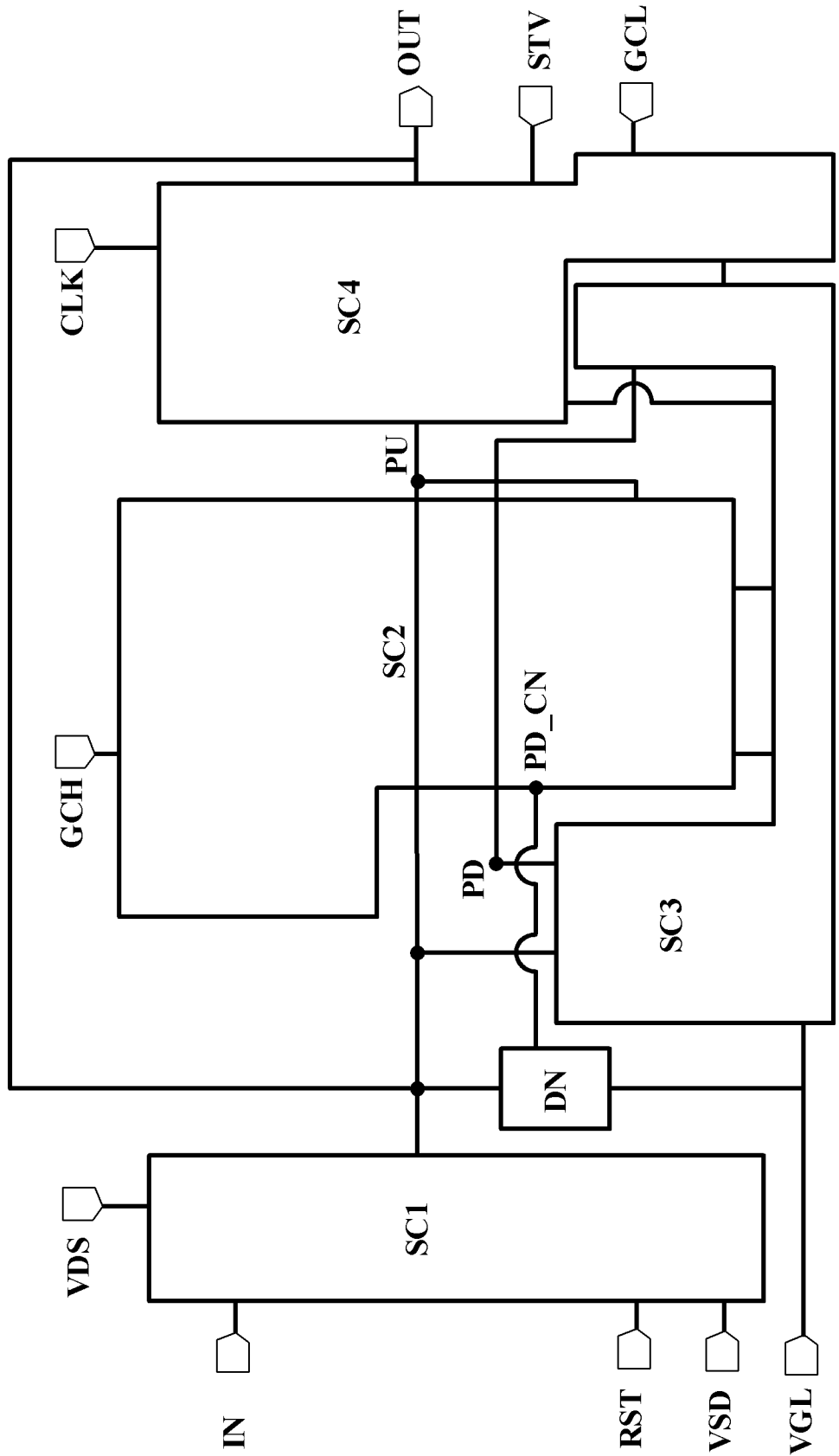
FIG. 14 is a schematic diagram of a respective scan unit in some embodiments according to the present disclosure.
Figure 15:
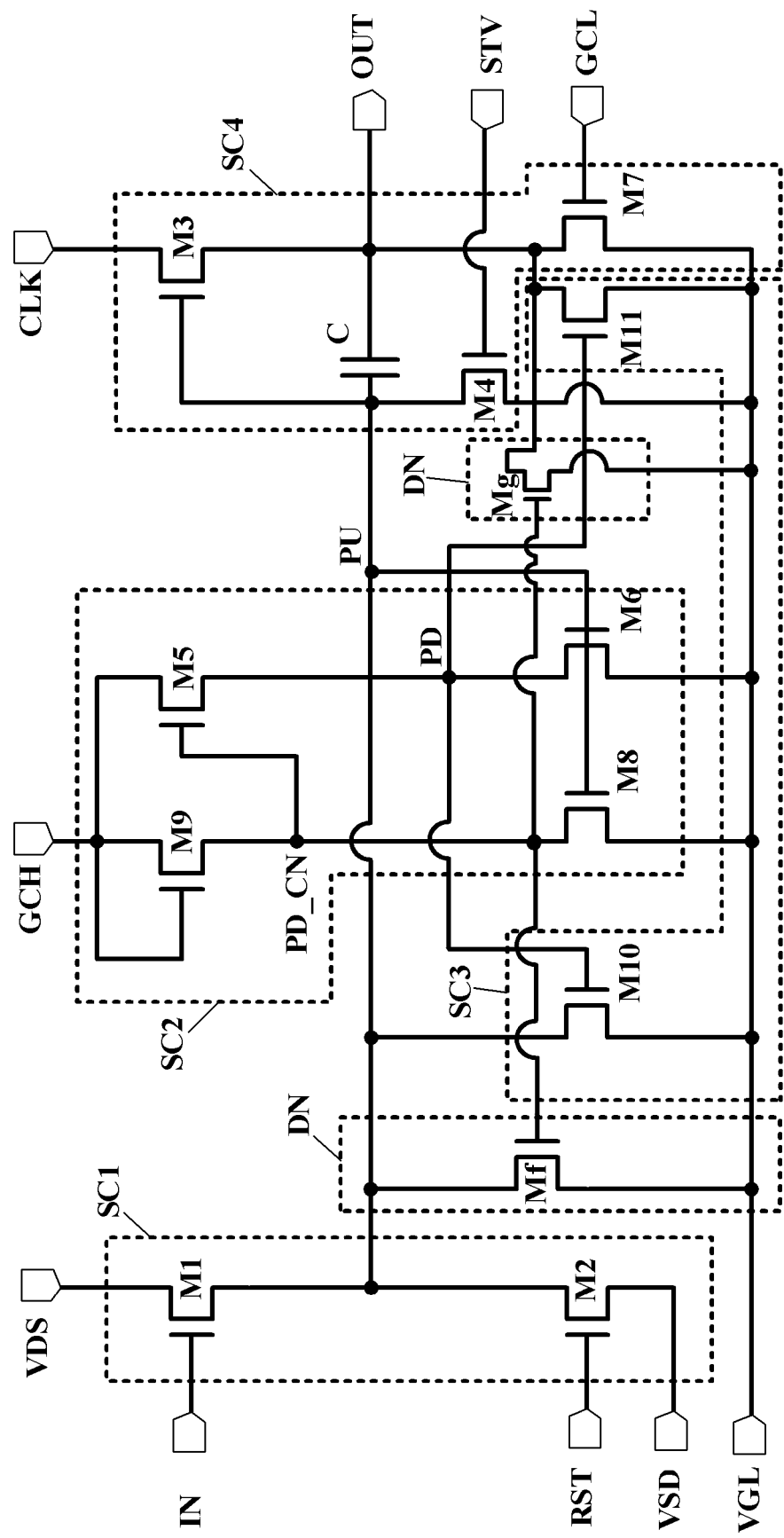
FIG. 15 is a circuit diagram of a respective scan unit in some embodiments according to the present disclosure.

FIG. 7 is a schematic diagram of a respective scan unit in some embodiments according to the present disclosure. FIG. 8A is a circuit diagram of a respective scan unit in some embodiments according to the present disclosure. FIG. 8B is a circuit diagram of a respective scan unit in some embodiments according to the present disclosure. FIG. 9A is a circuit diagram of a respective scan unit in some embodiments according to the present disclosure. FIG. 9B is a circuit diagram of a respective scan unit in some embodiments according to the present disclosure. FIG. 9C is a circuit diagram of a respective scan unit in some embodiments according to the present disclosure. FIG. 9D is a circuit diagram of a respective scan unit in some embodiments according to the present disclosure. FIG. 10 is a schematic diagram of a respective scan unit in some embodiments according to the present disclosure. FIG. 11 is a circuit diagram of a respective scan unit in some embodiments according to the present disclosure. FIG. 12 is a schematic diagram of a respective scan unit in some embodiments according to the present disclosure. FIG. 13 is a circuit diagram of a respective scan unit in some embodiments according to the present disclosure. FIG. 14 is a schematic diagram of a respective scan unit in some embodiments according to the present disclosure. FIG. 15 is a circuit diagram of a respective scan unit in some embodiments according to the present disclosure.

Referring to FIG. 7 to FIG. 15, the respective scan unit in some embodiments in some embodiments includes a first subcircuit SC1 configured to receive an input signal and a first power supply voltage signal; a second subcircuit SC2 configured to receive a first voltage signal and a third power supply voltage signal; a third subcircuit SC3 configured to receive the third power supply voltage signal; a fourth subcircuit SC4 configured to receive a first clock signal and output a control signal through an output terminal; a pull-up node PU; and a denoising subcircuit DN configured to reduce noise in the output signal. Optionally, the denoising subcircuit DN is coupled to a pull-up node PU or an output terminal OUT of the respective scan unit.

In some embodiments, the first subcircuit SC1 is configured to control a potential level at the pull-up node PU based on the input signal received from the input terminal IN. Optionally, the first subcircuit SC1 and the denoising subcircuit DN together are configured to control a potential level at the pull-up node PU based on the input signal received from the input terminal IN. Optionally, the first subcircuit SC1 is configured to pull up the potential level at the pull-up node PU based on the input signal received from the input terminal IN. Optionally, the first subcircuit SC1 and the denoising subcircuit DN together are configured to pull up the potential level at the pull-up node PU based on the input signal received from the input terminal IN.

In some embodiments, the first subcircuit SC1 is further configured to control a potential level at the pull-up node PU based on a reset signal received from a reset terminal RST. Optionally, the first subcircuit SC1 and the denoising subcircuit DN together are configured to control a potential level at the pull-up node PU based on a reset signal received from a reset terminal RST. Optionally, the first subcircuit SC1 is configured to reset the potential level at the pull-up node PU based on the reset signal received from the reset terminal RST. Optionally, the first subcircuit SC1 and the denoising subcircuit DN together are configured to reset the potential level at the pull-up node PU based on the reset signal received from the reset terminal RST.

In some embodiments, the second subcircuit SC2 is configured to control potential levels at a pull-down node PD and a pull-down control node PD_CN based on the first voltage signal and the potential level at the pull-up node PU. Optionally, the second subcircuit SC2 is configured to maintain the potential levels of the pull-down node PD and the pull-down control node PD_CN at a second level (e.g., a low level) if the potential level at the pull-up node PU is at a first level (e.g., a high level).

In some embodiments, the third subcircuit SC3 is configured to pull down potential levels at the output terminal OUT and the pull-up node PU based on the potential level at the pull-down node PD.

In some embodiments, the fourth subcircuit SC4 is configured to output the output signal from the output terminal OUT based on the first clock signal and the potential level at the pull-up node PU, the output signal being used as a control signal for driving an array substrate.

Optionally, the pull-up node PU is coupled to the second subcircuit SC2, the third subcircuit SC3, and the fourth subcircuit SC4. In one example, the pull-up node PU is coupled to the first subcircuit SC1. In another example, the pull-up node PU is coupled to the denoising subcircuit DN.

Referring to FIG. 7, FIG. 8A, FIG. 8B, and FIG. 9A to FIG. 9D, in some embodiments, the denoising subcircuit DN is coupled between the first subcircuit SC1 and the pull-up node PU. The first subcircuit SC1 and the denoising subcircuit DN together are configured to control a potential level at the pull-up node PU based on the input signal received from the input terminal IN. The first subcircuit SC1 and the denoising subcircuit DN together are configured to pull up the potential level at the pull-up node PU based on the input signal received from the input terminal IN. Optionally, the first subcircuit SC1 and the denoising subcircuit DN together are configured to control a potential level at the pull-up node PU based on a reset signal received from a reset terminal RST. Optionally, the first subcircuit SC1 and the denoising subcircuit DN together are configured to reset the potential level at the pull-up node PU based on the reset signal received from the reset terminal RST.

Referring to FIG. 7, FIG. 8A, FIG. 8B, FIG. 9A to FIG. 9D, in some embodiments, the denoising subcircuit DN is coupled to the input terminal IN, the reset terminal RST, and the pull-up node PU. The denoising subcircuit DN is configured to control connection or disconnection between the first subcircuit SC1 and the pull-up node PU. By having the denoising subcircuit DN, the leakage of the first power supply voltage (provided to the first power supply voltage terminal VDS) to the pull-up node PU through the first transistor M1 and noise in the output signal output from the output terminal OUT can be effectively reduced or eliminated.

Referring to FIG. 7, FIG. 8A, FIG. 8B, FIG. 9A to FIG. 9D, in some embodiments, the denoising subcircuit DN is configured to connect the first transistor M1 (e.g., an input transistor controlled by an input signal) and the pull-up node PU only when the input signal provided to the input terminal IN is a high voltage signal. Optionally, the denoising subcircuit DN is configured to disconnect the first transistor M1 from the pull-up node PU when the input signal provided to the input terminal IN is a low voltage signal.

Referring to FIG. 7, FIG. 8A, FIG. 8B, FIG. 9A to FIG. 9D, in some embodiments, the denoising subcircuit DN is configured to connect the second transistor M2 (e.g., a reset transistor controlled by a reset signal) and the pull-up node PU only when the reset signal provided to the reset terminal RST is a high voltage signal. Optionally, the denoising subcircuit DN is configured to disconnect the second transistor M2 and the pull-up node PU when the reset signal provided to the reset terminal RST is a low voltage signal.

Referring to FIG. 7 and FIG. 8A, in some embodiments, the denoising subcircuit DN includes a first denoising transistor Ma, a second denoising transistor Mb, and a third denoising transistor Mc. In some embodiments, the first denoising transistor Ma is coupled between the input terminal IN and the third denoising transistor Mc. A gate electrode and a first electrode of the first denoising transistor Ma are coupled to the input terminal IN. A second electrode of the first denoising transistor Ma is coupled to a second electrode of the second denoising transistor Mb and a gate electrode of the third denoising transistor Mc.

In some embodiments, the second denoising transistor Mb is coupled between the reset terminal RST and the third denoising transistor Mc. A gate electrode and a first electrode of the second denoising transistor Mb are coupled to the reset terminal RST. A second electrode of the second denoising transistor Mb is coupled to a second electrode of the first denoising transistor Ma and a gate electrode of the third denoising transistor Mc.

In some embodiments, the third denoising transistor Mc is coupled between the pull-up node PU and second electrodes of the first transistor M1 and the second transistor M2. A gate electrode of the third denoising transistor Mc is coupled to second electrodes of the first denoising transistor Ma and the second denoising transistor Mb. A first electrode of the third denoising transistor Mc is coupled to second electrodes of the first transistor M1 and the second transistor M2. A second electrode of the third denoising transistor Mc is coupled to the pull-up node PU.

Referring to FIG. 8A, when the input terminal IN receives a start signal SS or an output signal from an output terminal of a previous scan unit (e.g., a (n−1)-th scan unit, a (n−2)-th scan unit, or a (n−3)-th scan unit) at a first level (e.g., a high level), the first transistor M1 (e.g., an input transistor), the first denoising transistor Ma, and the third denoising transistor Mc are turned on. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), the first power supply voltage signal passes through the first transistor M1 and the third denoising transistor Mc, charging the pull-up node PU to a first level (e.g., a high level).

When the input terminal IN receives a signal at a second level (e.g., a low level), the first transistor M1, the first denoising transistor Ma, and the third denoising transistor Mc are turned off. The pull-up node PU is disconnected from the first transistor M1.

When the reset terminal RST receives an output signal from a subsequent scan unit (e.g., a (n+1)-th scan unit, a (n+2)-th scan unit, or a (n+3)-th scan unit) as a reset signal at a first level (e.g., a high level), the second transistor M2 (e.g., a reset transistor), the second denoising transistor Mb, and the third denoising transistor Mc are turned on. A second power supply voltage signal provided to the second power supply voltage terminal VSD has a second level (e.g., a low level), the second power supply voltage signal passes through the second transistor M2 and the third denoising transistor Mc, resetting the pull-up node PU to a second level (e.g., a low level).

When the reset terminal RST receives a signal at a second level (e.g., a low level), the second transistor M2, the second denoising transistor Mb, and the third denoising transistor Mc are turned off. The pull-up node PU is disconnected from the second transistor M2.

Figure 16:
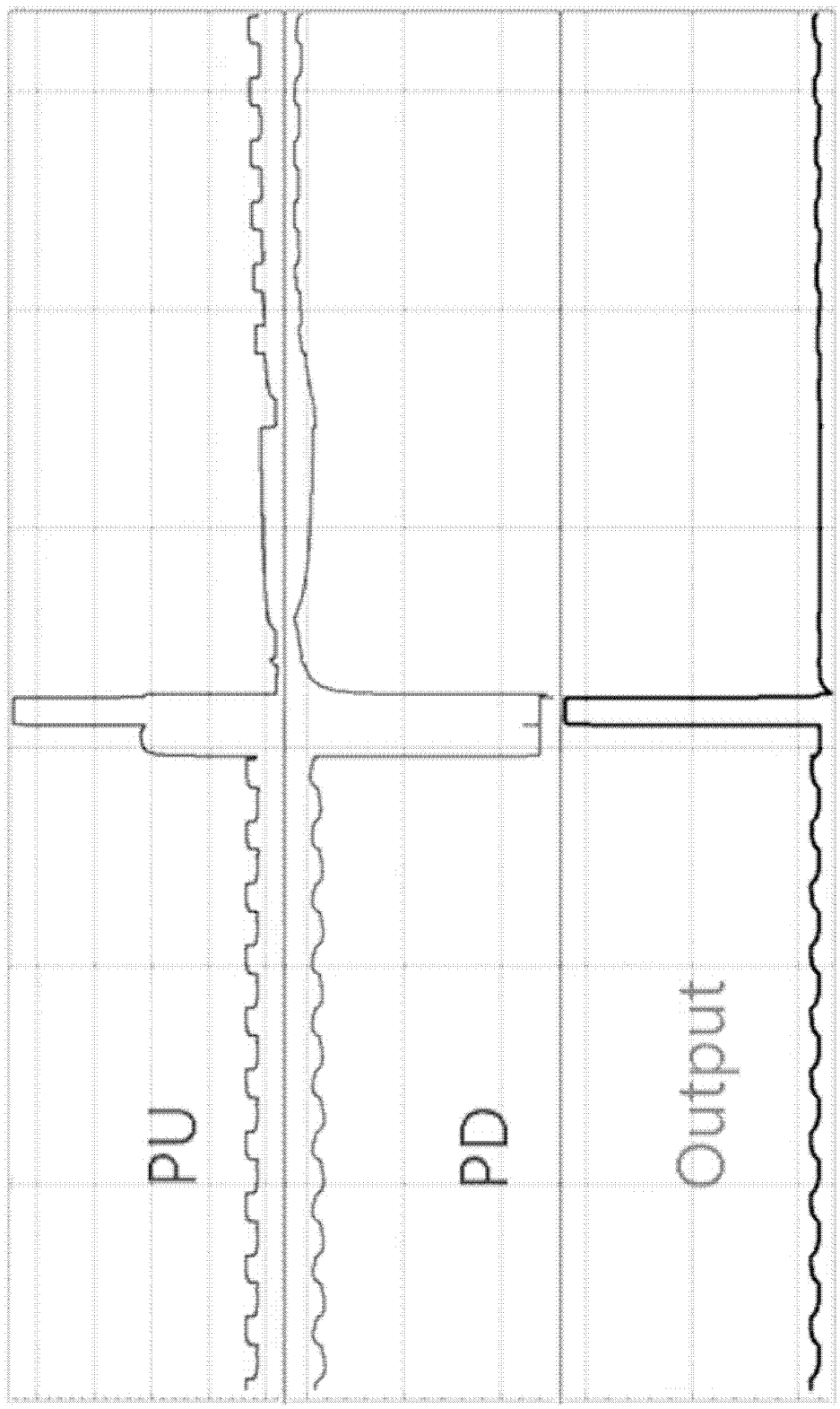
FIG. 16 shows signals in a respective scan unit in some embodiments according to the present disclosure.

By having the denoising subcircuit, the leakage of the first power supply voltage (provided to the first power supply voltage terminal VDS) to the pull-up node PU through the first transistor M1 and noise in the output signal output from the output terminal OUT can be effectively reduced or eliminated. FIG. 16 shows signals in a respective scan unit in some embodiments according to the present disclosure. FIG. 16 shows waveforms of various signals in a respective scan unit of the scan circuit, including a voltage level at the pull-up node PU, a voltage level at the pull-down node PD, and an output signal OUTPUT output from the output terminal. The leakage of the first power supply voltage to the pull-up node PU through the first transistor M1 and noise in the output signal output from the output terminal OUT are eliminated, even when the scan circuit is operated at a relatively high temperature (e.g., equal to or greater than 85 Celsius degrees).

Referring to FIG. 7 and FIG. 8B, in some embodiments, the denoising subcircuit DN includes a first denoising transistor Ma and a third denoising transistor Mc. In some embodiments, the first denoising transistor Ma is coupled between the input terminal IN and the third denoising transistor Mc. A gate electrode and a first electrode of the first denoising transistor Ma are coupled to the input terminal IN. A second electrode of the first denoising transistor Ma is coupled to a gate electrode of the third denoising transistor Mc.

In some embodiments, the third denoising transistor Mc is coupled between the pull-up node PU and second electrodes of the first transistor M1 and the second transistor M2. A gate electrode of the third denoising transistor Mc is coupled to a second electrode of the first denoising transistor Ma. A first electrode of the third denoising transistor Mc is coupled to second electrodes of the first transistor M1 and the second transistor M2. A second electrode of the third denoising transistor Mc is coupled to the pull-up node PU.

Referring to FIG. 8B, when the input terminal IN receives a start signal SS or an output signal from an output terminal of a previous scan unit (e.g., a (n−1)-th scan unit, a (n−2)-th scan unit, or a (n−3)-th scan unit) at a first level (e.g., a high level), the first transistor M1 (e.g., an input transistor), the first denoising transistor Ma, and the third denoising transistor Mc are turned on. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), the first power supply voltage signal passes through the first transistor M1 and the third denoising transistor Mc, charging the pull-up node PU to a first level (e.g., a high level).

When the input terminal IN receives a signal at a second level (e.g., a low level), the first transistor M1, the first denoising transistor Ma, and the third denoising transistor Mc are turned off. The pull-up node PU is disconnected from the first transistor M1.

When the reset terminal RST receives an output signal from a subsequent scan unit (e.g., a (n+1)-th scan unit, a (n+2)-th scan unit, or a (n+3)-th scan unit) as a reset signal at a first level (e.g., a high level), the second transistor M2 (e.g., a reset transistor) are turned on. A second power supply voltage signal provided to the second power supply voltage terminal VSD has a second level (e.g., a low level), the second power supply voltage signal passes through the second transistor M2, resetting the pull-up node PU to a second level (e.g., a low level).

When the reset terminal RST receives a signal at a second level (e.g., a low level), the second transistor M2 are turned off. The pull-up node PU is disconnected from the second transistor M2.

By having the denoising subcircuit, the leakage of the first power supply voltage (provided to the first power supply voltage terminal VDS) to the pull-up node PU through the first transistor M1 and noise in the output signal output from the output terminal OUT can be effectively reduced or eliminated.

Referring to FIG. 7 and FIG. 9A, in some embodiments, the denoising subcircuit DN includes a fourth denoising transistor Md and a fifth denoising transistor Me. In some embodiments, the fourth denoising transistor Md is coupled between the pull-up node PU and the first transistor M1 (e.g., an input transistor). A gate electrode of the fourth denoising transistor Md is coupled to the input terminal IN. A first electrode of the fourth denoising transistor Md is coupled to a second electrode of the first transistor M1. A second electrode of the fourth denoising transistor Md is coupled to the pull-up node PU.

In some embodiments, the fifth denoising transistor Me is coupled between the pull-up node PU and the second transistor M2 (e.g., a reset transistor). A gate electrode of the fifth denoising transistor Me is coupled to the reset terminal RST. A first electrode of the fifth denoising transistor Me is coupled to a second electrode of the second transistor M2. A second electrode of the fifth denoising transistor Me is coupled to the pull-up node PU.

Referring to FIG. 9A, when the input terminal IN receives a start signal SS or an output signal from an output terminal of a previous scan unit (e.g., a (n−1)-th scan unit, a (n−2)-th scan unit, or a (n−3)-th scan unit) at a first level (e.g., a high level), the first transistor M1 (e.g., an input transistor) and the fourth denoising transistor Md are turned on. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), the first power supply voltage signal passes through the first transistor M1 and the fourth denoising transistor Md, charging the pull-up node PU to a first level (e.g., a high level).

When the input terminal IN receives a signal at a second level (e.g., a low level), the first transistor M1 and the fourth denoising transistor Md are turned off. The pull-up node PU is disconnected from the first transistor M1.

When the reset terminal RST receives an output signal from a subsequent scan unit (e.g., a (n+1)-th scan unit, a (n+2)-th scan unit, or a (n+3)-th scan unit) as a reset signal at a first level (e.g., a high level), the second transistor M2 (e.g., a reset transistor) and the fifth denoising transistor Me are turned on. A second power supply voltage signal provided to the second power supply voltage terminal VSD has a second level (e.g., a low level), the second power supply voltage signal passes through the second transistor M2 and the fifth denoising transistor Me, resetting the pull-up node PU to a second level (e.g., a low level).

When the reset terminal RST receives a signal at a second level (e.g., a low level), the second transistor M2 and the fifth denoising transistor Me are turned off. The pull-up node PU is disconnected from the second transistor M2.

Figure 17:
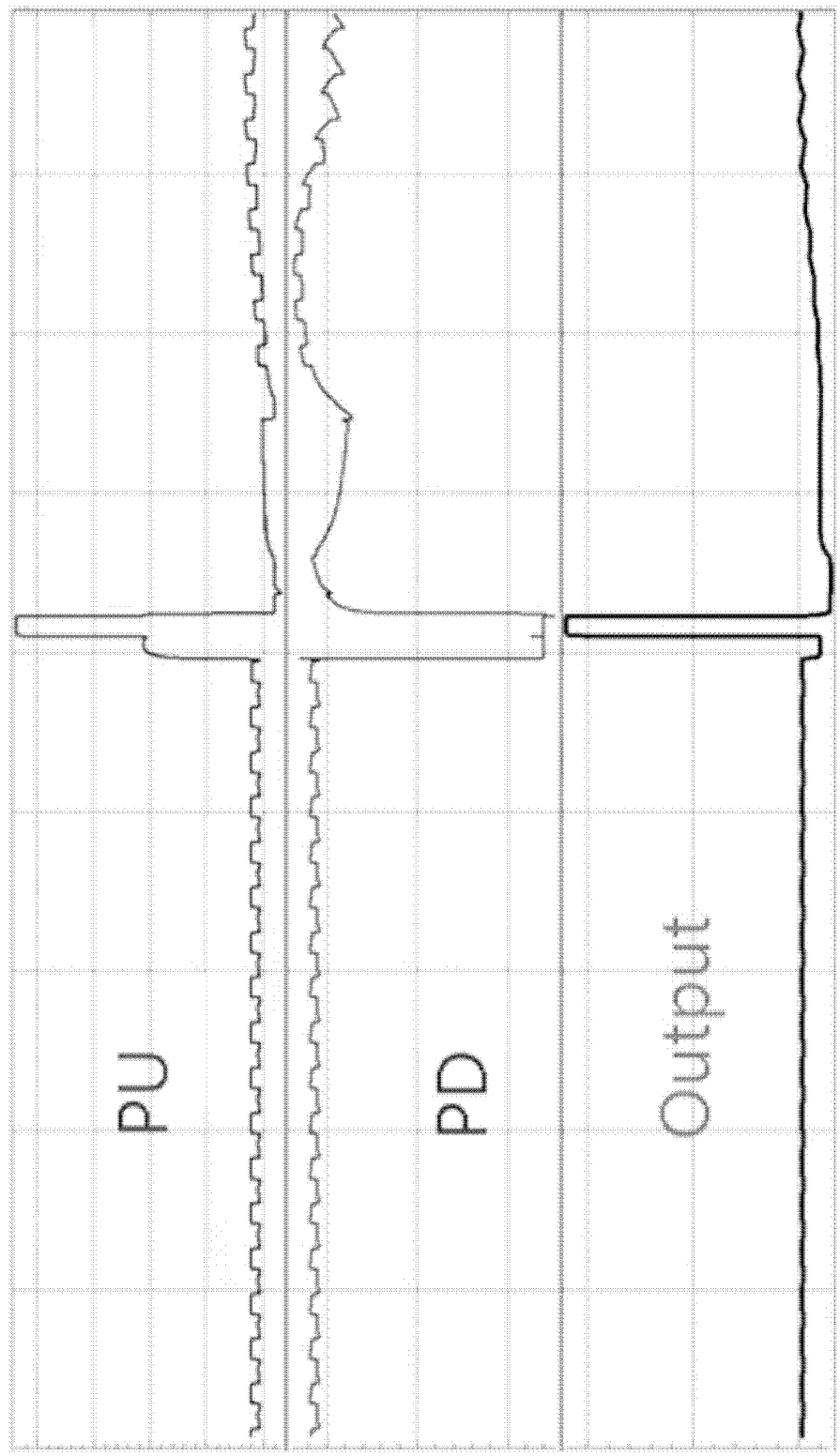
FIG. 17 shows signals in a respective scan unit in some embodiments according to the present disclosure.

By having the denoising subcircuit, the leakage of the first power supply voltage (provided to the first power supply voltage terminal VDS) to the pull-up node PU through the first transistor M1 and noise in the output signal output from the output terminal OUT can be effectively reduced or eliminated. FIG. 17 shows signals in a respective scan unit in some embodiments according to the present disclosure. FIG. 17 shows waveforms of various signals in a respective scan unit of the scan circuit, including a voltage level at the pull-up node PU, a voltage level at the pull-down node PD, and an output signal OUTPUT output from the output terminal. The leakage of the first power supply voltage to the pull-up node PU through the first transistor M1 and noise in the output signal output from the output terminal OUT are eliminated, even when the scan circuit is operated at a relatively high temperature (e.g., equal to or greater than 85 Celsius degrees). The denoising subcircuit DN is effective in reducing leakage and noise in both the forward scanning mode and the reverse scanning mode.

Referring to FIG. 7 and FIG. 9B, in some embodiments, the denoising subcircuit DN includes a fourth denoising transistor Md. In some embodiments, the fourth denoising transistor Md is coupled between the pull-up node PU and the first transistor M1 (e.g., an input transistor). A gate electrode of the fourth denoising transistor Md is coupled to the input terminal IN. A first electrode of the fourth denoising transistor Md is coupled to a second electrode of the first transistor M1. A second electrode of the fourth denoising transistor Md is coupled to the pull-up node PU.

Referring to FIG. 9B, when the input terminal IN receives a start signal SS or an output signal from an output terminal of a previous scan unit (e.g., a (n−1)-th scan unit, a (n−2)-th scan unit, or a (n−3)-th scan unit) at a first level (e.g., a high level), the first transistor M1 (e.g., an input transistor) and the fourth denoising transistor Md are turned on. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), the first power supply voltage signal passes through the first transistor M1 and the fourth denoising transistor Md, charging the pull-up node PU to a first level (e.g., a high level).

When the input terminal IN receives a signal at a second level (e.g., a low level), the first transistor M1 and the fourth denoising transistor Md are turned off. The pull-up node PU is disconnected from the first transistor M1.

When the reset terminal RST receives an output signal from a subsequent scan unit (e.g., a (n+1)-th scan unit, a (n+2)-th scan unit, or a (n+3)-th scan unit) as a reset signal at a first level (e.g., a high level), the second transistor M2 (e.g., a reset transistor) is turned on. A second power supply voltage signal provided to the second power supply voltage terminal VSD has a second level (e.g., a low level), the second power supply voltage signal passes through the second transistor M2, resetting the pull-up node PU to a second level (e.g., a low level).

When the reset terminal RST receives a signal at a second level (e.g., a low level), the second transistor M2 is turned off. The pull-up node PU is disconnected from the second transistor M2.

By having the denoising subcircuit, the leakage of the first power supply voltage (provided to the first power supply voltage terminal VDS) to the pull-up node PU through the first transistor M1 and noise in the output signal output from the output terminal OUT can be effectively reduced or eliminated.

Referring to FIG. 7 and FIG. 9C, in some embodiments, the denoising subcircuit DN includes a first denoising transistor Ma, a third denoising transistor Mc, and a fourth denoising transistor Md. In some embodiments, the first denoising transistor Ma is coupled between the input terminal IN and the third denoising transistor Mc. A gate electrode and a first electrode of the first denoising transistor Ma are coupled to the input terminal IN. A second electrode of the first denoising transistor Ma is coupled to a gate electrode of the third denoising transistor Mc.

In some embodiments, the third denoising transistor Mc is coupled between the pull-up node PU and second electrodes of the first transistor M1 and the second transistor M2. A gate electrode of the third denoising transistor Mc is coupled to a second electrode of the first denoising transistor Ma and the reset terminal RST. A first electrode of the third denoising transistor Mc is coupled to second electrodes of the first transistor M1 and the second transistor M2. A second electrode of the third denoising transistor Mc is coupled to the pull-up node PU.

In some embodiments, the fourth denoising transistor Md is coupled between the pull-up node PU and the first transistor M1 (e.g., an input transistor). A gate electrode of the fourth denoising transistor Md is coupled to the input terminal IN. A first electrode of the fourth denoising transistor Md is coupled to a second electrode of the first transistor M1. A second electrode of the fourth denoising transistor Md is coupled to the pull-up node PU.

Referring to FIG. 9C, when the input terminal IN receives a start signal SS or an output signal from an output terminal of a previous scan unit (e.g., a (n−1)-th scan unit, a (n−2)-th scan unit, or a (n−3)-th scan unit) at a first level (e.g., a high level), the first transistor M1 (e.g., an input transistor), the first denoising transistor Ma, and the third denoising transistor Mc are turned on; and the first transistor M1 (e.g., an input transistor) and the fourth denoising transistor Md are turned on. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), the first power supply voltage signal passes through the first transistor M1, the fourth denoising transistor Md, and the third denoising transistor Mc, charging the pull-up node PU to a first level (e.g., a high level).

When the input terminal IN receives a signal at a second level (e.g., a low level), the first transistor M1, the first denoising transistor Ma, the third denoising transistor Mc, and the fourth denoising transistor Md are turned off. The pull-up node PU is disconnected from the first transistor M1.

When the reset terminal RST receives an output signal from a subsequent scan unit (e.g., a (n+1)-th scan unit, a (n+2)-th scan unit, or a (n+3)-th scan unit) as a reset signal at a first level (e.g., a high level), the second transistor M2 (e.g., a reset transistor) and the third denoising transistor Mc are turned on. A second power supply voltage signal provided to the second power supply voltage terminal VSD has a second level (e.g., a low level), the second power supply voltage signal passes through the second transistor M2 and the third denoising transistor Mc, resetting the pull-up node PU to a second level (e.g., a low level).

When the reset terminal RST receives a signal at a second level (e.g., a low level), the second transistor M2 and the third denoising transistor Mc are turned off. The pull-up node PU is disconnected from the second transistor M2.

By having the denoising subcircuit, the leakage of the first power supply voltage (provided to the first power supply voltage terminal VDS) to the pull-up node PU through the first transistor M1 and noise in the output signal output from the output terminal OUT can be effectively reduced or eliminated.

Referring to FIG. 7 and FIG. 9D, in some embodiments, the denoising subcircuit DN includes a first denoising transistor Ma, a second denoising transistor Mb, a third denoising transistor Mc, a fourth denoising transistor Md, and a fifth denoising transistor Me. In some embodiments, the first denoising transistor Ma is coupled between the input terminal IN and the third denoising transistor Mc. A gate electrode and a first electrode of the first denoising transistor Ma are coupled to the input terminal IN. A second electrode of the first denoising transistor Ma is coupled to a second electrode of the second denoising transistor Mb and a gate electrode of the third denoising transistor Mc.

In some embodiments, the second denoising transistor Mb is coupled between the reset terminal RST and the third denoising transistor Mc. A gate electrode and a first electrode of the second denoising transistor Mb are coupled to the reset terminal RST. A second electrode of the second denoising transistor Mb is coupled to a second electrode of the first denoising transistor Ma and a gate electrode of the third denoising transistor Mc.

In some embodiments, the third denoising transistor Mc is coupled between the pull-up node PU and second electrodes of the first transistor M1 and the second transistor M2. A gate electrode of the third denoising transistor Mc is coupled to second electrodes of the first denoising transistor Ma and the second denoising transistor Mb. A first electrode of the third denoising transistor Mc is coupled to second electrodes of the first transistor M1 and the second transistor M2. A second electrode of the third denoising transistor Mc is coupled to the pull-up node PU.

In some embodiments, the fourth denoising transistor Md is coupled between the pull-up node PU and the first transistor M1 (e.g., an input transistor). A gate electrode of the fourth denoising transistor Md is coupled to the input terminal IN. A first electrode of the fourth denoising transistor Md is coupled to a second electrode of the first transistor M1. A second electrode of the fourth denoising transistor Md is coupled to the pull-up node PU.

In some embodiments, the fifth denoising transistor Me is coupled between the pull-up node PU and the second transistor M2 (e.g., a reset transistor). A gate electrode of the fifth denoising transistor Me is coupled to the reset terminal RST. A first electrode of the fifth denoising transistor Me is coupled to a second electrode of the second transistor M2. A second electrode of the fifth denoising transistor Me is coupled to the pull-up node PU.

Referring to FIG. 9D, when the input terminal IN receives a start signal SS or an output signal from an output terminal of a previous scan unit (e.g., a (n−1)-th scan unit, a (n−2)-th scan unit, or a (n−3)-th scan unit) at a first level (e.g., a high level), the first transistor M1 (e.g., an input transistor), the first denoising transistor Ma, the third denoising transistor Mc, and the fourth denoising transistor Md are turned on. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), the first power supply voltage signal passes through the first transistor M1, the fourth denoising transistor Md, and the third denoising transistor Mc, charging the pull-up node PU to a first level (e.g., a high level).

When the input terminal IN receives a signal at a second level (e.g., a low level), the first transistor M1, the first denoising transistor Ma, the fourth denoising transistor Md, and the third denoising transistor Mc are turned off. The pull-up node PU is disconnected from the first transistor M1.

When the reset terminal RST receives an output signal from a subsequent scan unit (e.g., a (n+1)-th scan unit, a (n+2)-th scan unit, or a (n+3)-th scan unit) as a reset signal at a first level (e.g., a high level), the second transistor M2 (e.g., a reset transistor), the fifth denoising transistor Me, the second denoising transistor Mb, and the third denoising transistor Mc are turned on. A second power supply voltage signal provided to the second power supply voltage terminal VSD has a second level (e.g., a low level), the second power supply voltage signal passes through the second transistor M2, the fifth denoising transistor Me, and the third denoising transistor Mc, resetting the pull-up node PU to a second level (e.g., a low level).

When the reset terminal RST receives a signal at a second level (e.g., a low level), the second transistor M2, the second denoising transistor Mb, the fifth denoising transistor Me, and the third denoising transistor Mc are turned off. The pull-up node PU is disconnected from the second transistor M2.

By having the denoising subcircuit, the leakage of the first power supply voltage (provided to the first power supply voltage terminal VDS) to the pull-up node PU through the first transistor M1 and noise in the output signal output from the output terminal OUT can be effectively reduced or eliminated.

Referring to FIG. 10, FIG. 11, FIG. 12, FIG. 13, FIG. 14, and FIG. 15, in some embodiments, the denoising subcircuit DN is coupled between a third power supply voltage terminal VGL and the output terminal OUT or the pull-up node PU. The third power supply voltage terminal VGL is configured to provide a third power supply voltage signal at a second level (e.g., a low level). The denoising subcircuit DN is controlled by a potential level at a pull-down control node PD_CN to pull down the potential level at the output terminal OUT or the pull-up node PU based on the potential level at the pull-down control node PD_CN. The potential level at the pull-down control node PD_CN is at a first level (e.g., a high level) when or subsequent to the pull-up node PU is reset to a second level (e.g., a low level) in a frame of image.

Referring to FIG. 10 and FIG. 11, in some embodiments, the denoising subcircuit DN is coupled to the pull-up node PU and the third power supply voltage terminal VGL. The denoising subcircuit DN is configured to control connection or disconnection between the pull-up node PU and the third power supply voltage terminal VGL. By having the denoising subcircuit DN, the leakage of the first power supply voltage to the pull-up node PU through the first transistor M1 can be reset by the denoising subcircuit DN, thereby effectively reducing or eliminating the leakage of the first power supply voltage to the pull-up node PU and the noise in the output signal output from the output terminal OUT.

Referring to FIG. 10 and FIG. 11, in some embodiments, the denoising subcircuit DN includes a sixth denoising transistor Mf. In some embodiments, the sixth denoising transistor Mf is coupled between the pull-up node PU and the third power supply voltage terminal VGL. A gate electrode of the sixth denoising transistor Mf is coupled to the pull-down control node PD_CN. A first electrode of the sixth denoising transistor Mf is coupled to the third power supply voltage terminal VGL. A second electrode of the sixth denoising transistor Mf is coupled to the pull-up node PU. The present disclosure provides the sixth denoising transistor Mf for denoising the pull-up node PU, in combination with the second sub-circuit SC2. In one example, the respective scan unit includes only one of the second sub-circuit SC2, simplifying the scan circuit and saving bezel space. This structure is conducive for making wearable apparatus. In another example, the respective scan unit includes duplicate or multiple of the second sub-circuit SC2. Multiple of the second sub-circuit SC2 are capable of alternatively denoising the pull-up node PU, thereby enhancing the life time of the scan circuit.

Referring to FIG. 11, when the potential level at the pull-down control node PD_CN is a first level (e.g., a high level), the sixth denoising transistor Mf is turned on. The third power supply voltage signal (which is a low voltage signal) passes through the sixth denoising transistor Mf, resetting the pull-up node PU.

Figure 18:
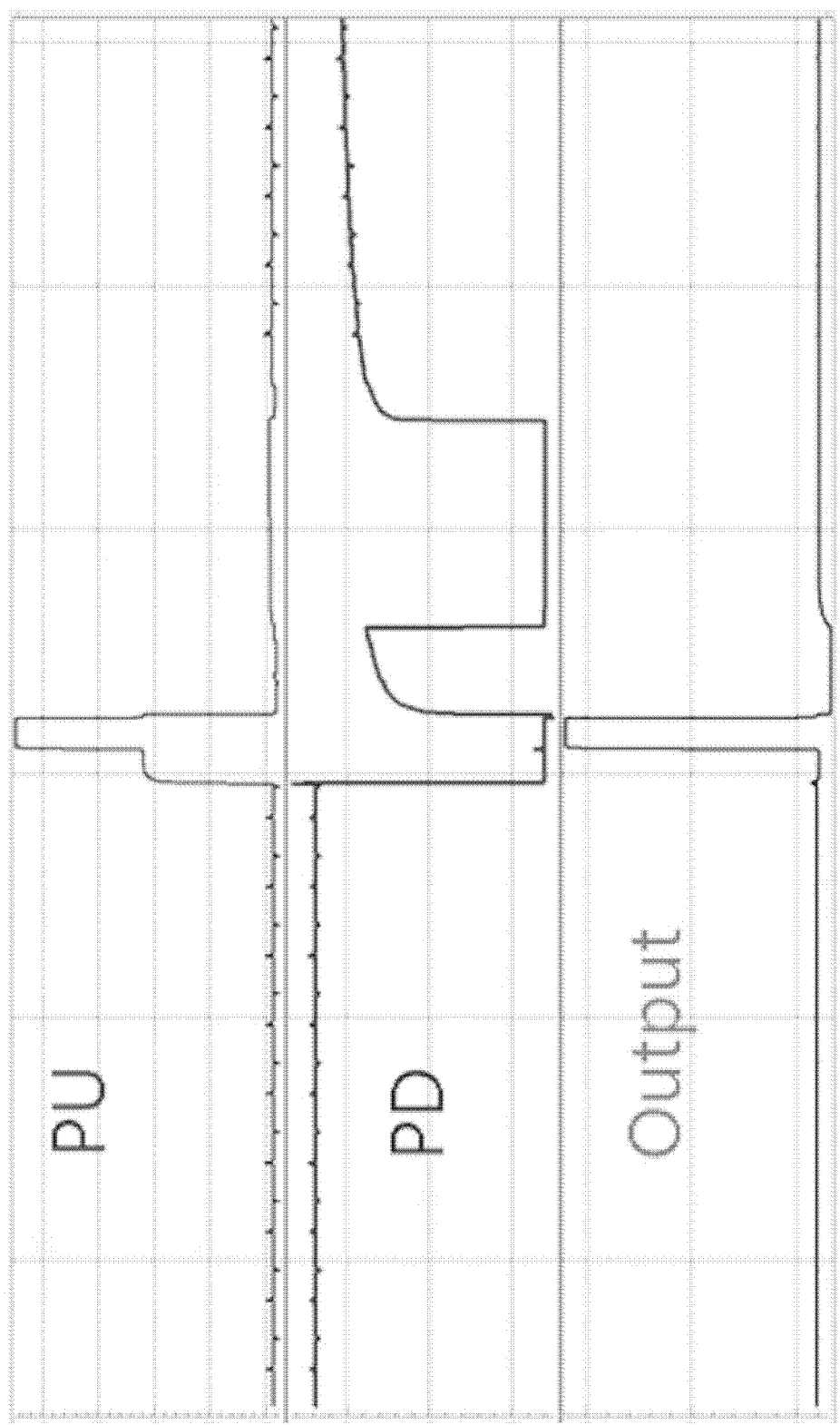
FIG. 18 shows signals in a respective scan unit in some embodiments according to the present disclosure.

By having the denoising subcircuit, the leakage of the first power supply voltage (provided to the first power supply voltage terminal VDS) to the pull-up node PU through the first transistor M1 can be effectively reset by the third power supply voltage signal, and the noise in the output signal output from the output terminal OUT can be effectively reduced or eliminated. FIG. 18 shows signals in a respective scan unit in some embodiments according to the present disclosure. FIG. 18 shows waveforms of various signals in a respective scan unit of the scan circuit, including a voltage level at the pull-up node PU, a voltage level at the pull-down node PD, and an output signal OUTPUT output from the output terminal. The leakage of the first power supply voltage to the pull-up node PU through the first transistor M1 and noise in the output signal output from the output terminal OUT are eliminated, even when the scan circuit is operated at a relatively high temperature (e.g., equal to or greater than 85 Celsius degrees).

Referring to FIG. 12 and FIG. 13, in some embodiments, the denoising subcircuit DN is coupled to the output terminal OUT and the third power supply voltage terminal VGL. The denoising subcircuit DN is configured to control connection or disconnection between the output terminal OUT and the third power supply voltage terminal VGL. By having the denoising subcircuit DN, the noise at the output terminal OUT can be reset by the denoising subcircuit DN, thereby effectively reducing or eliminating the noise in the output signal output from the output terminal OUT.

Referring to FIG. 12 and FIG. 13, in some embodiments, the denoising subcircuit DN includes a seventh denoising transistor Mg. In some embodiments, the seventh denoising transistor Mg is coupled between the output terminal OUT and the third power supply voltage terminal VGL. A gate electrode of the seventh denoising transistor Mg is coupled to the pull-down control node PD_CN. A first electrode of the seventh denoising transistor Mg is coupled to the third power supply voltage terminal VGL. A second electrode of the seventh denoising transistor Mg is coupled to the output terminal OUT.

Referring to FIG. 13, when the potential level at the pull-down control node PD_CN is a first level (e.g., a high level), the seventh denoising transistor Mg is turned on. The third power supply voltage signal (which is a low voltage signal) passes through the seventh denoising transistor Mg denoising the output terminal OUT.

Figure 19:
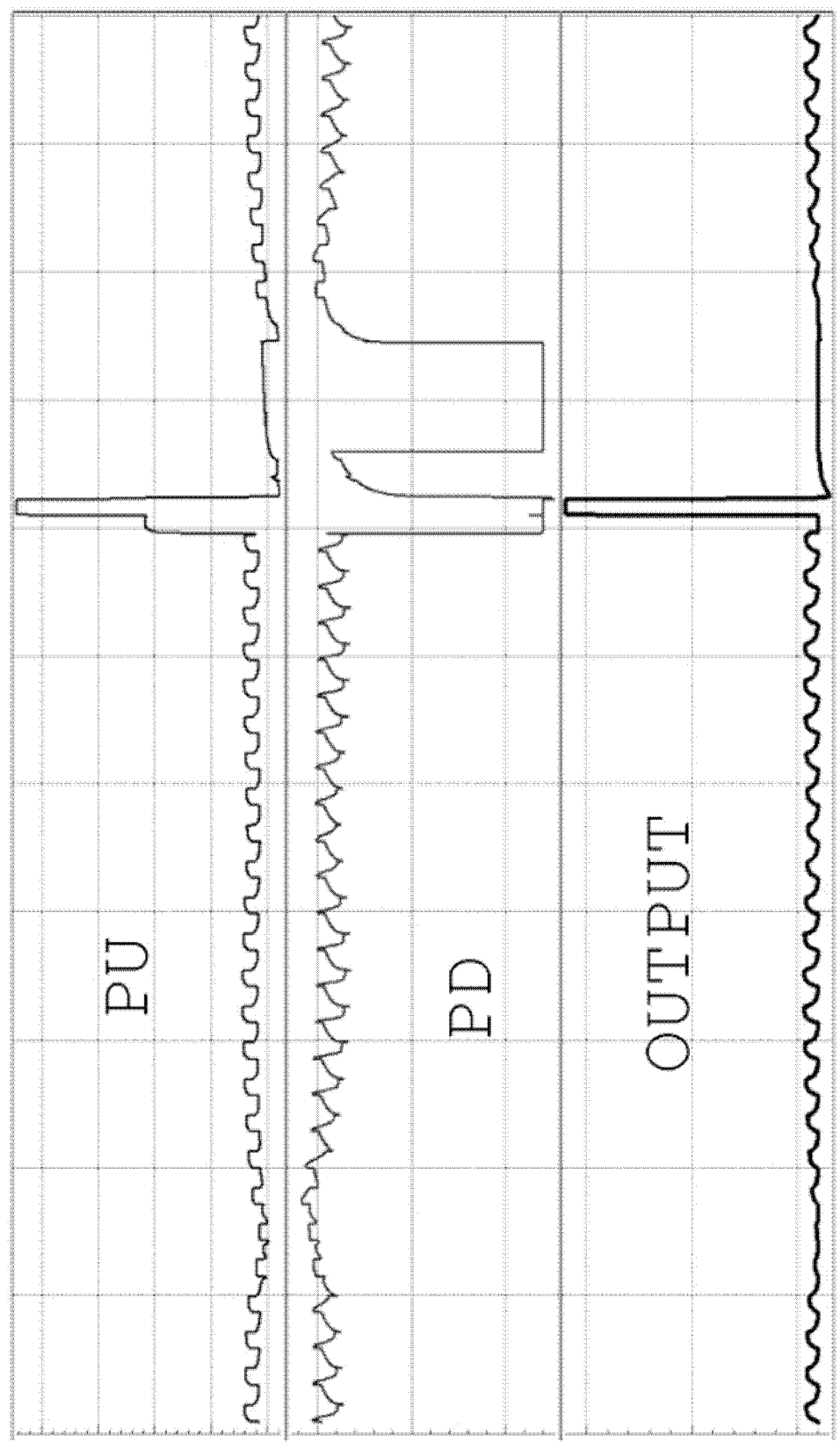
FIG. 19 shows signals in a respective scan unit in some embodiments according to the present disclosure.

By having the denoising subcircuit, the noise in the output signal output from the output terminal OUT can be effectively reduced or eliminated. FIG. 19 shows signals in a respective scan unit in some embodiments according to the present disclosure. FIG. 19 shows waveforms of various signals in a respective scan unit of the scan circuit, including a voltage level at the pull-up node PU, a voltage level at the pull-down node PD, and an output signal OUTPUT output from the output terminal. The noise in the output signal output from the output terminal OUT are eliminated, even when the scan circuit is operated at a relatively high temperature (e.g., equal to or greater than 85 Celsius degrees).

Referring to FIG. 14 and FIG. 15, in some embodiments, the denoising subcircuit DN is coupled to the pull-up node PU, the output terminal OUT, and the third power supply voltage terminal VGL. The denoising subcircuit DN is configured to control connection or disconnection between the pull-up node PU and the third power supply voltage terminal VGL, and control connection or disconnection between the output terminal OUT and the third power supply voltage terminal VGL. By having the denoising subcircuit DN, the leakage of the first power supply voltage to the pull-up node PU through the first transistor M1 can be reset by the denoising subcircuit DN, the noise at the output terminal OUT can be reset by the denoising subcircuit DN, thereby effectively reducing or eliminating the leakage of the first power supply voltage to the pull-up node PU and the noise in the output signal output from the output terminal OUT.

Referring to FIG. 14 and FIG. 15, in some embodiments, the denoising subcircuit DN includes a sixth denoising transistor Mf and a seventh denoising transistor Mg. In some embodiments, the sixth denoising transistor Mf is coupled between the pull-up node PU and the third power supply voltage terminal VGL. A gate electrode of the sixth denoising transistor Mf is coupled to the pull-down control node PD_CN. A first electrode of the sixth denoising transistor Mf is coupled to the third power supply voltage terminal VGL.

A second electrode of the sixth denoising transistor Mf is coupled to the pull-up node PU.

In some embodiments, the seventh denoising transistor Mg is coupled between the output terminal OUT and the third power supply voltage terminal VGL. A gate electrode of the seventh denoising transistor Mg is coupled to the pull-down control node PD_CN. A first electrode of the seventh denoising transistor Mg is coupled to the third power supply voltage terminal VGL. A second electrode of the seventh denoising transistor Mg is coupled to the output terminal OUT.

Referring to FIG. 15, when the potential level at the pull-down control node PD_CN is a first level (e.g., a high level), the sixth denoising transistor Mf is turned on. The third power supply voltage signal (which is a low voltage signal) passes through the sixth denoising transistor Mf, resetting the pull-up node PU. When the potential level at the pull-down control node PD_CN is a first level (e.g., a high level), the seventh denoising transistor Mg is turned on. The third power supply voltage signal (which is a low voltage signal) passes through the seventh denoising transistor Mg denoising the output terminal OUT.

By having the denoising subcircuit, the leakage of the first power supply voltage (provided to the first power supply voltage terminal VDS) to the pull-up node PU through the first transistor M1 can be effectively reset by the third power supply voltage signal, and the noise in the output signal output from the output terminal OUT can be effectively reduced or eliminated.

Various appropriate implementations may be practiced to combine any two or more denoising subcircuits depicted in FIG. 7 to FIG. 15. For example, the denoising subcircuit depicted in FIG. 8A or FIG. 8B may be combined with any one or more of the denoising subcircuits depicted in FIG. 9A, FIG. 9B, FIG. 11, or FIG. 15. In another example, the denoising subcircuit depicted in FIG. 9A or FIG. 9B may be combined with any one or more of the denoising subcircuits depicted in FIG. 8A, FIG. 8B, FIG. 11, or FIG. 15. In another example, the denoising subcircuit depicted in FIG. 11 may be combined with any one or more of the denoising subcircuits depicted in FIG. 8A, FIG. 8B, FIG. 9A, FIG. 9B, or FIG. 15. In another example, the denoising subcircuit depicted in FIG. 13 may be combined with any one or more of the denoising subcircuits depicted in FIG. 9A, FIG. 9B, FIG. 11, or FIG. 15. The inventors of the present disclosure discover that the following problem can be solved by combining various denoising subcircuits described herein: the leakage from the first transistor M1 (e.g., an input transistor) to the pull-up node PU due to the negative drift of the threshold voltage of the first transistor M1 during the high temperature reliability causes the erroneous output of the gate driving circuit.

Figure 20:
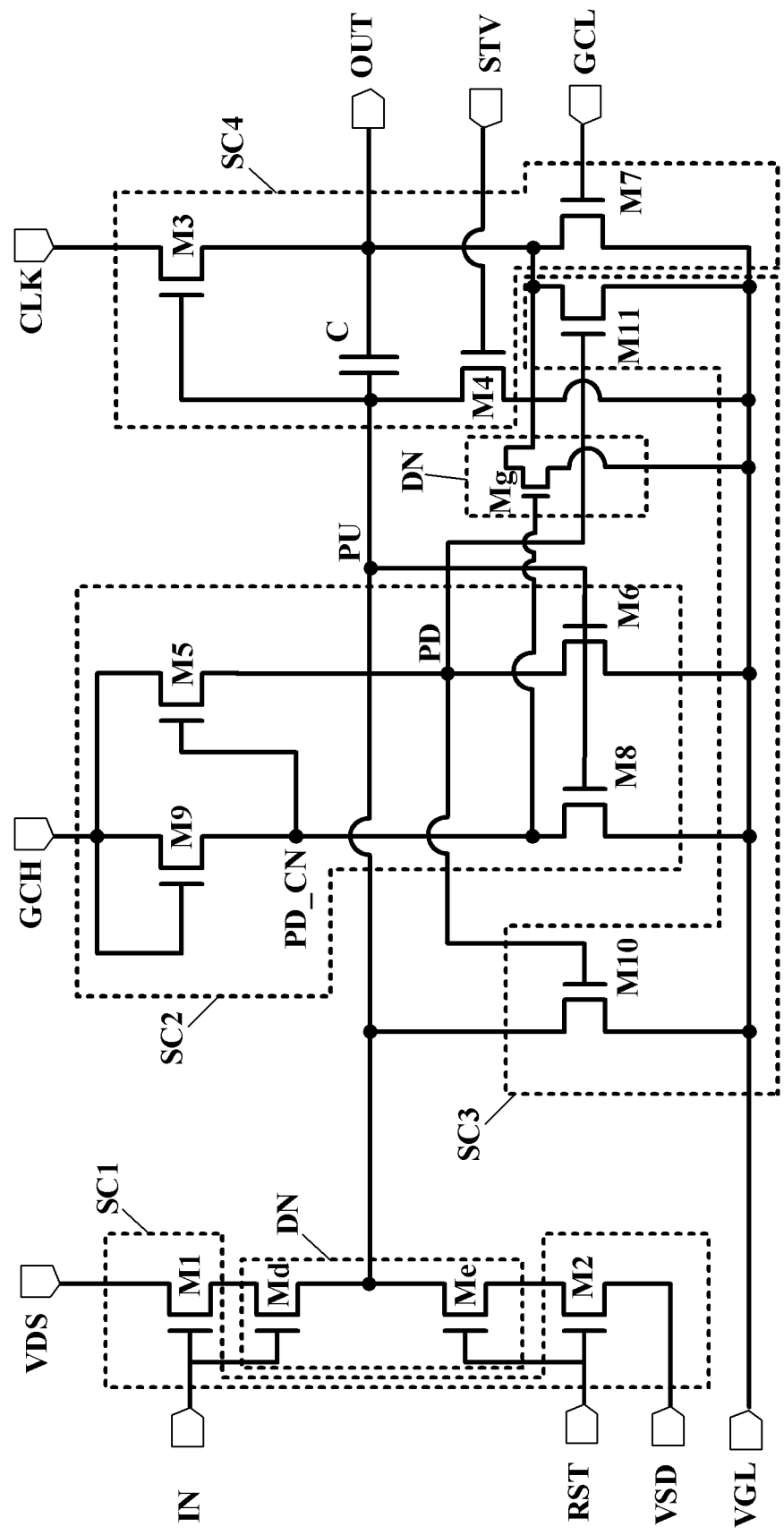
FIG. 20 is a circuit diagram of a respective scan unit in some embodiments according to the present disclosure.

FIG. 20 is a circuit diagram of a respective scan unit in some embodiments according to the present disclosure. Referring to FIG. 20, the denoising subcircuit DN in some embodiments includes a fourth denoising transistor Md, a fifth denoising transistor Me, and a seventh denoising transistor Mg. In some embodiments, the fourth denoising transistor Md is coupled between the pull-up node PU and the first transistor M1 (e.g., an input transistor). A gate electrode of the fourth denoising transistor Md is coupled to the input terminal IN. A first electrode of the fourth denoising transistor Md is coupled to a second electrode of the first transistor M1. A second electrode of the fourth denoising transistor Md is coupled to the pull-up node PU. In some embodiments, the fifth denoising transistor Me is coupled between the pull-up node PU and the second transistor M2 (e.g., a reset transistor). A gate electrode of the fifth denoising transistor Me is coupled to the reset terminal RST. A first electrode of the fifth denoising transistor Me is coupled to a second electrode of the second transistor M2. A second electrode of the fifth denoising transistor Me is coupled to the pull-up node PU. In some embodiments, the seventh denoising transistor Mg is coupled between the output terminal OUT and the third power supply voltage terminal VGL. A gate electrode of the seventh denoising transistor Mg is coupled to the pull-down control node PD_CN. A first electrode of the seventh denoising transistor Mg is coupled to the third power supply voltage terminal VGL. A second electrode of the seventh denoising transistor Mg is coupled to the output terminal OUT.

Referring to FIG. 20, when the input terminal IN receives a start signal SS or an output signal from an output terminal of a previous scan unit (e.g., a (n−1)-th scan unit, a (n−2)-th scan unit, or a (n−3)-th scan unit) at a first level (e.g., a high level), the first transistor M1 (e.g., an input transistor) and the fourth denoising transistor Md are turned on. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), the first power supply voltage signal passes through the first transistor M1 and the fourth denoising transistor Md, charging the pull-up node PU to a first level (e.g., a high level).

When the input terminal IN receives a signal at a second level (e.g., a low level), the first transistor M1 and the fourth denoising transistor Md are turned off. The pull-up node PU is disconnected from the first transistor M1.

When the reset terminal RST receives an output signal from a subsequent scan unit (e.g., a (n+1)-th scan unit, a (n+2)-th scan unit, or a (n+3)-th scan unit) as a reset signal at a first level (e.g., a high level), the second transistor M2 (e.g., a reset transistor) and the fifth denoising transistor Me are turned on. A second power supply voltage signal provided to the second power supply voltage terminal VSD has a second level (e.g., a low level), the second power supply voltage signal passes through the second transistor M2 and the fifth denoising transistor Me, resetting the pull-up node PU to a second level (e.g., a low level).

When the reset terminal RST receives a signal at a second level (e.g., a low level), the second transistor M2 and the fifth denoising transistor Me are turned off. The pull-up node PU is disconnected from the second transistor M2.

When the potential level at the pull-down control node PD_CN is a first level (e.g., a high level), the seventh denoising transistor Mg is turned on. The third power supply voltage signal (which is a low voltage signal) passes through the seventh denoising transistor Mg denoising the output terminal OUT.

By having the denoising subcircuit, the leakage of the first power supply voltage (provided to the first power supply voltage terminal VDS) to the pull-up node PU through the first transistor M1 and noise in the output signal output from the output terminal OUT can be effectively reduced or eliminated.

Figure 21:
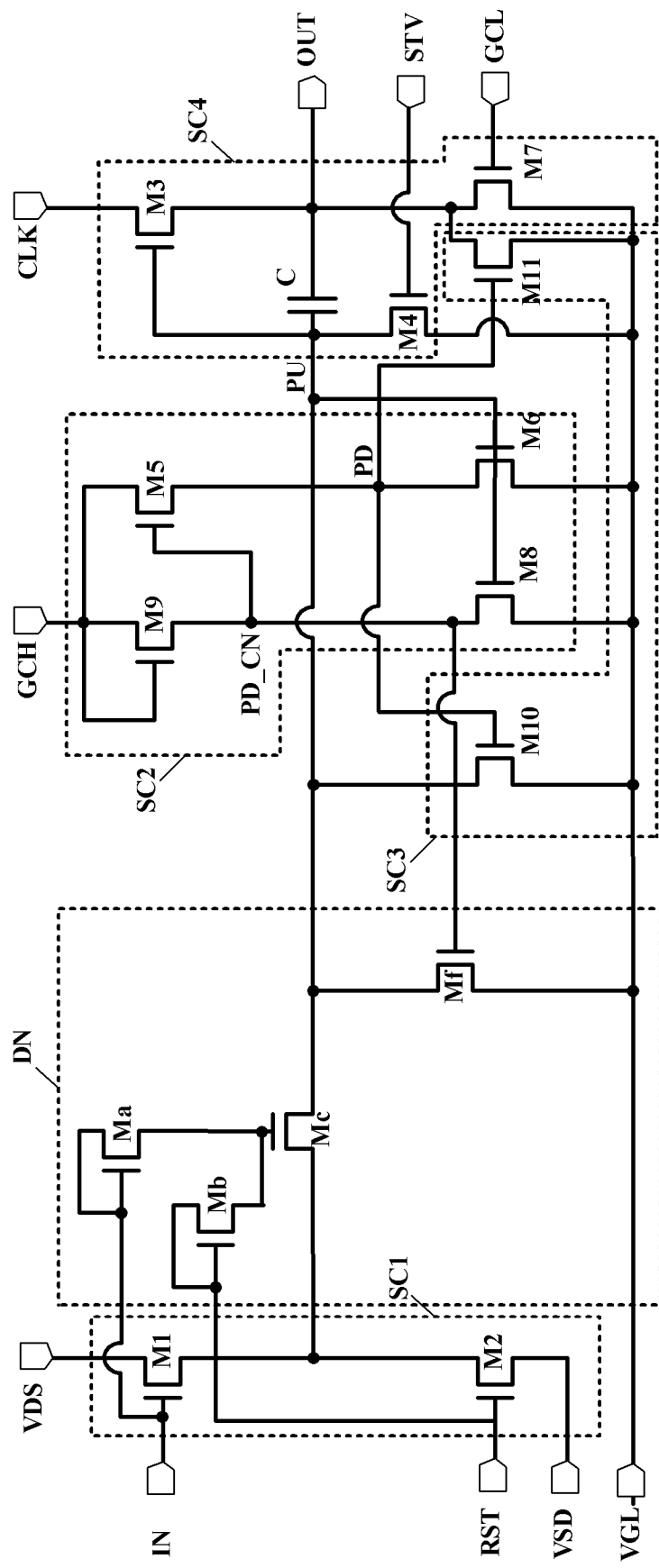
FIG. 21 is a circuit diagram of a respective scan unit in some embodiments according to the present disclosure.

FIG. 21 is a circuit diagram of a respective scan unit in some embodiments according to the present disclosure. Referring to FIG. 21, in some embodiments, the denoising subcircuit DN includes a first denoising transistor Ma, a second denoising transistor Mb, a third denoising transistor Mc, and a sixth denoising transistor Mf. In some embodiments, the first denoising transistor Ma is coupled between the input terminal IN and the third denoising transistor Mc. A gate electrode and a first electrode of the first denoising transistor Ma are coupled to the input terminal IN. A second electrode of the first denoising transistor Ma is coupled to a second electrode of the second denoising transistor Mb and a gate electrode of the third denoising transistor Mc. In some embodiments, the second denoising transistor Mb is coupled between the reset terminal RST and the third denoising transistor Mc. A gate electrode and a first electrode of the second denoising transistor Mb are coupled to the reset terminal RST. A second electrode of the second denoising transistor Mb is coupled to a second electrode of the first denoising transistor Ma and a gate electrode of the third denoising transistor Mc. In some embodiments, the third denoising transistor Mc is coupled between the pull-up node PU and second electrodes of the first transistor M1 and the second transistor M2. A gate electrode of the third denoising transistor Mc is coupled to second electrodes of the first denoising transistor Ma and the second denoising transistor Mb. A first electrode of the third denoising transistor Mc is coupled to second electrodes of the first transistor M1 and the second transistor M2. In some embodiments, the sixth denoising transistor Mf is coupled between the pull-up node PU and the third power supply voltage terminal VGL. A gate electrode of the sixth denoising transistor Mf is coupled to the pull-down control node PD_CN. A first electrode of the sixth denoising transistor Mf is coupled to the third power supply voltage terminal VGL. A second electrode of the sixth denoising transistor Mf is coupled to the pull-up node PU.

Referring to FIG. 21, when the input terminal IN receives a start signal SS or an output signal from an output terminal of a previous scan unit (e.g., a (n−1)-th scan unit, a (n−2)-th scan unit, or a (n−3)-th scan unit) at a first level (e.g., a high level), the first transistor M1 (e.g., an input transistor), the first denoising transistor Ma, and the third denoising transistor Mc are turned on. An output signal from the output terminal of a subsequent scan unit provided to the reset terminal RST has a second level (e.g., a low level), thereby turning off the second transistor M2. A first power supply voltage signal provided to the first power supply voltage signal terminal VDS has a first level (e.g., a high level), the first power supply voltage signal passes through the first transistor M1 and the third denoising transistor Mc, charging the pull-up node PU to a first level (e.g., a high level).

When the input terminal IN receives a signal at a second level (e.g., a low level), the first transistor M1, the first denoising transistor Ma, and the third denoising transistor Mc are turned off. The pull-up node PU is disconnected from the first transistor M1.

When the reset terminal RST receives an output signal from a subsequent scan unit (e.g., a (n+1)-th scan unit, a (n+2)-th scan unit, or a (n+3)-th scan unit) as a reset signal at a first level (e.g., a high level), the second transistor M2 (e.g., a reset transistor), the second denoising transistor Mb, and the third denoising transistor Mc are turned on. A second power supply voltage signal provided to the second power supply voltage terminal VSD has a second level (e.g., a low level), the second power supply voltage signal passes through the second transistor M2 and the third denoising transistor Mc, resetting the pull-up node PU to a second level (e.g., a low level).

When the reset terminal RST receives a signal at a second level (e.g., a low level), the second transistor M2, the second denoising transistor Mb, and the third denoising transistor Mc are turned off. The pull-up node PU is disconnected from the second transistor M2.

When the potential level at the pull-down control node PD_CN is a first level (e.g., a high level), the sixth denoising transistor Mf is turned on. The third power supply voltage signal (which is a low voltage signal) passes through the sixth denoising transistor Mf, resetting the pull-up node PU.

By having the denoising subcircuit, the leakage of the first power supply voltage (provided to the first power supply voltage terminal VDS) to the pull-up node PU through the first transistor M1 and noise in the output signal output from the output terminal OUT can be effectively reduced or eliminated.

Figure 22:
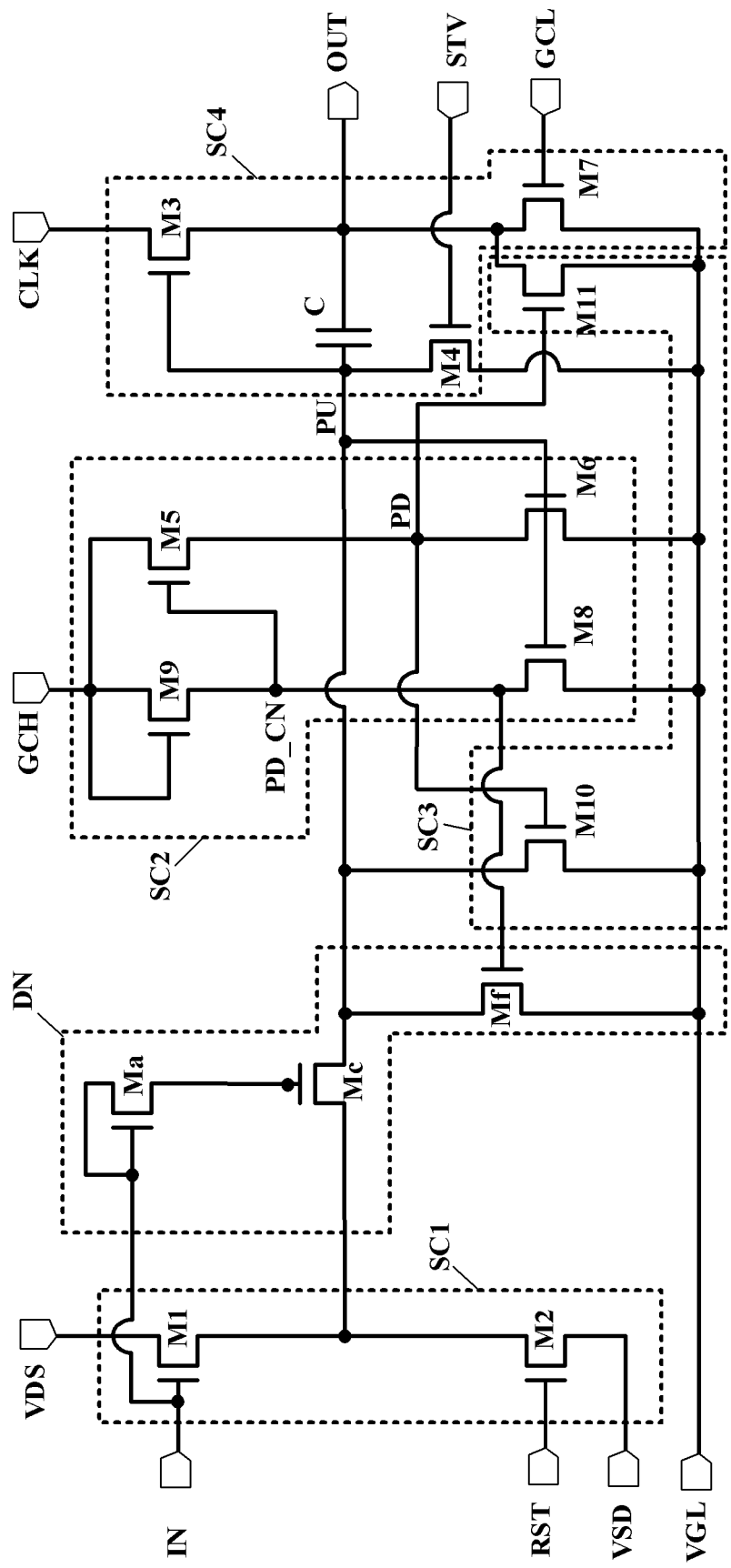
FIG. 22 is a circuit diagram of a respective scan unit in some embodiments according to the present disclosure.

Various other implementations may be practiced to combine any two or more denoising subcircuits depicted in FIG. 7 to FIG. 15. FIG. 22 is a circuit diagram of a respective scan unit in some embodiments according to the present disclosure. FIG. 22 illustrates an implementation in which the denoising subcircuits depicted in FIG. 8B and FIG. 11 are combined.

Figure 23:
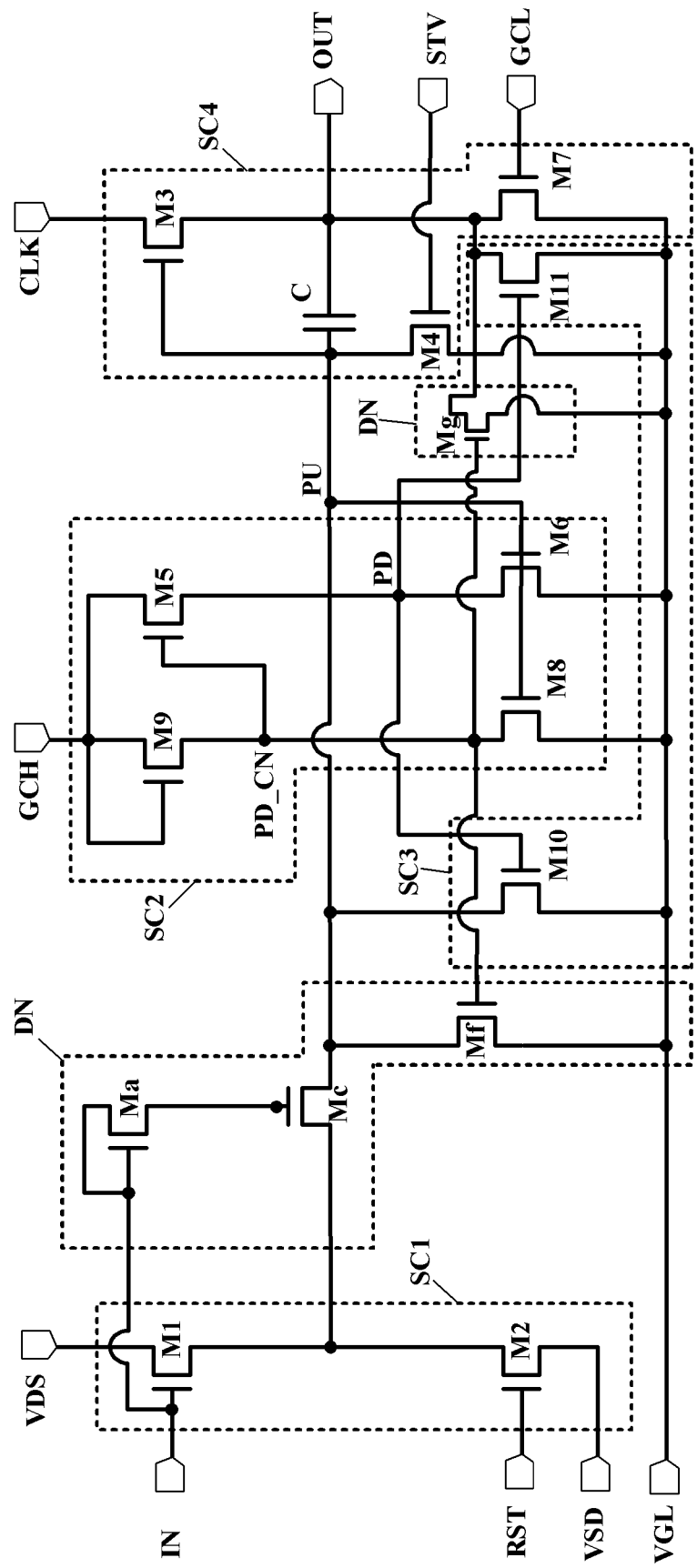
FIG. 23 is a circuit diagram of a respective scan unit in some embodiments according to the present disclosure.

FIG. 23 is a circuit diagram of a respective scan unit in some embodiments according to the present disclosure. FIG. 23 illustrates an implementation in which the denoising subcircuits depicted in FIG. 8B and FIG. 15 are combined. By having the denoising subcircuit depicted in FIG. 23, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 24:
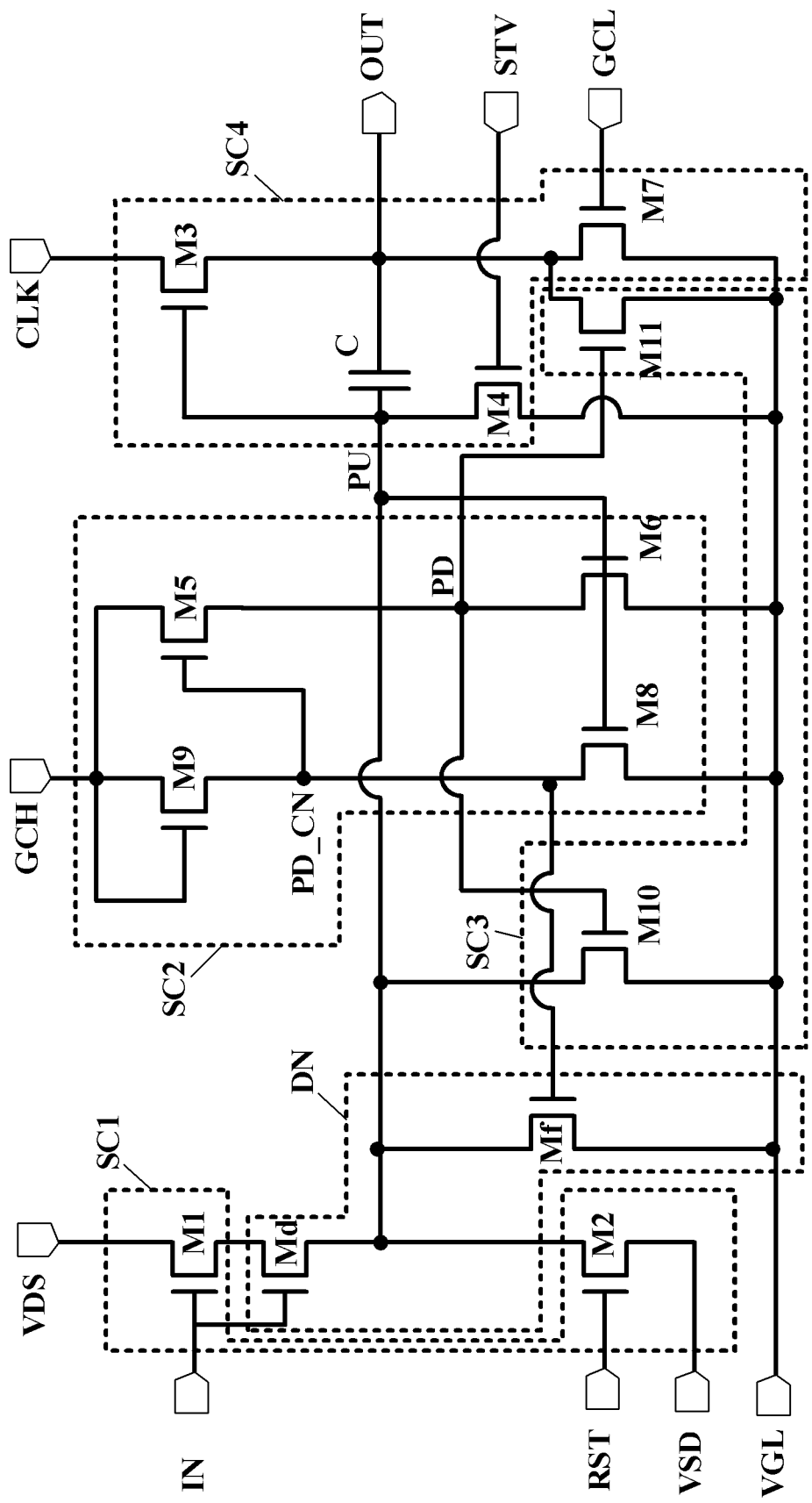
FIG. 24 is a circuit diagram of a respective scan unit in some embodiments according to the present disclosure.

FIG. 24 is a circuit diagram of a respective scan unit in some embodiments according to the present disclosure. FIG. 24 illustrates an implementation in which the denoising subcircuits depicted in FIG. 9B and FIG. 11 are combined. By having the denoising subcircuit depicted in FIG. 24, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 25:
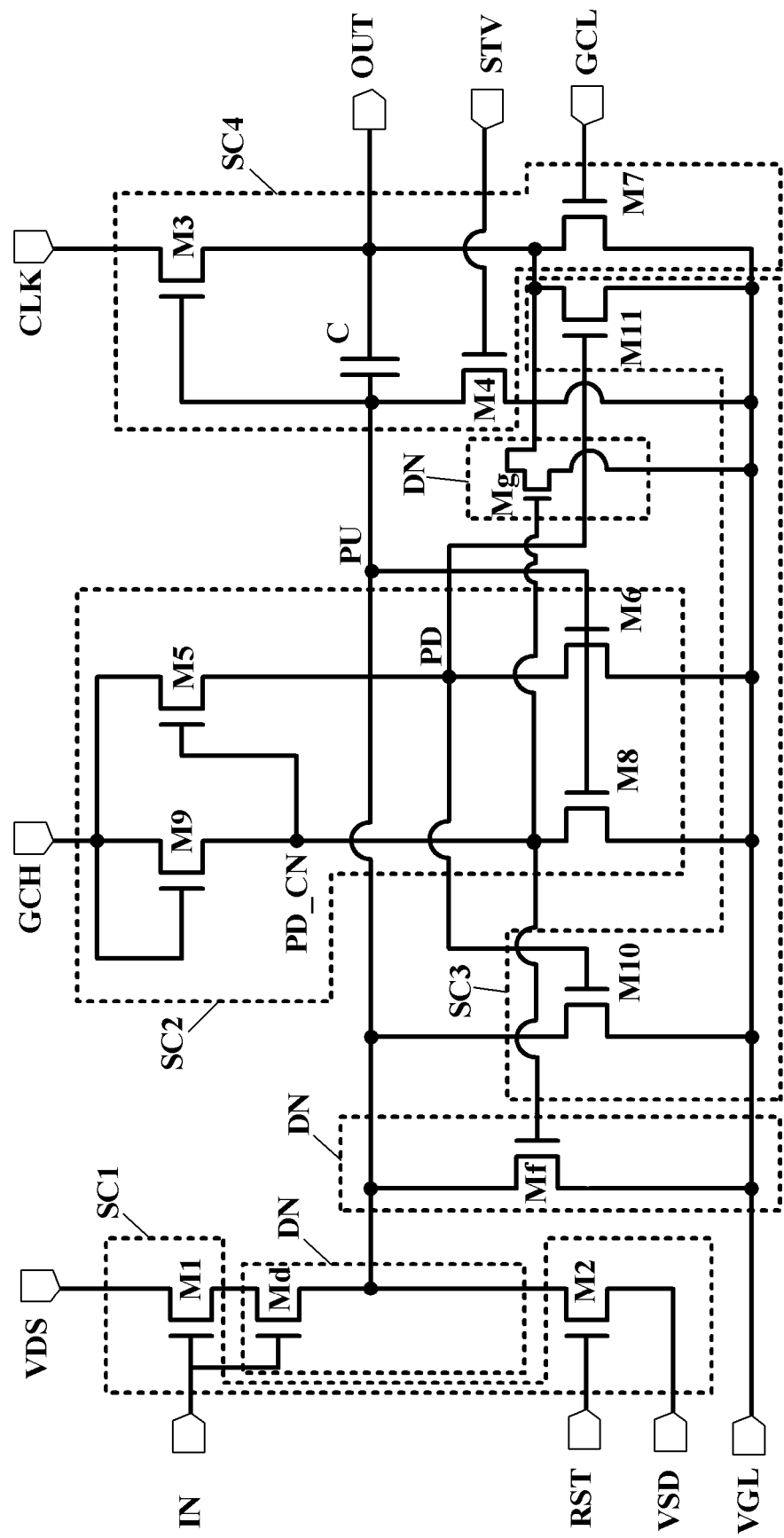
FIG. 25 is a circuit diagram of a respective scan unit in some embodiments according to the present disclosure.

FIG. 25 is a circuit diagram of a respective scan unit in some embodiments according to the present disclosure. FIG. 25 illustrates an implementation in which the denoising subcircuits depicted in FIG. 9B and FIG. 15 are combined. By having the denoising subcircuit depicted in FIG. 25, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 26:
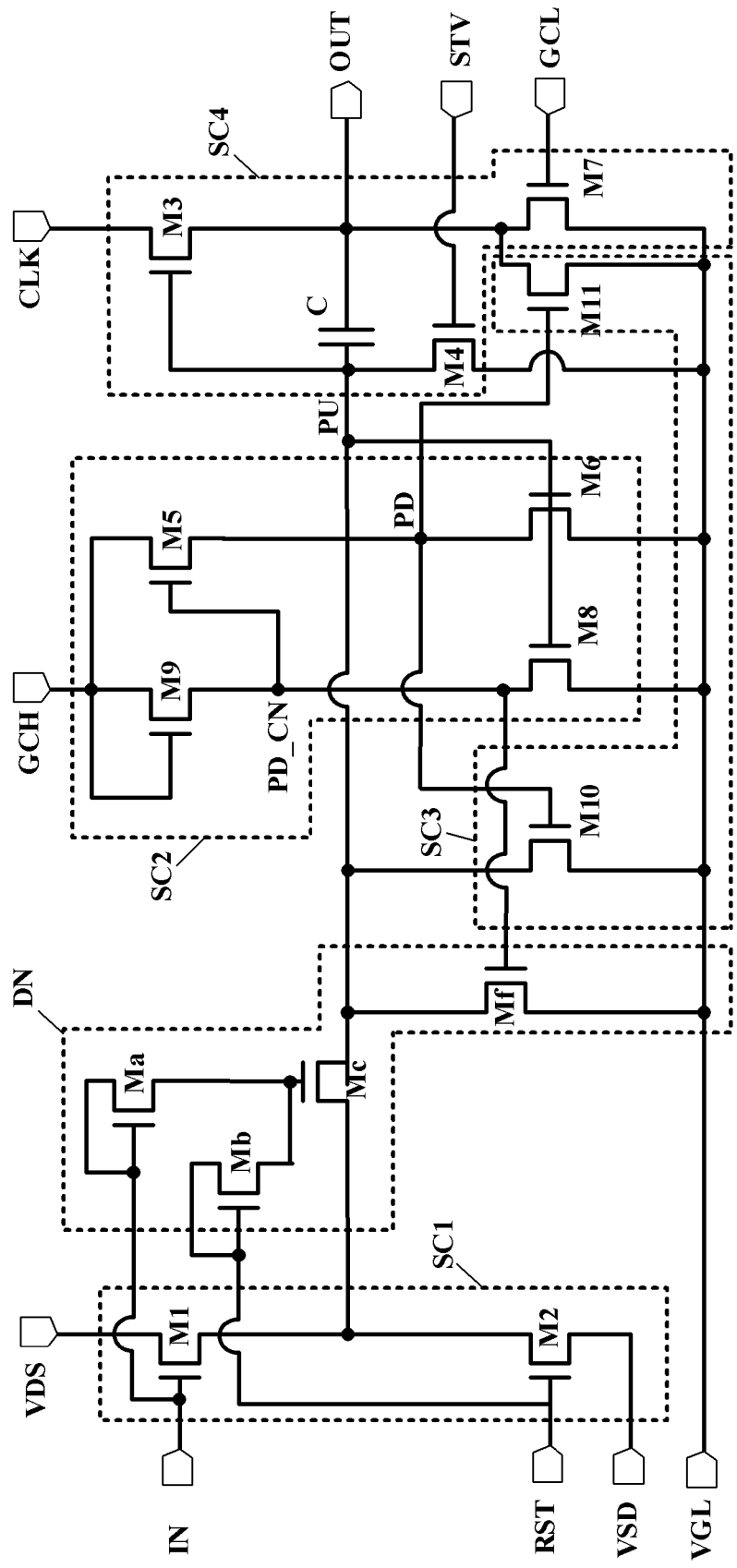
FIG. 26 is a circuit diagram of a respective scan unit in some embodiments according to the present disclosure.

FIG. 26 is a circuit diagram of a respective scan unit in some embodiments according to the present disclosure. FIG. 26 illustrates an implementation in which the denoising subcircuits depicted in FIG. 8A and FIG. 11 are combined. By having the denoising subcircuit depicted in FIG. 26, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 27:
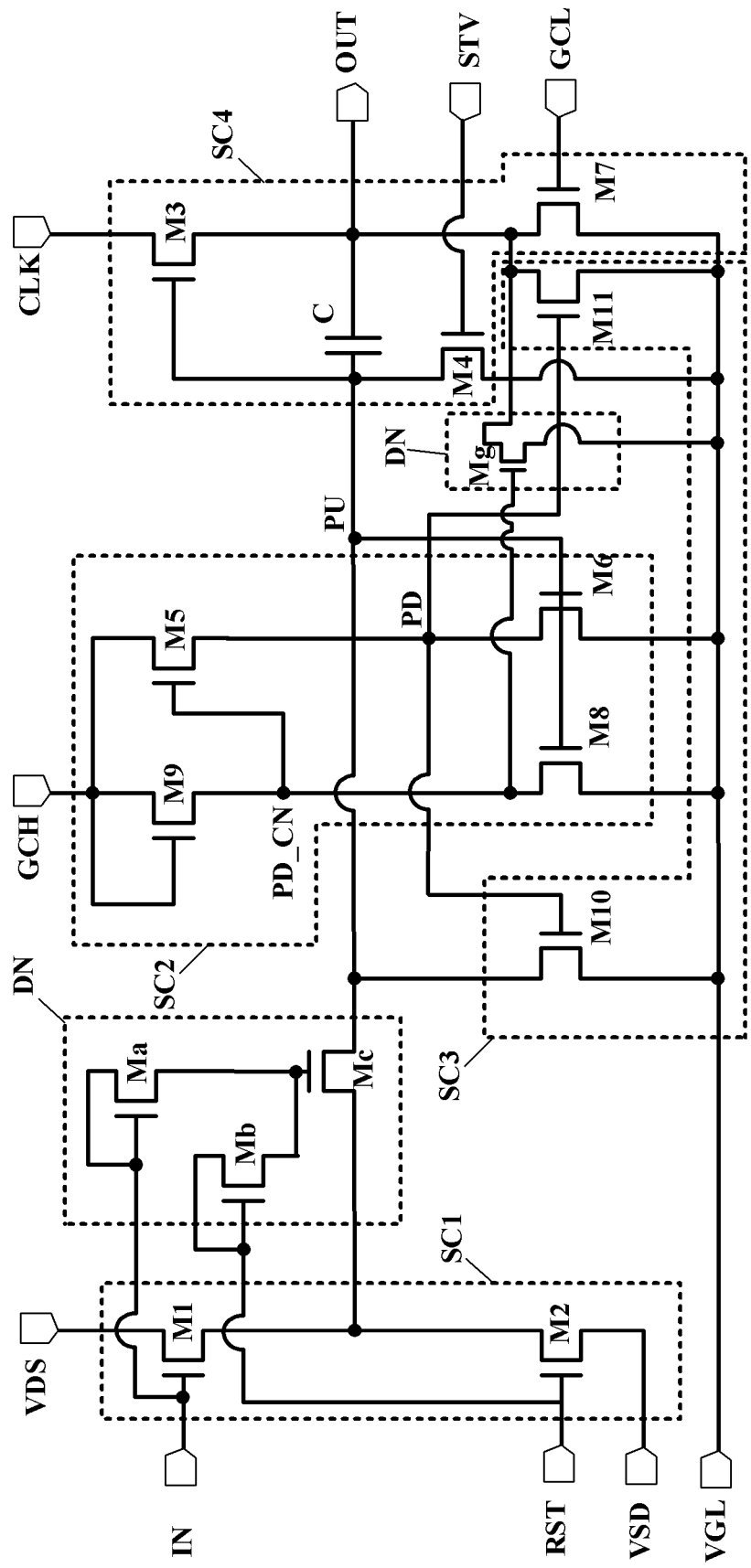
FIG. 27 is a circuit diagram of a respective scan unit in some embodiments according to the present disclosure.

FIG. 27 is a circuit diagram of a respective scan unit in some embodiments according to the present disclosure. FIG. 27 illustrates an implementation in which the denoising subcircuits depicted in FIG. 8A and FIG. 13 are combined. By having the denoising subcircuit depicted in FIG. 27, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 28:
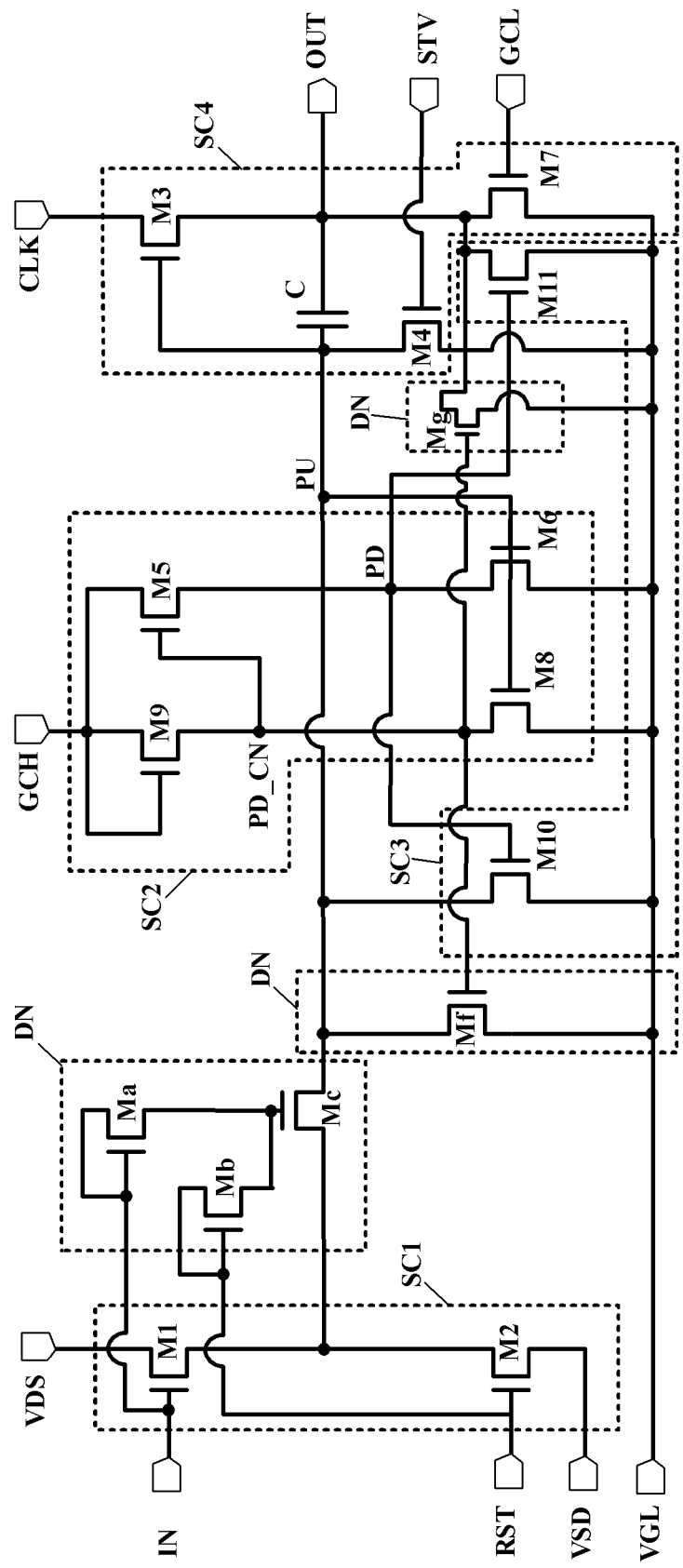
FIG. 28 is a circuit diagram of a respective scan unit in some embodiments according to the present disclosure.

FIG. 28 is a circuit diagram of a respective scan unit in some embodiments according to the present disclosure. FIG. 28 illustrates an implementation in which the denoising subcircuits depicted in FIG. 8A and FIG. 15 are combined. By having the denoising subcircuit depicted in FIG. 28, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 29:
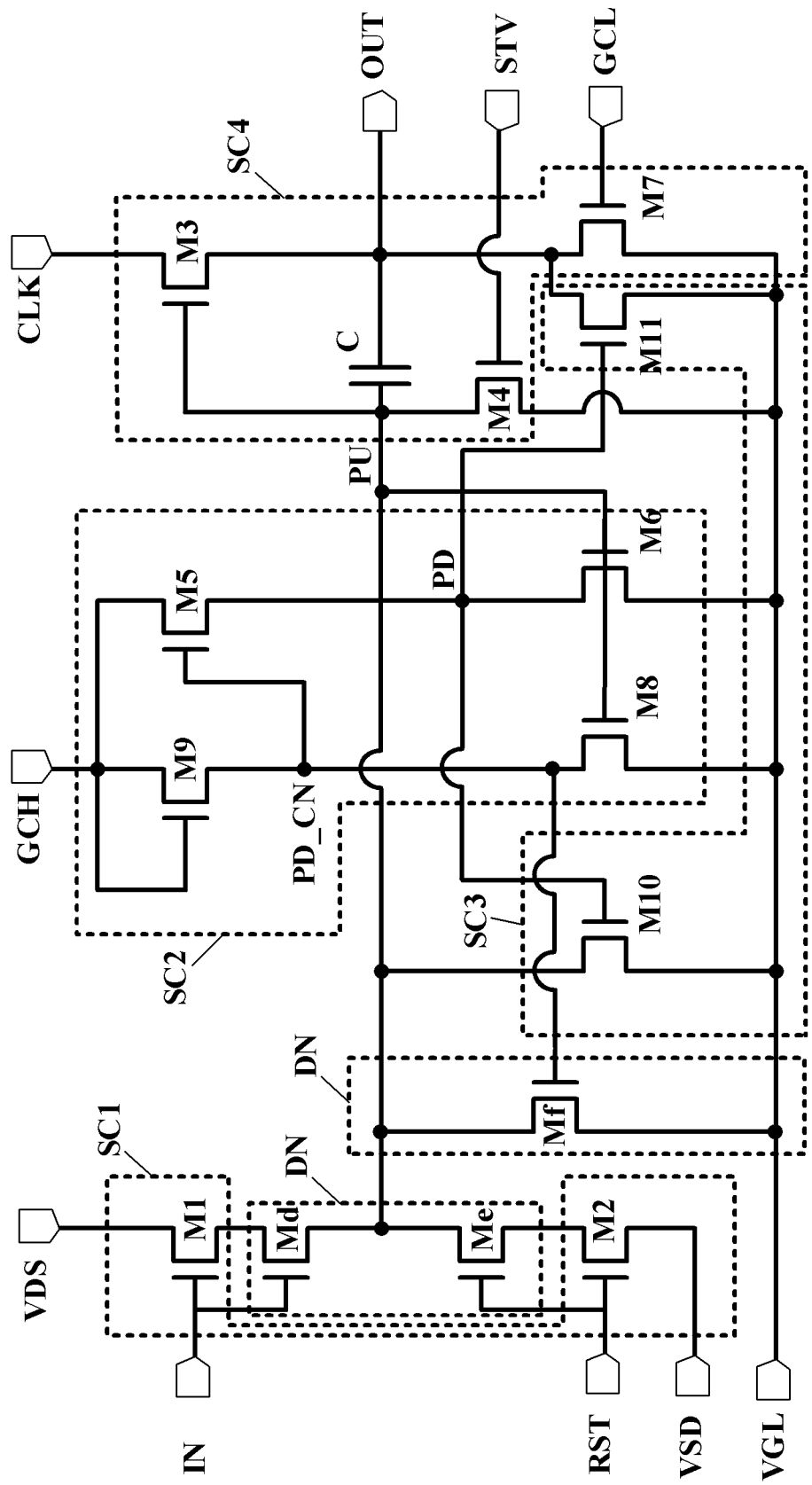
FIG. 29 is a circuit diagram of a respective scan unit in some embodiments according to the present disclosure.

FIG. 29 is a circuit diagram of a respective scan unit in some embodiments according to the present disclosure. FIG. 29 illustrates an implementation in which the denoising subcircuits depicted in FIG. 9A and FIG. 11 are combined. By having the denoising subcircuit depicted in FIG. 29, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 30:
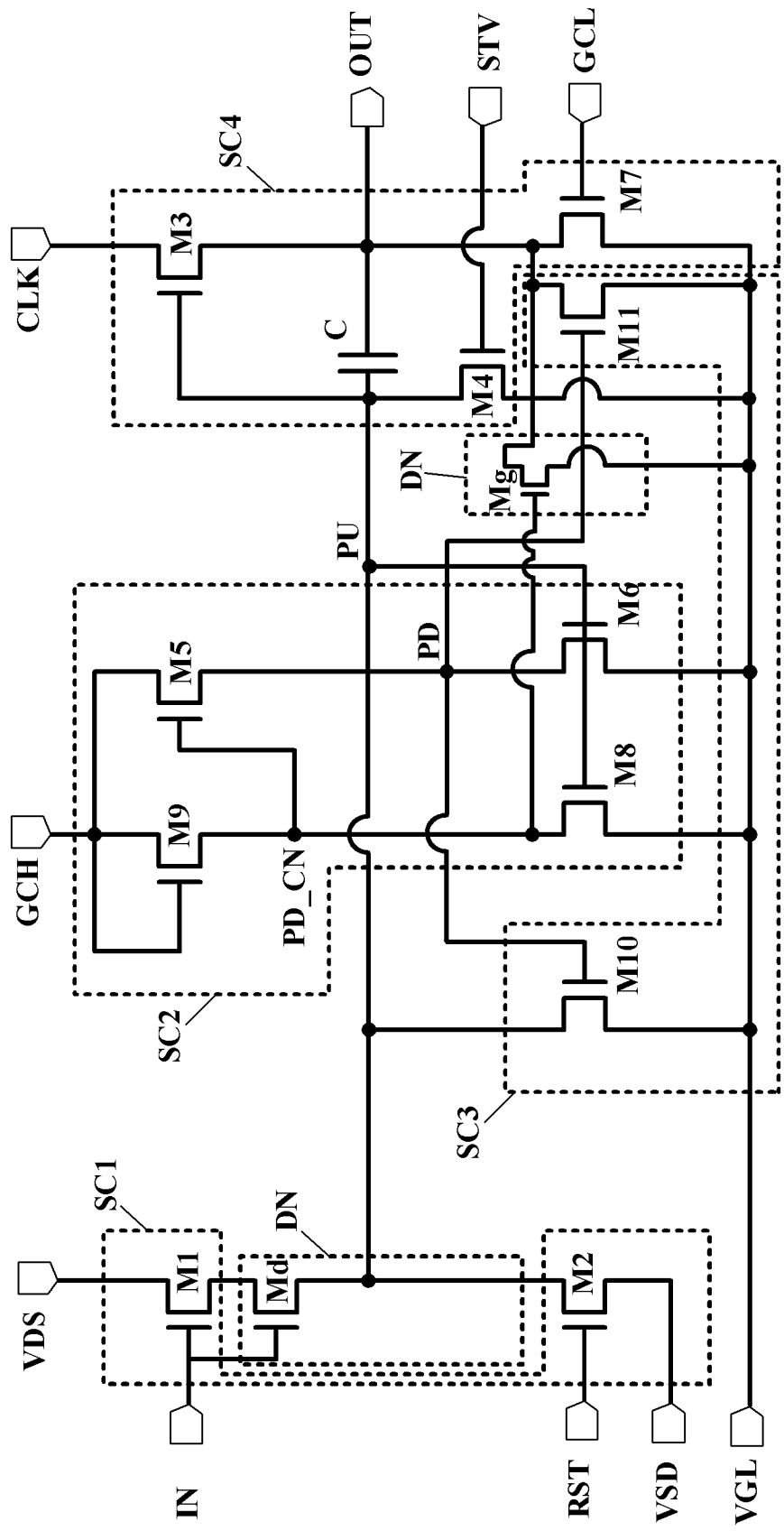
FIG. 30 is a circuit diagram of a respective scan unit in some embodiments according to the present disclosure.

FIG. 30 is a circuit diagram of a respective scan unit in some embodiments according to the present disclosure. FIG. 30 illustrates an implementation in which the denoising subcircuits depicted in FIG. 9B and FIG. 13 are combined. By having the denoising subcircuit depicted in FIG. 30, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 31:
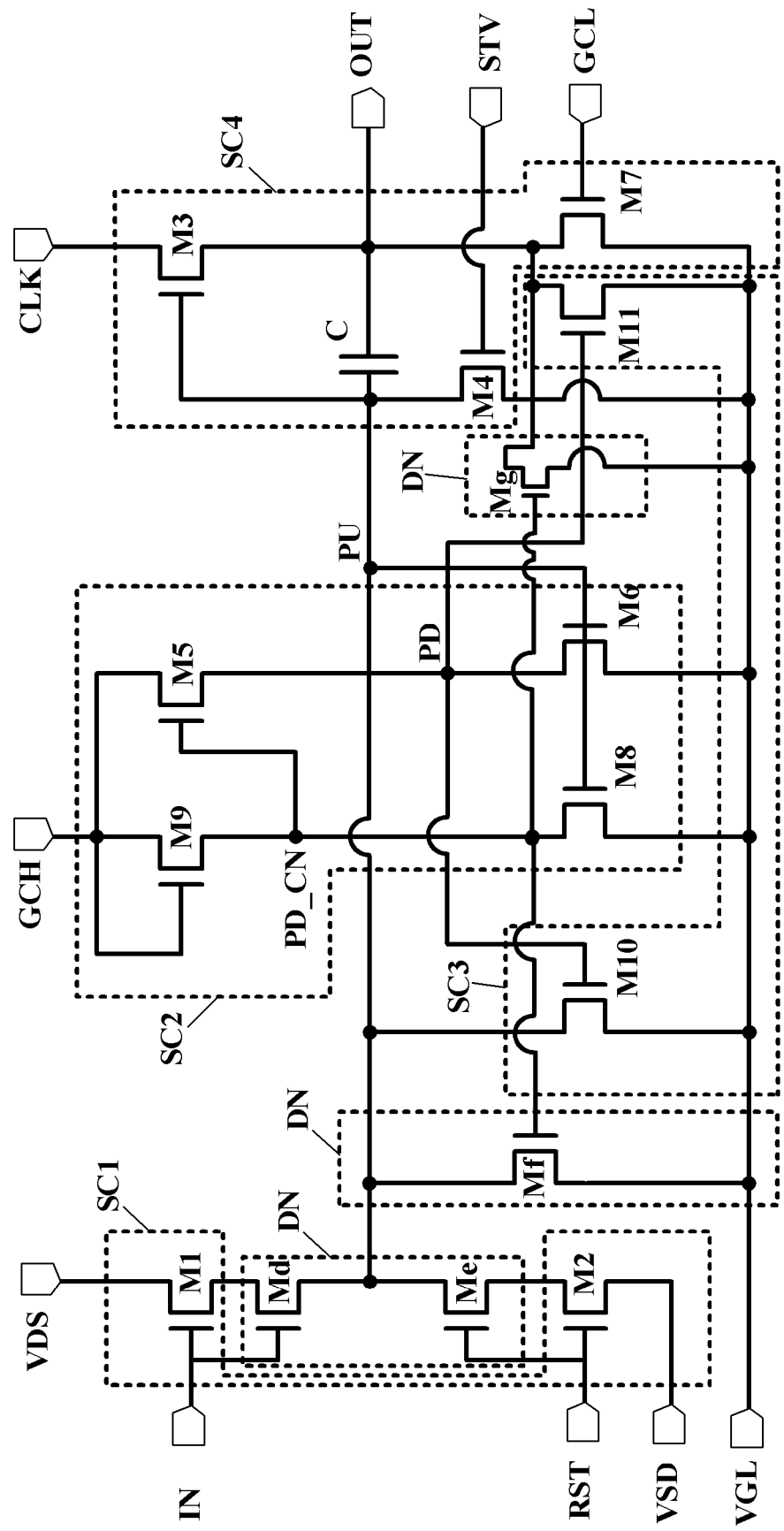
FIG. 31 is a circuit diagram of a respective scan unit in some embodiments according to the present disclosure.

FIG. 31 is a circuit diagram of a respective scan unit in some embodiments according to the present disclosure. FIG. 31 illustrates an implementation in which the denoising subcircuits depicted in FIG. 9A and FIG. 15 are combined. By having the denoising subcircuit depicted in FIG. 31, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 32:
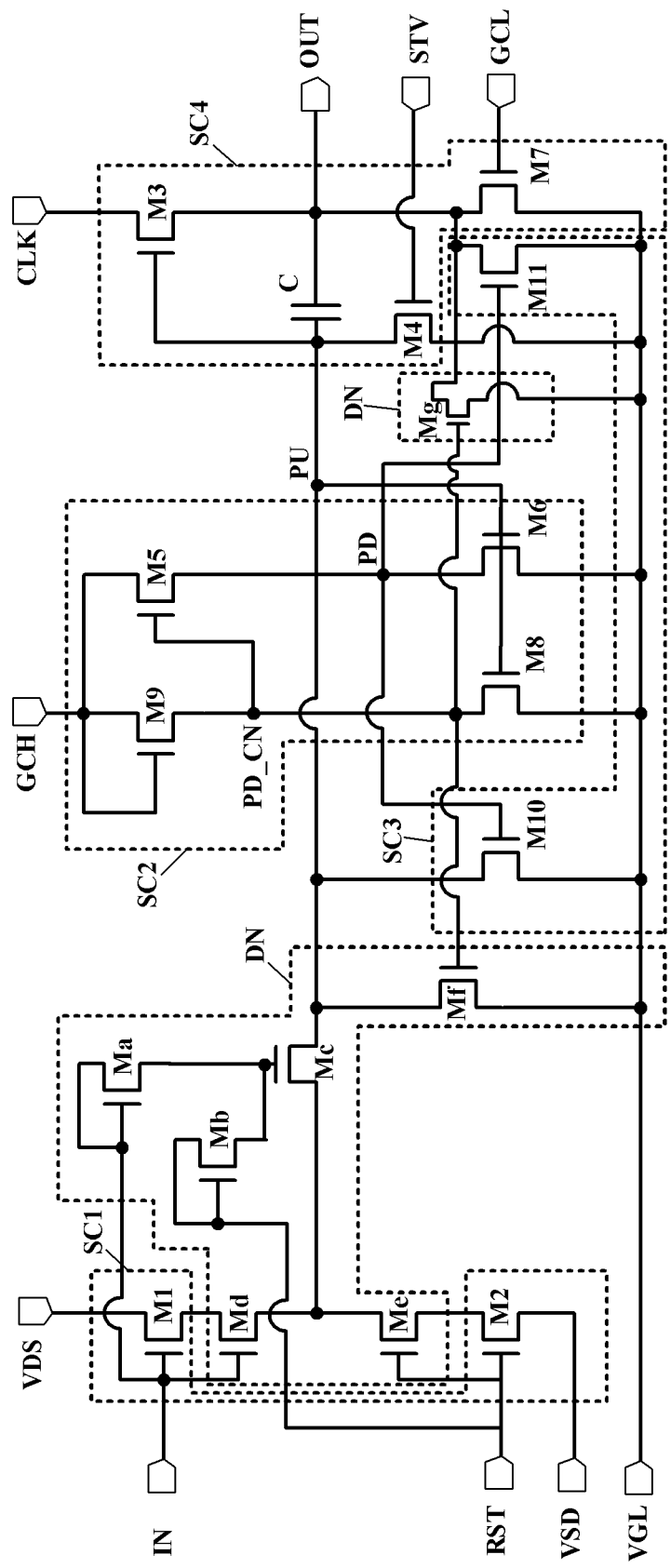
FIG. 32 is a circuit diagram of a respective scan unit in some embodiments according to the present disclosure.

FIG. 32 is a circuit diagram of a respective scan unit in some embodiments according to the present disclosure. FIG. 32 illustrates an implementation in which the denoising subcircuits depicted in FIG. 9D and FIG. 15 are combined. By having the denoising subcircuit depicted in FIG. 32, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

Figure 33:
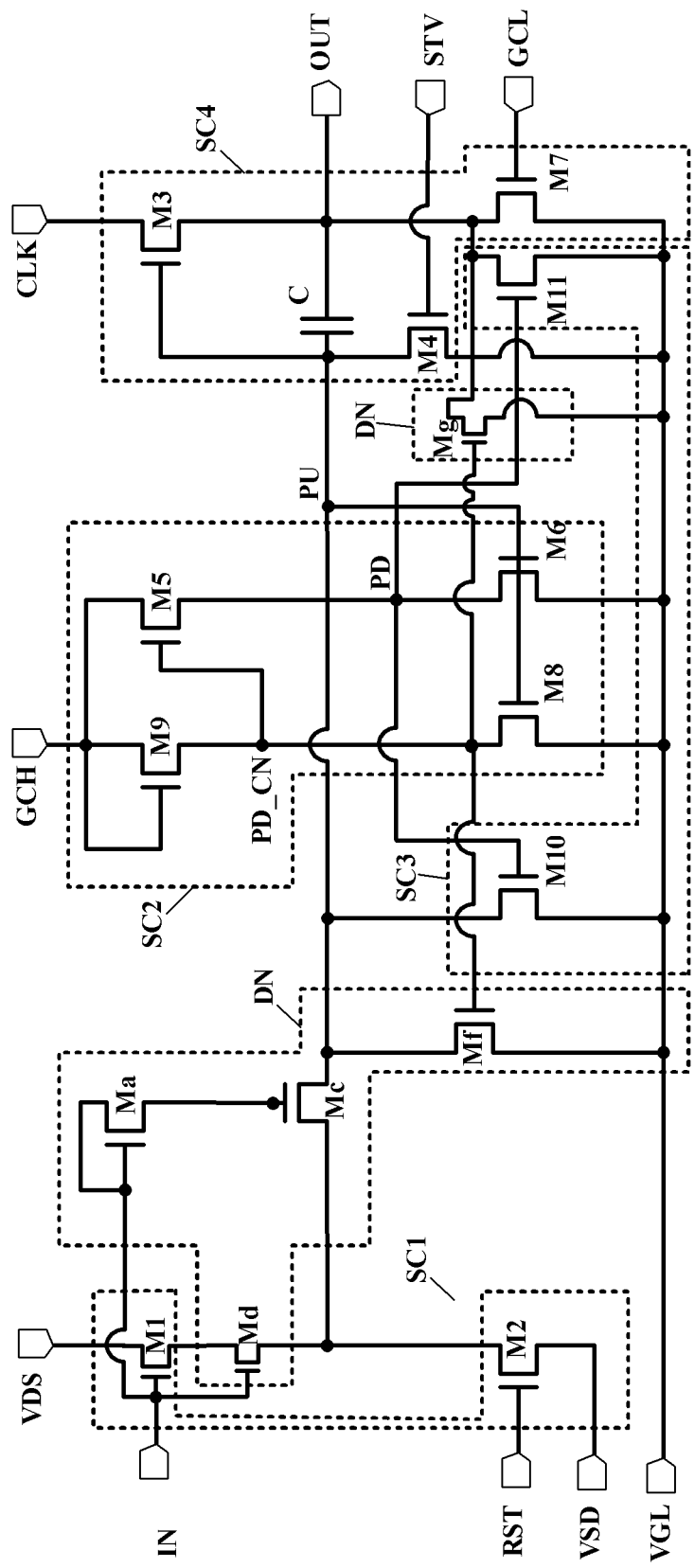
FIG. 33 is a circuit diagram of a respective scan unit in some embodiments according to the present disclosure.

FIG. 33 is a circuit diagram of a respective scan unit in some embodiments according to the present disclosure. FIG. 33 illustrates an implementation in which the denoising subcircuits depicted in FIG. 9C and FIG. 15 are combined. By having the denoising subcircuit depicted in FIG. 33, erroneous outputs or multiple outputs caused by negative drift of the threshold voltage of the first transistor M1 and/or positive drifts of the threshold voltages of the fifth transistor M5 and the tenth transistor M10 can be obviated. The leakage of the first power supply voltage (provided to the first power supply voltage terminal VDS) to the pull-up node PU through the first transistor M1 and noise in the output signal output from the output terminal OUT can be effectively reduced or eliminated.

In another aspect, the present invention provides a display apparatus, including the scan circuit described herein or fabricated by a method described herein, and a display panel having a plurality of light emitting elements. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus. Optionally, the display apparatus is a quantum dots display apparatus.

The scan circuit described in the present disclosure may be used for generating various appropriate control signals to subpixels in a display panel. In one example, the scan circuit described in the present disclosure is a light emitting control signal generating circuit configured to generate light emitting control signals for subpixels in a display panel. In another example, the scan circuit described in the present disclosure is a gate scanning signal generating circuit configured to generate gate scanning signals for subpixels in a display panel. In another example, the scan circuit described in the present disclosure is a reset control signal generating circuit configured to generate reset control signals for subpixels in a display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A scan circuit, comprising a plurality of stages, wherein a respective stage of the scan circuit comprises a respective scan unit configured to provide a control signal to one or more rows of subpixels;
   wherein the respective scan unit comprises a first subcircuit, a second subcircuit, a third subcircuit, a fourth subcircuit, and a denoising subcircuit;
   wherein a pull-up node is coupled to the second subcircuit, the third subcircuit, and the fourth subcircuit;
   a pull-down node is coupled to the second subcircuit, the third subcircuit;
   the first subcircuit is configured to receive an input signal and a first power supply voltage signal and configured to control a potential level at the pull-up node based on the input signal received from an input terminal;
   the second subcircuit is configured to receive a first voltage signal and a third power supply voltage signal, and configured to control potential levels at the pull-down node based on the first voltage signal and the potential level at the pull-up node;
   the third subcircuit is configured to receive the third power supply voltage signal, and configured to pull down potential levels at an output terminal and the pull-up node based on the potential level at the pull-down node;
   the fourth subcircuit is configured to receive a first clock signal and output the control signal, and configured to output the control signal based on the first clock signal and the potential level at the pull-up node; and
   the denoising subcircuit is directly coupled to the pull-up node and the input terminal.

2. The scan circuit of claim 1, wherein the first subcircuit and the denoising subcircuit together are configured to pull up a potential level at the pull-up node based on the input signal received from the input terminal.

3. The scan circuit of claim 2, wherein the first subcircuit and the denoising subcircuit together are configured to reset a potential level at the pull-up node based on a reset signal received from a reset terminal.

4. The scan circuit of claim 1, wherein the denoising subcircuit comprises a first denoising transistor and a third denoising transistor;
   the first denoising transistor is coupled between the input terminal and the third denoising transistor; and
   the third denoising transistor is coupled between the pull-up node and second electrodes of an input transistor controlled by the input signal and a reset transistor controlled by a reset signal.

5. The scan circuit of claim 4, wherein a gate electrode and a first electrode of the first denoising transistor are coupled to the input terminal;
   a second electrode of the first denoising transistor is coupled to a gate electrode of the third denoising transistor;
   a first electrode of the third denoising transistor is coupled to second electrodes of the input transistor and the reset transistor; and
   a second electrode of the third denoising transistor is coupled to the pull-up node.

6. The scan circuit of claim 4, wherein the denoising subcircuit further comprises a second denoising transistor; and
   the second denoising transistor is coupled between a reset terminal and the third denoising transistor.

7. The scan circuit of claim 6, wherein a gate electrode and a first electrode of the second denoising transistor are coupled to the reset terminal; and
   a second electrode of the second denoising transistor is coupled to a second electrode of the first denoising transistor and a gate electrode of the third denoising transistor.

8. The scan circuit of claim 1, wherein the denoising subcircuit comprises a fourth denoising transistor; and
   the fourth denoising transistor is coupled between the pull-up node and an input transistor controlled by the input signal.

9. The scan circuit of claim 8, wherein a gate electrode of the fourth denoising transistor is coupled to the input terminal;
   a first electrode of the fourth denoising transistor is coupled to a second electrode of the input transistor; and
   a second electrode of the fourth denoising transistor is coupled to the pull-up node.

10. The scan circuit of claim 8, wherein the denoising subcircuit further comprises a fifth denoising transistor;
    a gate electrode of the fifth denoising transistor is coupled to a reset terminal;
    a first electrode of the fifth denoising transistor is coupled to a second electrode of a reset transistor controlled by a reset signal; and
    a second electrode of the fifth denoising transistor is coupled to the pull-up node.

11. A display apparatus, comprising the scan circuit of claim 1, and a display panel comprising a plurality of light emitting elements.

12. A scan circuit, comprising a plurality of stages, wherein a respective stage of the scan circuit comprises a respective scan unit configured to provide a control signal to one or more rows of subpixels;

wherein the respective scan unit comprises a first subcircuit, a second subcircuit, a third subcircuit, a fourth subcircuit, and a denoising subcircuit;
wherein a pull-up node is coupled to the second subcircuit, the third subcircuit, and the fourth subcircuit;
a pull-down node is coupled to the second subcircuit, the third subcircuit;
the first subcircuit is configured to receive an input signal and a first power supply voltage signal and configured to control a potential level at the pull-up node based on the input signal received from an input terminal;
the second subcircuit is configured to receive a first voltage signal and a third power supply voltage signal, and configured to control potential levels at the pull-down node based on the first voltage signal and the potential level at the pull-up node;
the third subcircuit is configured to receive the third power supply voltage signal, and configured to pull down potential levels at an output terminal and the pull-up node based on the potential level at the pull-down node;
the fourth subcircuit is configured to receive a first clock signal and output the control signal, and configured to output the control signal based on the first clock signal and the potential level at the pull-up node; and
the denoising circuit is directly coupled between a third power supply voltage terminal and a pull-down control node configured to control the potential level at the pull-down node.

13. The scan circuit of claim 12, wherein the third power supply voltage terminal is configured to provide a third power supply voltage signal at a second level; and
the denoising subcircuit is controlled by a potential level at the pull-down control node to pull down the potential level at the output terminal or the pull-up node based on the potential level at the pull-down control node.

14. The scan circuit of claim 12, wherein the denoising subcircuit comprises a sixth denoising transistor;
a gate electrode of the sixth denoising transistor is coupled to the pull-down control node;
a first electrode of the sixth denoising transistor is coupled to the third power supply voltage terminal; and
a second electrode of the sixth denoising transistor is coupled to the pull-up node.

15. The scan circuit of claim 12, wherein the denoising subcircuit comprises a seventh denoising transistor;
a gate electrode of the seventh denoising transistor is coupled to the pull-down control node;
a first electrode of the seventh denoising transistor is coupled to the third power supply voltage terminal; and
a second electrode of the seventh denoising transistor is coupled to the output terminal.

16. The scan circuit of claim 12, wherein the denoising subcircuit comprises a sixth denoising transistor and a seventh denoising transistor;
a gate electrode of the sixth denoising transistor is coupled to the pull-down control node;
a first electrode of the sixth denoising transistor is coupled to the third power supply voltage terminal;
a second electrode of the sixth denoising transistor is coupled to the pull-up node;
a gate electrode of the seventh denoising transistor is coupled to the pull-down control node;
a first electrode of the seventh denoising transistor is coupled to the third power supply voltage terminal; and
a second electrode of the seventh denoising transistor is coupled to the output terminal.

17. The scan circuit of claim 12, wherein the first subcircuit comprises a first transistor and a second transistor;
the first transistor is coupled between a first power supply voltage terminal and the pull-up node;
a gate electrode of the first transistor is coupled to the input terminal;
a first electrode of the first transistor is coupled to the first power supply voltage terminal;
a second electrode of the first transistor is coupled to the pull-up node;
the second transistor is coupled between a second power supply voltage terminal and the pull-up node;
a gate electrode of the second transistor is coupled to a reset terminal;
a first electrode of the second transistor is coupled to the second power supply voltage terminal; and
a second electrode of the second transistor is coupled to the pull-up node.

18. The scan circuit of claim 12, wherein the second subcircuit comprises a fifth transistor, a sixth transistor, an eighth transistor, and a ninth transistor;
the ninth transistor is coupled between a first voltage signal terminal and a pull-down control node;
a gate electrode and a first electrode of the ninth transistor are coupled to the first voltage signal terminal;
a second electrode of the ninth transistor is coupled to the pull-down control node;
the fifth transistor is coupled between the first voltage signal terminal and a pull-down node;
a gate electrode of the fifth transistor is coupled to the pull-down control node;
a first electrode of the fifth transistor is coupled to the first voltage signal terminal;
a second electrode of the fifth transistor is coupled to the pull-down node;
the sixth transistor is coupled between the pull-down node and a third power supply voltage terminal;
a gate electrode of the sixth transistor is coupled to the pull-up node;
a first electrode of the sixth transistor is coupled to the third power supply voltage terminal;
a second electrode of the sixth transistor is coupled to the pull-down node;
the eighth transistor is coupled between the pull-down control node and the third power supply voltage terminal;
a gate electrode of the eighth transistor is coupled to the pull-up node;
a first electrode of the eighth transistor is coupled to the third power supply voltage terminal; and
a second electrode of the eighth transistor is coupled to the pull-down control node.

19. The scan circuit of claim 12, wherein the third subcircuit comprises a tenth transistor and an eleventh transistor;
the tenth transistor is coupled between the pull-up node and a third power supply voltage terminal;
a gate electrode of the tenth transistor is coupled to the pull-down node;
a first electrode of the tenth transistor is coupled to the third power supply voltage terminal;
a second electrode of the tenth transistor is coupled to the pull-up node;
the eleventh transistor is coupled between the output terminal and the third power supply voltage terminal;
a gate electrode of the eleventh transistor is coupled to the pull-down node;

a first electrode of the eleventh transistor is coupled to the third power supply voltage terminal; and a second electrode of the eleventh transistor is coupled to the output terminal.

20. The scan circuit of claim 12, wherein the fourth subcircuit comprises a third transistor, a fourth transistor, a seventh transistor, and a capacitor;

the third transistor is coupled between the output terminal and a first clock signal terminal;

a gate electrode of the third transistor is coupled to the pull-up node;

a first electrode of the third transistor is coupled to the first clock signal terminal;

a second electrode of the third transistor is coupled to the output terminal;

the fourth transistor is coupled between the pull-up node and a third power supply voltage terminal;

a gate electrode of the fourth transistor is coupled to a start signal terminal;

a first electrode of the fourth transistor is coupled to the third power supply voltage terminal;

a second electrode of the fourth transistor is coupled to the pull-up node;

the seventh transistor is coupled between the output terminal and the third power supply voltage terminal;

a gate electrode of the seventh transistor is coupled to a second voltage signal terminal;

a first electrode of the seventh transistor is coupled to the third power supply voltage terminal;

a second electrode of the seventh transistor is coupled to the output terminal;

the capacitor is coupled between the output terminal and the pull-up node;

a first electrode of the capacitor is coupled to the pull-up node; and a second electrode of the capacitor is coupled to the output terminal;

wherein, during a blanking period, a second voltage signal input from the second voltage signal terminal is at a first level, turning on the seventh transistor; and the third power supply voltage signal provided to a third power supply voltage terminal at a second level passed through the seventh transistor to the output terminal, resetting the scan circuit.

* * * * *